(12) United States Patent
Yoshita et al.

(10) Patent No.: US 10,879,280 B2
(45) Date of Patent: Dec. 29, 2020

(54) SOLID-STATE IMAGING DEVICE AND METHOD OF MANUFACTURING SOLID-STATE IMAGING DEVICE

(71) Applicant: SONY SEMICONDUCTOR SOLUTIONS CORPORATION, Kanagawa (JP)

(72) Inventors: Ryoto Yoshita, Kanagawa (JP); Takashi Machida, Tokyo (JP); Yoshimichi Kumagai, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/486,649

(22) PCT Filed: Feb. 14, 2018

(86) PCT No.: PCT/JP2018/005052
§ 371 (c)(1),
(2) Date: Aug. 16, 2019

(87) PCT Pub. No.: WO2018/163732
PCT Pub. Date: Sep. 13, 2018

(65) Prior Publication Data
US 2020/0235146 A1    Jul. 23, 2020

(30) Foreign Application Priority Data
Mar. 6, 2017  (JP) .................. 2017-041964

(51) Int. Cl.
*H01L 27/146*    (2006.01)
(52) U.S. Cl.
CPC .. *H01L 27/14603* (2013.01); *H01L 27/14614* (2013.01); *H01L 27/14623* (2013.01); *H01L 27/14685* (2013.01)

(58) Field of Classification Search
CPC ............ H01L 27/14603; H01L 27/146; H01L 27/14614
See application file for complete search history.

(56) References Cited

U.S. PATENT DOCUMENTS

| | | | | |
|---|---|---|---|---|
| 8,174,589 B2 * | 5/2012 | Ise | .......................... | H04N 5/361 348/241 |
| 8,952,315 B2 * | 2/2015 | Ohta | ................. | H01L 29/66666 250/214.1 |

(Continued)

FOREIGN PATENT DOCUMENTS

| JP | 2013-098446 | 5/2013 |
|---|---|---|
| JP | 2015-095468 | 5/2015 |

(Continued)

OTHER PUBLICATIONS

International Search Report prepared by the Japan Patent Office dated Mar. 15, 2018, for International Application No. PCT/JP2018/005052.

*Primary Examiner* — William Coleman
(74) *Attorney, Agent, or Firm* — Sheridan Ross P.C.

(57) ABSTRACT

A solid-state imaging device includes: a semiconductor substrate having a light incident surface; a photoelectric converter for each of the pixels; a charge accumulation section for each of the pixels; a first transfer transistor; a wiring layer on side opposite to the light incident surface; a first vertical electrode and a second vertical electrode extending from the surface opposite to the light incident surface to the photoelectric converter; a first light-blocking film in a thickness direction of the semiconductor substrate on at least a portion of a periphery of the photoelectric converter; and a second light-blocking film in a surface direction of the semiconductor substrate between the photoelectric converter and the charge accumulation section. The first vertical electrode and the second vertical electrode (Continued)

are disposed adjacently with a distance therebetween, and the distance is a half or less of a length of one side of the pixel.

20 Claims, 44 Drawing Sheets

(56) References Cited

U.S. PATENT DOCUMENTS

| | | |
|---|---|---|
| 2014/0347538 A1 | 11/2014 | Toda |
| 2015/0035028 A1 | 2/2015 | Fan et al. |
| 2015/0228693 A1 | 8/2015 | Toda |
| 2016/0155774 A1 | 6/2016 | Hasegawa et al. |
| 2016/0343756 A1 | 11/2016 | Fan et al. |
| 2016/0351606 A1 | 12/2016 | Azami et al. |
| 2017/0033143 A1 | 2/2017 | Tata |
| 2018/0033809 A1 | 2/2018 | Tayanaka et al. |

FOREIGN PATENT DOCUMENTS

| | | |
|---|---|---|
| JP | 2015-153962 | 8/2015 |
| JP | 2015-228388 | 12/2015 |
| JP | 2016-103541 | 6/2016 |
| JP | 2016-534557 | 11/2016 |
| WO | WO 2013/088983 | 6/2013 |
| WO | WO 2016/136486 | 9/2016 |

\* cited by examiner

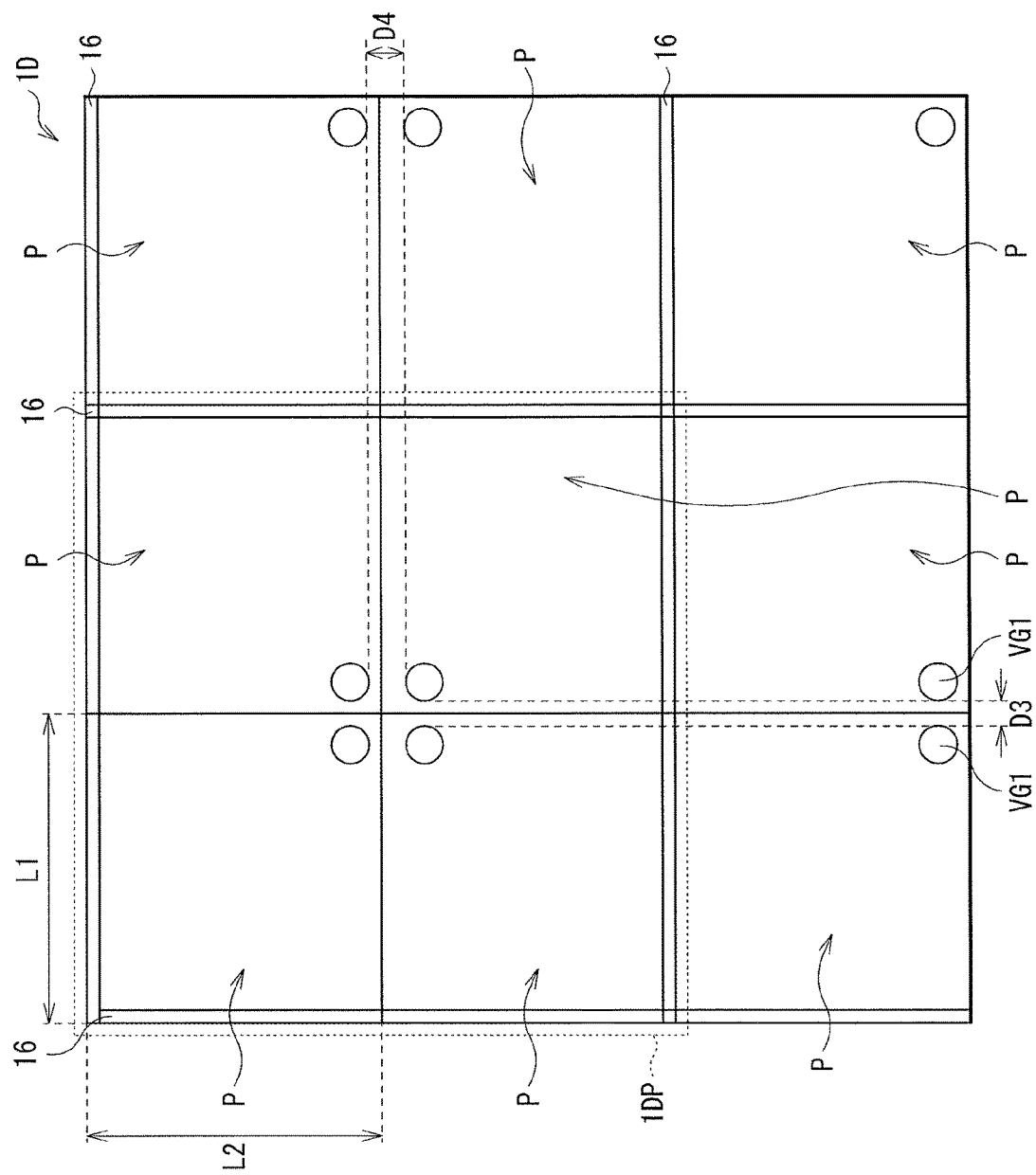

SOLID-STATE IMAGING DEVICE AND METHOD OF MANUFACTURING SOLID-STATE IMAGING DEVICE

CROSS REFERENCE TO RELATED APPLICATIONS

This application is a national stage application under 35 U.S.C. 371 and claims the benefit of PCT Application No. PCT/JP2018/005052 having an international filing date of 14 Feb. 2018, which designated the United States, which PCT application claimed the benefit of Japanese Patent Application No. 2017-041964 filed 6 Mar. 2017, the entire disclosures of each of which are incorporated herein by reference.

TECHNICAL FIELD

The present technology relates to a solid-state imaging device having a global shutter function, and a method of manufacturing a solid-state imaging device.

BACKGROUND ART

In recent years, attention has been focused on a back side illumination type CMOS (Complementary Metal Oxide Semiconductor) image sensor (a solid-state imaging device) having a global shutter function (for example, refer to PTLs 1 and 2). Such an image sensor includes a charge accumulation section for each pixel. A signal charge transferred from a photoelectric converter is temporarily held in the charge accumulation section. Hence, it is necessary to suppress leakage of light into the charge accumulation section (PLS: Parasitic Light Sensitivity).

CITATION LIST

Patent Literature

PTL 1: Japanese Unexamined Patent Application Publication No. 2013-98446
PTL 2: Japanese Unexamined Patent Application Publication No. 2015-95468

SUMMARY OF THE INVENTION

Such a solid-state imaging device is desired to maintain mechanical strength while suppressing PLS.

It is therefore desirable to provide a solid-state imaging device that makes it possible to maintain mechanical strength while suppressing PLS, and a method of manufacturing the solid-state imaging device.

A solid-state imaging device (1) according to an embodiment of the present disclosure includes: a semiconductor substrate having a light incident surface; a photoelectric converter provided for each of pixels on side of the light incident surface in the semiconductor substrate; a charge accumulation section provided for each of the pixels on side closer to opposite side of the light incident surface than the photoelectric converter in the semiconductor substrate; a first transfer transistor that transfers a signal charge accumulated in the photoelectric converter to the charge accumulation section; a wiring layer provided on side of a surface opposite to the light incident surface of the semiconductor substrate, a first vertical electrode and a second vertical electrode extending from the surface opposite to the light incident surface of the semiconductor substrate to the photoelectric converter, a first light-blocking film provided in a thickness direction of the semiconductor substrate on at least a portion of a periphery of the photoelectric converter; and a second light-blocking film provided in a surface direction of the semiconductor substrate between the photoelectric converter and the charge accumulation section. The first vertical electrode and the second vertical electrode are disposed adjacently with a distance therebetween, and the distance is a half or less of a length of one side of the pixel.

In the solid-state imaging device (1) according to the embodiment of the present disclosure, the first vertical electrode and the second vertical electrode are adjacently disposed; therefore, even before formation of the second light-blocking film, the photoelectric converter is supported by a region in proximity to the first vertical electrode and the second vertical electrode. Accordingly, as compared with a case where the photoelectric converter is supported by a region in proximity to one vertical electrode, the photoelectric converter is supported by a wider region.

A method of manufacturing a solid-state imaging device according to an embodiment of the present disclosure includes: forming a photoelectric converter for each of pixels on side of a light incident surface in a semiconductor substrate; forming a charge accumulation section for each of the pixels on side closer to opposite side of the light incident surface than the photoelectric converter in the semiconductor substrate; forming a wiring layer on side of a surface opposite to the light incident surface of the semiconductor substrate, and forming a vertical electrode extending from the surface opposite to the light incident surface of the semiconductor substrate to the photoelectric converter; forming a first light-blocking film in a thickness direction of the semiconductor substrate on at least a portion of a periphery of the photoelectric converter; and forming a second light-blocking film along a surface direction of the semiconductor substrate between the photoelectric converter and the charge accumulation section. The second light-blocking film is formed through forming a first portion and a second portion of the second light-blocking film in a stepwise manner.

A solid-state imaging device (2) according to an embodiment of the present disclosure is manufactured by the method of manufacturing the solid-state imaging device according to the foregoing embodiment of the present disclosure. The solid-state imaging device (2) according to the embodiment of the present disclosure includes: a semiconductor substrate having a light incident surface: a photoelectric converter provided for each of pixels on side of the light incident surface in live semiconductor substrate; a charge accumulation section provided for each of the pixels on side closer to opposite side of the light incident surface than the photoelectric converter in the semiconductor substrate; a wiring layer provided on side of a surface opposite to the light incident surface of the semiconductor substrate; a vertical electrode extending from the surface opposite to the light incident surface of the semiconductor substrate to the photoelectric converter; a first light-blocking film provided in a thickness direction of the semiconductor substrate on at least a portion of a periphery of the photoelectric converter; and a second light-blocking film provided in a surface direction of the semiconductor substrate between the photoelectric converter and the charge accumulation section and including a first portion and a second portion that are continuously provided, and a level difference is provided between the first portion and the second portion.

In the method of manufacturing the solid-state imaging device and the solid-state imaging device (2) according to the embodiments of the present disclosure, the first portion and the second portion of the second light-blocking film are formed in a stepwise manner; therefore, in formation of the first portion of the second light-blocking film, the photoelectric converter is supported by a region in proximity to the vertical electrode and a region where the second portion is to be formed. Accordingly, as compared with a case where the entire second light-blocking film is formed at a time, the photoelectric converter is supported by a wider region.

According to the solid-state imaging device (1) according to the embodiment of the present disclosure, the first vertical electrode and the second vertical electrode are adjacently disposed, and according to the method of manufacturing the solid-state imaging device and the solid-state imaging device (2) according to the embodiments of the present disclosure, the first portion and the second portion of the second light-blocking film are formed in a stepwise manner, which makes it possible to support the photoelectric converter by a wider region. Accordingly, it is possible to support the photoelectric converter more firmly without narrowing a formation region of the second light-blocking film. This makes it possible to maintain mechanical strength while suppressing PLS. It is to be noted that effects described here are not necessarily limited and may include any of effects described in the present disclosure.

BRIEF DESCRIPTION OF DRAWINGS

FIG. 17 is a plan view of a schematic configuration of a solid-state imaging device according to a modification example 4.

FIG. 27A is a schematic plan view of a process following FIG. 27A.

FIG. 27B is a schematic view of a cross-sectional configuration taken along a line B-B illustrated in FIG. 28A.

MODES FOR CARRYING OUT THE INVENTION

In the following, some embodiments of the present technology are described in detail with reference to the drawings. It is to be noted that description is given in the following order.

1. First Embodiment (an example of a solid-state imaging device including adjacent vertical electrodes in a pixel)

2. Modification Example 1 (an example in which a first light-blocking film is provided also on a periphery of a charge accumulation section)

3. Modification Example 2 (an example in which vertical electrodes are adjacently disposed in a pixel and vertical electrodes are adjacently disposed also in pixels)

4. Modification Example 3 (an example in which vertical electrodes are adjacently disposed in pixels)

5. Modification Example 4 (an example in which vertical electrodes are adjacently disposed in four pixels)

6. Modification Example 5 (an example in which a first transfer transistor includes a plurality of gate electrodes)

7. Modification Example 6 (an example in which an embedded material is provided in an opening of a second light-blocking film)

8. Modification Example 7 (an example in which an image plane phase detection pixel is provided)

9. Second Embodiment (an example in which the second light-blocking film has a level difference)

10. Modification Example 8 (an example in which the first light-blocking film is formed also on the periphery of the charge accumulation section)

11. Modification Example 9 (an example in which the second light-blocking film is formed with use of a sacrificial layer)

12. Modification Example 10 (an example in which the first light-blocking film is formed in every space between pixels)

13. Modification Example 11 (an example in which a first slit and a second slit are alternately formed on a same straight line)

14. Modification Example 12 (an example in which a level difference of the second light-blocking film is formed at a position shifted from a light-condensing center)

15. Application Example (an example of an electronic apparatus)

16. Further Application Example 1 (an example of an in-vivo information acquisition system)

17. Further Application Example 2 (an example of a mobile body control system)

1. First Embodiment

[Configuration of Solid-State Imaging Device 1]

Figure 1:
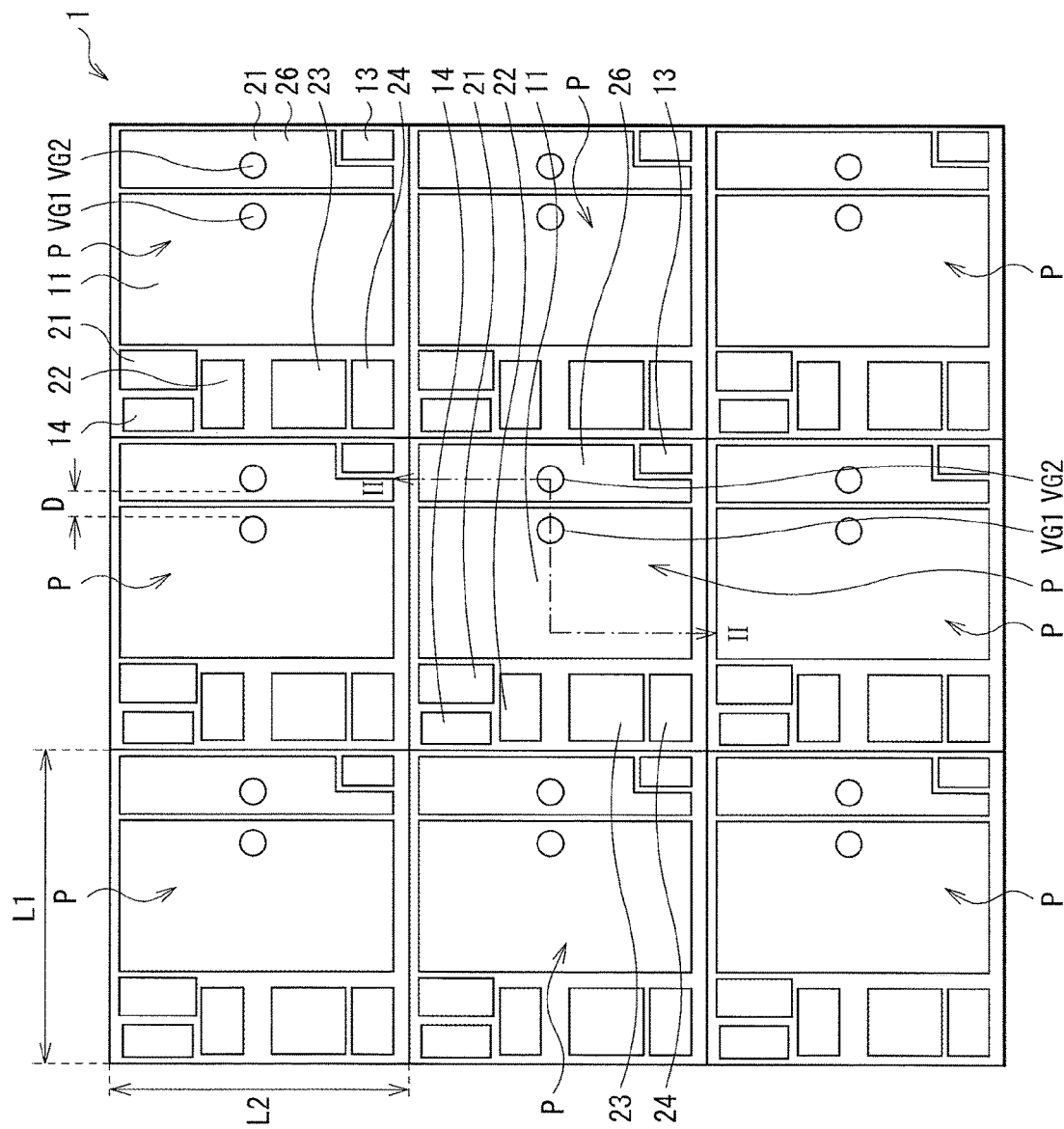
FIG. 1 is a plan view of a schematic configuration of a solid-state imaging device according to a first embodiment of the present technology.
Figure 2:
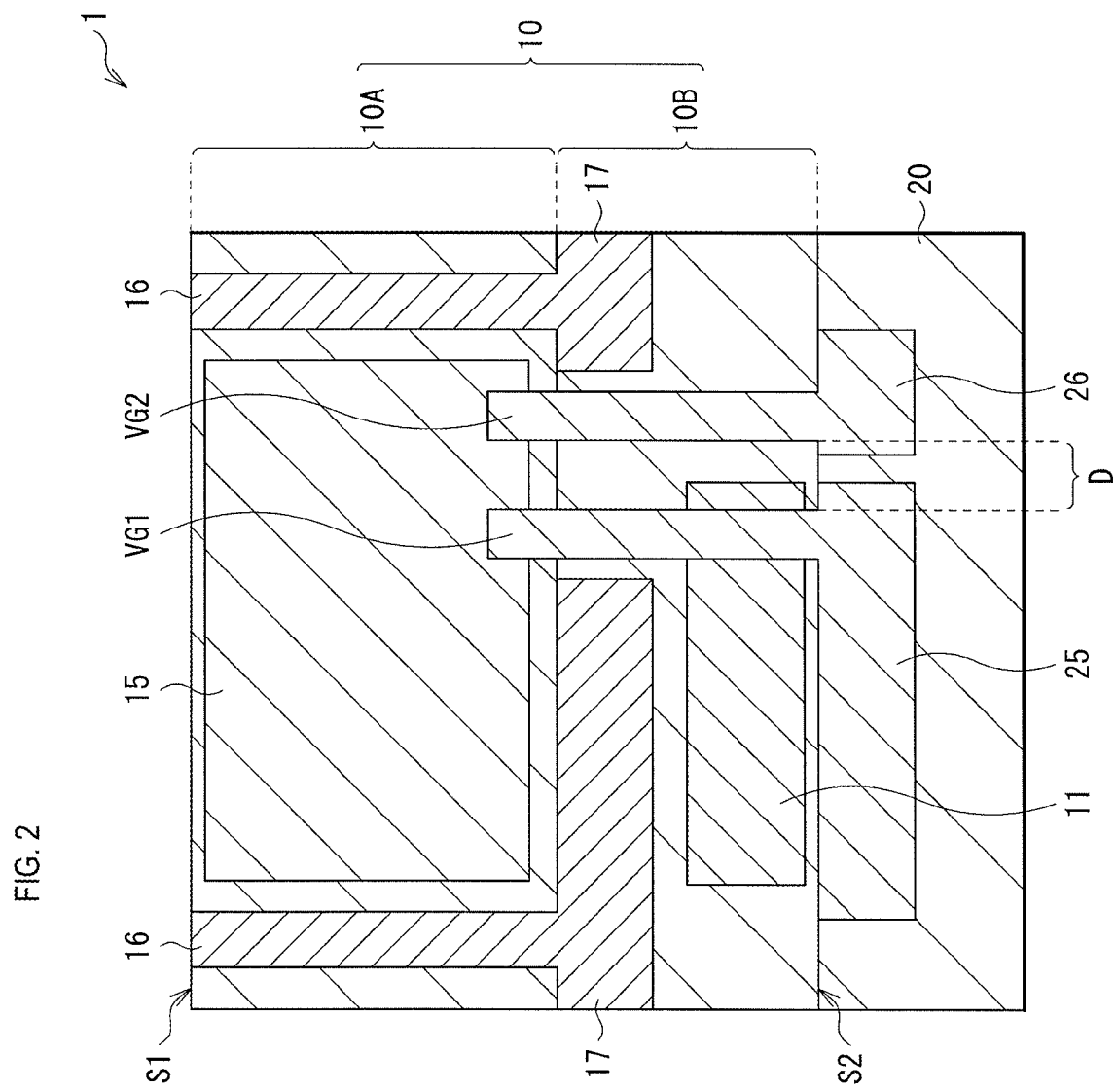
FIG. 2 is a schematic view of a cross-sectional configuration taken along a line II-II illustrated in FIG. 1.

FIG. 1 is a plan view of a schematic configuration of a solid-state imaging device (a solid-state imaging device 1) according to a first embodiment of the present technology. FIG. 2 schematically illustrates a cross-sectional configuration taken along a line II-II in FIG. 1. The solid-state imaging device 1 is a back side illumination type CMOS image sensor having a global shutter function. In the solid-state imaging device 1, a plurality of light reception unit regions (pixels P) is two-dimensionally arranged in a matrix, for example. A planar shape of the pixel P is, for example, a quadrangular shape, and one vertical side and one horizontal side of the pixel P respectively have a length L1 and a length L2. The planar shape of the pixel P is, for example, a square shape, and the lengths L1 and L2 have the same value. The lengths L1 and L2 of the pixel P are, for example, from 3 µm to 6 µm. The lengths L1 and L2 may be smaller than 3 µm, or may be larger than 6 µm.

The solid-state imaging device 1 includes a semiconductor substrate 10 and a wiring layer 20. A front surface (a front surface S1) of the semiconductor substrate 10 serves as light incident surface, and the wiring layer 20 is provided on a back surface (a back surface S2) opposite to the front surface S1. In the semiconductor substrate 10, a charge accumulation section (MEM) 11 and a photoelectric converter (PD) 15 are provided for each of the pixels P. The charge accumulation section 11 is disposed closer to the back surface S2 than the photoelectric converter 15.

The solid-state imaging device 1 includes a first transfer transistor (TRX) 25 and a discharging transistor (OFG) 26 for each of the pixels P. A gate electrode VG1 (a first vertical electrode) of the first transfer transistor 25 and a gate electrode VG2 (a second vertical electrode) of the discharging transistor 26 extend from the photoelectric converter 15 to the back surface S2 of the semiconductor substrate 10. The solid-state imaging device 1 includes a first light-blocking film 16 and a second light-blocking film 17. The first light-blocking film 16 is provided along a thickness direction of the semiconductor substrate 10, and the second light-blocking film 17 is provided along a surface (the front surface S1 and the back surface S2) direction of the semiconductor substrate 10. The first light-blocking film 16 and the second light-blocking film 17 that are respectively provided along the thickness direction and the surface direction of the semiconductor substrate 10 are substantially orthogonal to each other; however, directions of the first light-blocking film 16 and the second light-blocking film 17 may be shifted due to a manufacturing error, etc.

A color filter (a color filter CF in FIG. 8 to be described later) and an on-chip lens may be provided on the front surface S1 of the semiconductor substrate 10. Configurations of respective components are described below.

The semiconductor substrate 10 has, for example, a stacked configuration including a first semiconductor layer 10A configuring the front surface S1 and a second semiconductor layer 10B configuring the back surface S2. The first semiconductor layer 10A and the second semiconductor layer 10B are formed in a stepwise manner with use of, for example, epitaxial growth (as will be described later). The semiconductor subsume 10 includes, for example, silicon (Si).

The charge accumulation section 11 is an n-type or p-type impurity region, and is provided in the second semiconductor layer 10B. The charge accumulation section 11 serves as a charge holding section that temporarily holds a signal charge generated by the photoelectric converter 15.

The photoelectric converter 15 is disposed at a position closer to the front surface S1 (the light incident surface) than the charge accumulation section 11, and is provided in the first semiconductor layer 10A, for example. The photoelectric converter 15 generates a signal charge corresponding to an amount of received light. The photoelectric converter 15 is, for example, a photodiode having p-n junction, and has, for example, a p-type impurity region and an n-type impurity region. The photoelectric converter 15 is provided at a position superimposed on the charge accumulation section 11 over a wider region than the charge accumulation section 11 in plan view.

The first light-blocking film 16 penetrates, for example, the first semiconductor layer 10A from the front surface S1, and an end of the first light-blocking film 16 is in contact with the second light-blocking film 17. The first light-blocking film 16 prevents leakages of light into adjacent pixels (the photoelectric converters 15), and is provided on a periphery of each of the photoelectric converters 15.

Figure 3:
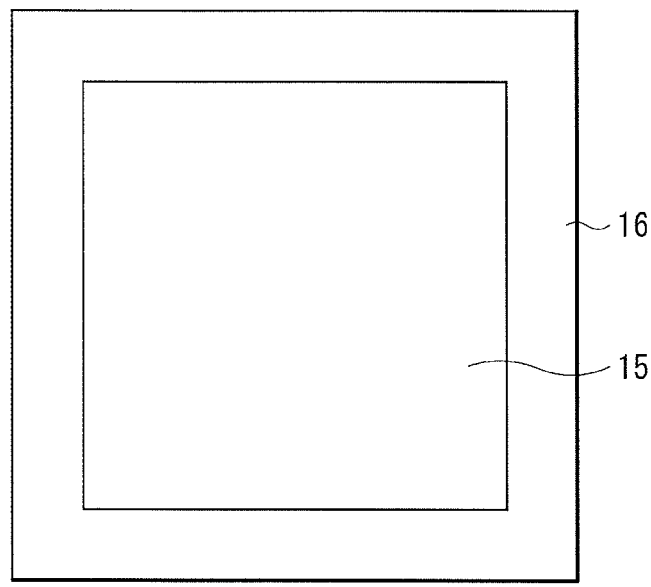
FIG. 3 is a diagram illustrating a planar configuration of a first light-blocking film illustrated in FIG. 2 together with a photoelectric converter.
Figure 4:
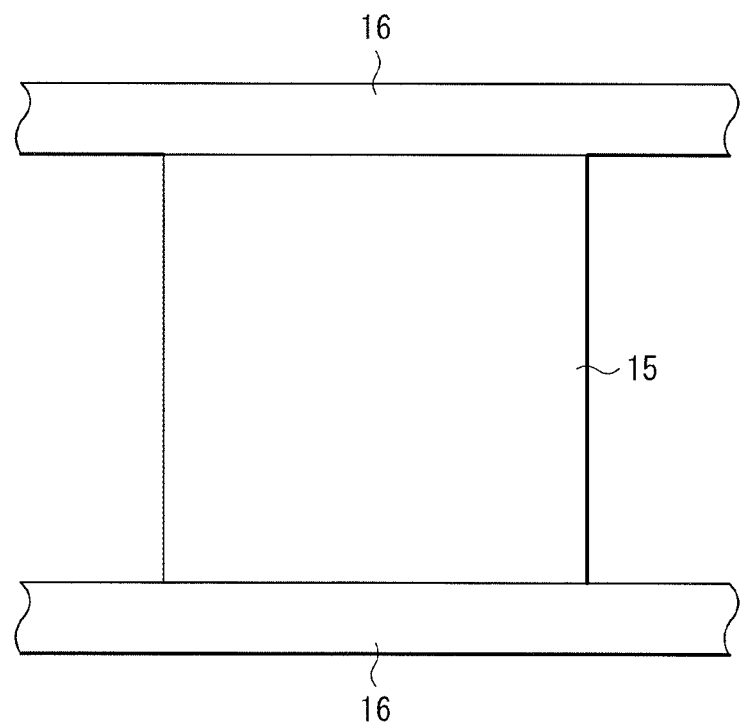
FIG. 4 is a diagram illustrating another example of a planar configuration of the first light-blocking film illustrated in FIG. 3.

FIGS. 3 and 4 each illustrate an example of a planar configuration of the first light-blocking film 16. For example, the first light-blocking film 16 is provided on the entire periphery of the photoelectric converter 15 to surround the photoelectric converter 15, as illustrated in FIG. 3. At this occasion, for example, a plurality of first light-blocking films 16 extends in a vertical direction and a horizontal direction. Alternatively, as illustrated in FIG. 4, the first light-blocking film 16 is provided on a portion of the periphery of the photoelectric converter 15. At this occasion, for example, a plurality of first light-blocking films 16 extends in the vertical direction or the horizontal direction. The first light-blocking film 16 functions as a pixel separation film, and suppresses movement of a signal charge between adjacent pixels P. Hence, providing the first light-blocking film 16 on the entire periphery of the photoelectric converter 15 makes it possible to perform pixel separation more effectively.

The second light-blocking film 17 is disposed between the photoelectric converter 15 and the charge accumulation section 11, and is provided in the second semiconductor layer 10B, for example. The second light-blocking film 17 suppresses leakage of light into the charge accumulation section 11 (PLS), and at least a portion of the charge accumulation section 11 is covered with live second light-blocking film 17 from side of the front surface S1 (the photoelectric converter 15).

Figure 5:
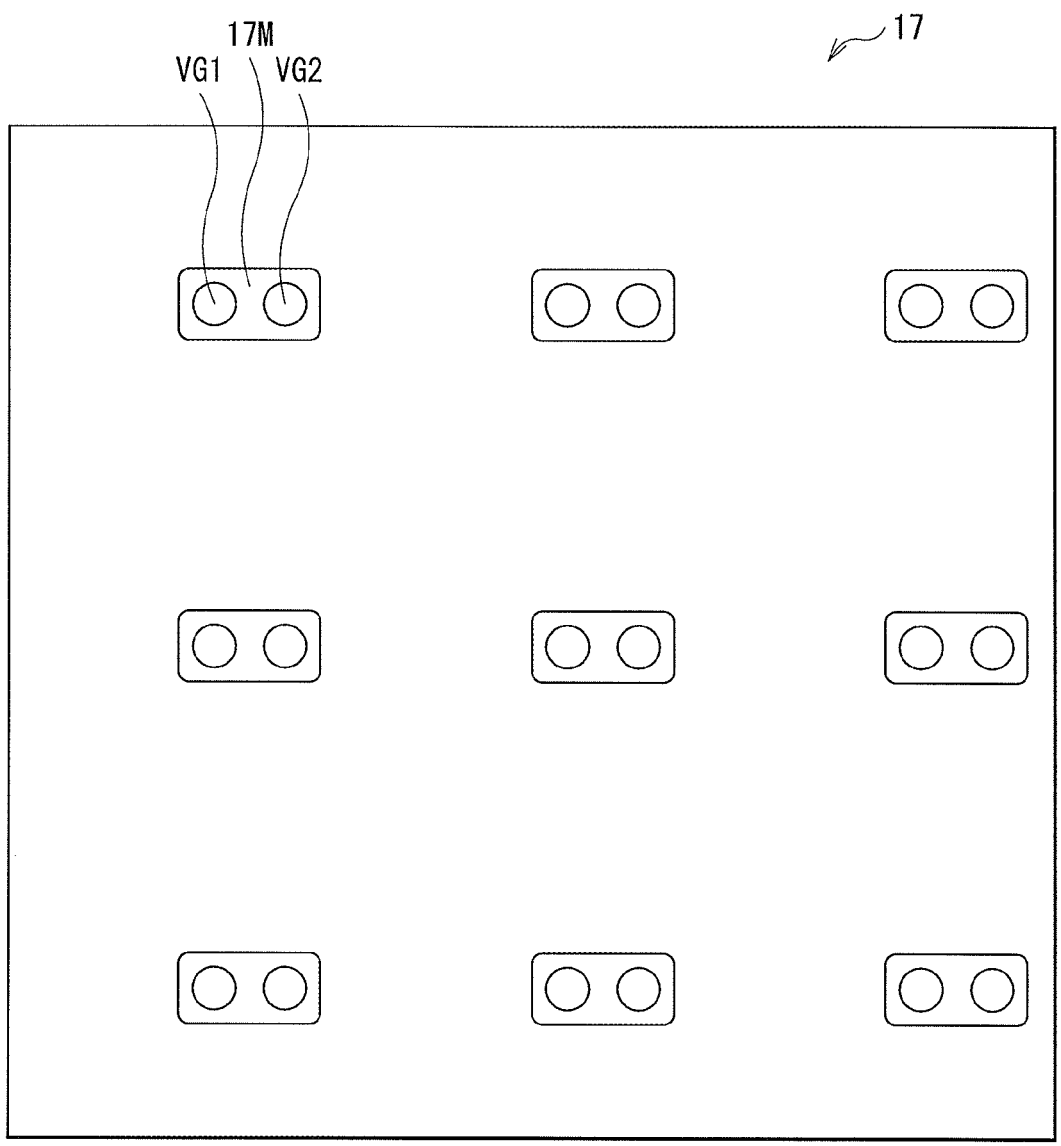
FIG. 5 is a diagram illustrating a planar configuration of a second light-blocking film illustrated in FIG. 2 together with gate electrodes.
Figure 6:
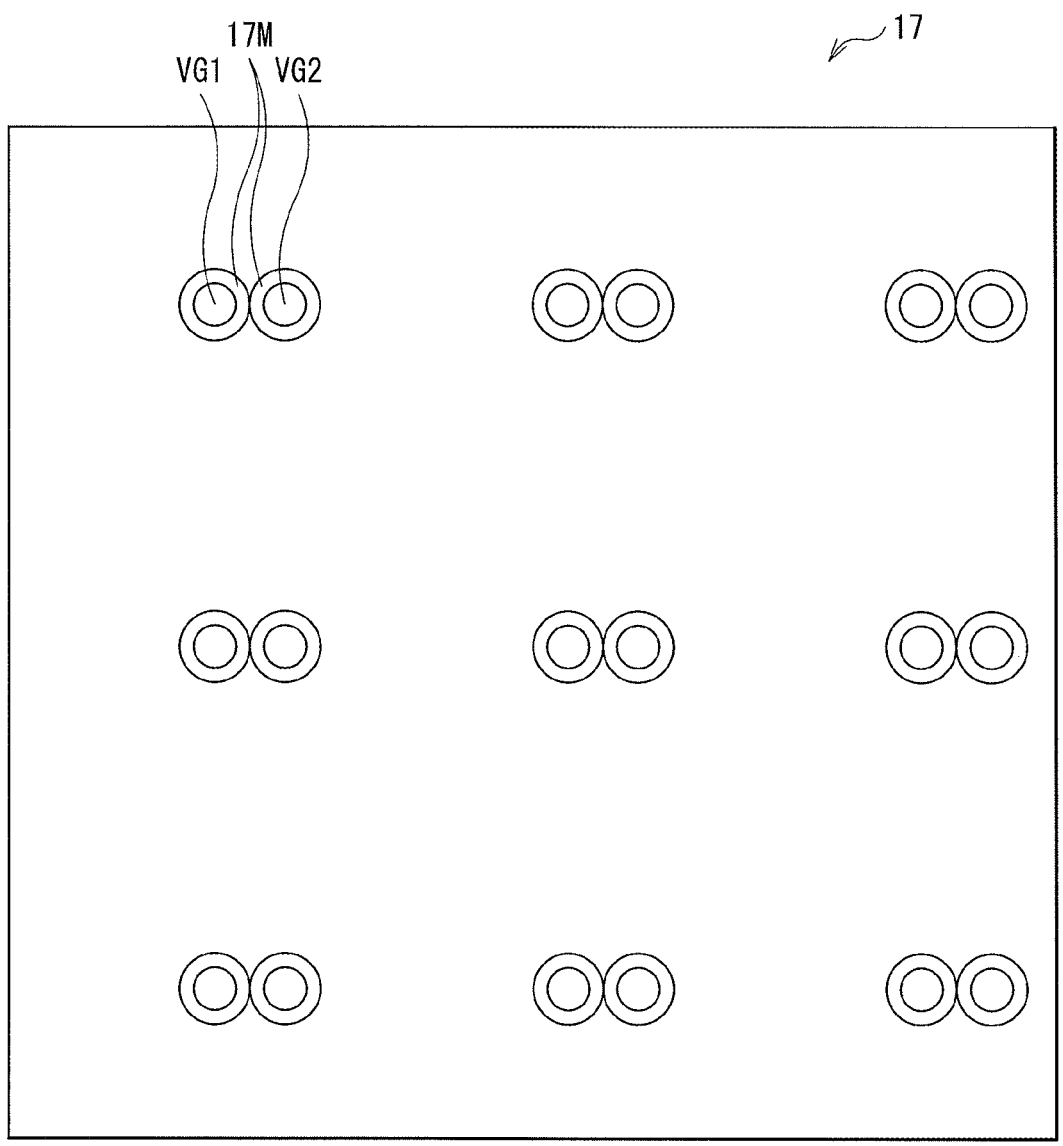
FIG. 6 is a plan view of another example of an opening of the second light-blocking film illustrated in FIG. 5.

FIGS. 5 and 6 each illustrate an example of a planar configuration of the second light-blocking film 17. The second light-blocking film 17 is provided, for example, over a region other than a portion where the gate electrodes VG1 and VG2 are provided of a region where the plurality of pixels P are provided (a pixel region). The second light-blocking film 17 has, for example, one opening 17M for each of the pixels P, and the gate electrodes VG1 and VG2 are disposed in the opening 17M (FIG. 5). Alternatively, the second light-blocking film 17 has, for example, the opening 17M corresponding to each of the gate electrodes VG1 and VG2 (FIG. 6). The opening 17M functions as a transfer path from the photoelectric converter 15, and is preferably as small as possible to allow the charge accumulation section 11 to be effectively blocked from light. For example, in a case where diameters of the gate electrodes VG1 and VG2 are about 150 nm, a diameter of the opening 17M is from 500 nm to 600 nm.

As a light-blocking material included in the first light-blocking film 16 and the second light-blocking film 17, it is possible to use an insulating material such as silicon oxide ($SiO_2$) or silicon nitride ($Si_3N_4$). Alternatively, a metal material such as aluminum (Al), tungsten (W), titanium (Ti), cobalt (Co), hafnium (Hf), and tantalum (Ta) may be used as the light-blocking material. The first light-blocking film 16 and the second light-blocking film 17 may include an organic material such as graphite or a resist material.

The first light-blocking film 16 and the second light-blocking film 17 may be electrically coupled to wiring of the solid-state imaging device 1. For example, drawing a negative bias to the first light-blocking film 16 or the second light-blocking film 17 makes it possible to suppress generation of a dark current and a white spot appearing at an interface of the first light-blocking film 16 and an interface of the second light-blocking film 17.

The first transfer transistor 25 and the discharging transistor 26 are provided on side of the back surface S2 of the semiconductor substrate 10. The first transfer transistor 25 and the discharging transistor 26 are vertical transistors, and the gate electrodes VG1 and VG2 penetrate the second semiconductor layer 10B from the back surface S2 to reach the photoelectric converter 15. In the present embodiment, the gate electrode VG1 of the first transfer transistor 25 and the gate electrode VG2 of the discharging transistor 26 are adjacently disposed, and a distance (a distance D) between the gate electrode VG1 and the gale electrode VG2 is a half or less of the lengths L1 and L2 of the sides of the pixel P. The lengths L1 and L2 have, for example, the same value; however in a case where the lengths L1 and L2 are different from each other, the distance D is a half or less of the shorter length L1 or the shorter length L2. This makes it possible to support the photoelectric converter 15 by a wider region even before formation of the second light-blocking film 17, as will be described in detail later. Accordingly, it is possible to support the photoelectric converter 15 more firmly without narrowing a formation region of the second fight-blocking film 17. A space between the gate electrode VG1 and the gate electrode VG2 is filled with the semiconductor substrate 10, for example (FIG. 2).

The gate electrodes VG1 and VG2 each have, for example, a columnar shape, and diameters of the gate electrodes VG1 and VG2 are from 100 nm to 300 nm. The distance D between the gate electrode VG1 and the gale electrode VG2 is preferably 200 nm or more.

Figure 7:
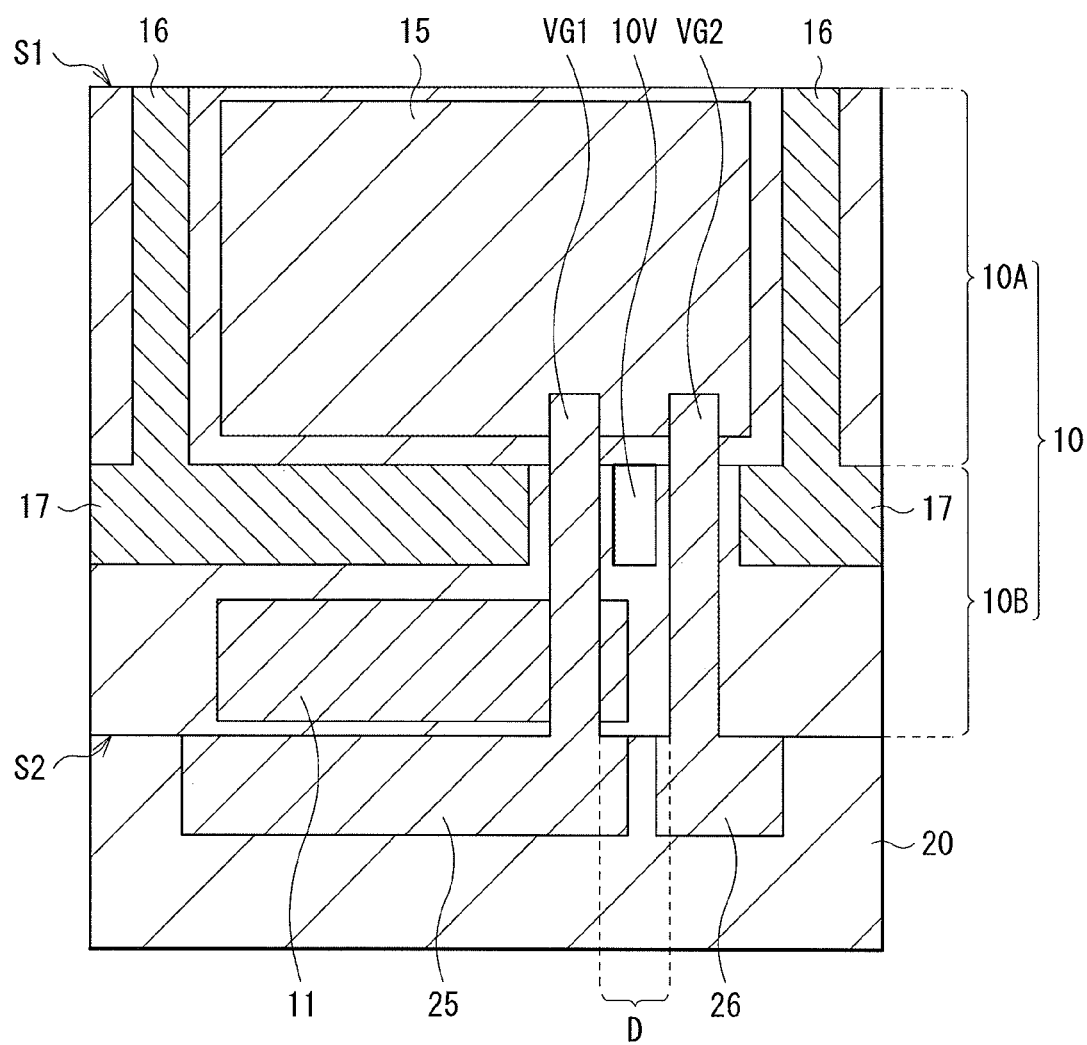
FIG. 7 is a schematic cross-sectional view of an example in which a gap is provided between two gate electrodes illustrated in FIG. 2.

As illustrated in FIG. 7, a gap (a gap 10V) of the semiconductor substrate 10 may be present between the gate electrode VG1 and the gate electrode VG2.

The first transfer transistor 25 transfers a signal charge (for example, one of a hole or an electron) generated by the photoelectric converter 15 to the charge accumulation section 11, and the gate electrode VG1 has one end coupled to the photoelectric converter 15 and another end penetrating the second semiconductor layer 10B through the charge accumulation section 11. The signal charge generated by the photoelectric converter 15 is transferred to the charge accumulation section 11 through a region around the gale electrode VG1.

The discharging transistor 26 discharges an unnecessary charge (for example, another one of the hole and the electron) generated by the photoelectric converter 15 to an overflow drain (an overflow drain 13 to be described later).

The wiring layer 20 includes a circuit for driving of each of the pixels P. The wiring layer 20 includes, for example, a row scanner, a horizontal selector, a column selector, a system controller, etc.

Figure 8:
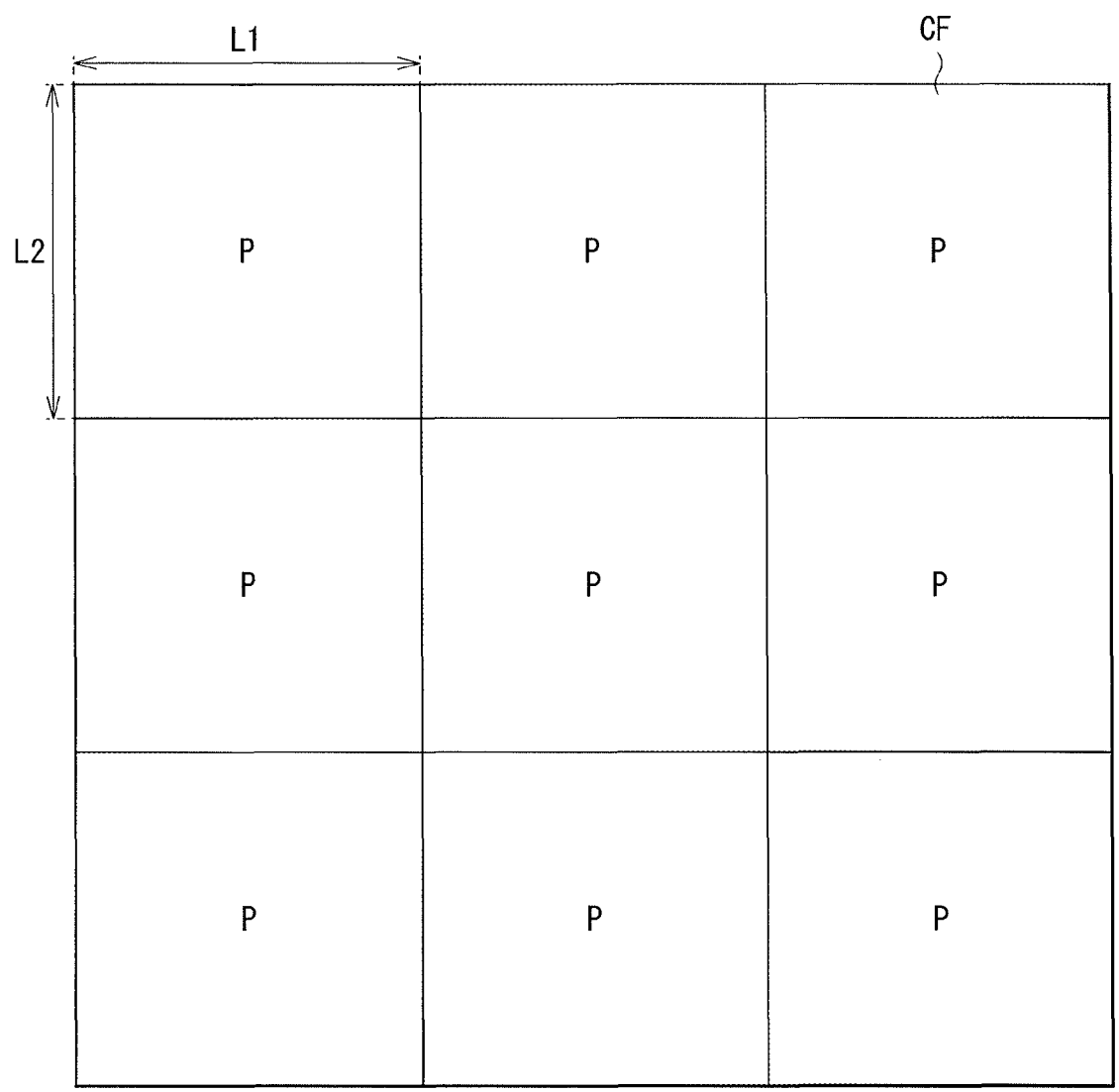
FIG. 8 is a schematic plan view of an example of a configuration of a color filter provided on a from surface of a semiconductor substrate illustrated in FIG. 2.

FIG. 8 illustrates an example of a planar configuration of the color filter CF provided on side of the front surface S1 of the semiconductor substrate 10. The color filter CF includes, for example, a red filter, a green filter, and a blue filter, any one of which is disposed in each of the pixels P. The lengths L1 and L2 of the sides of the pixel P are a length of a side of the color filter CF (for example, any one of the red filter, the green filter, and the blue filter) provided in the pixel P.

The solid-state imaging device 1 includes, for example, the overflow drain (OFD) 13, a charge-voltage converter (FD) 14, a second transfer transistor (TRG) 21, a reset transistor (RST) 22, an amplification transistor (AMP) 23, and a select transistor (SEL) 24 in addition to components described above (FIG. 1).

Figure 9:
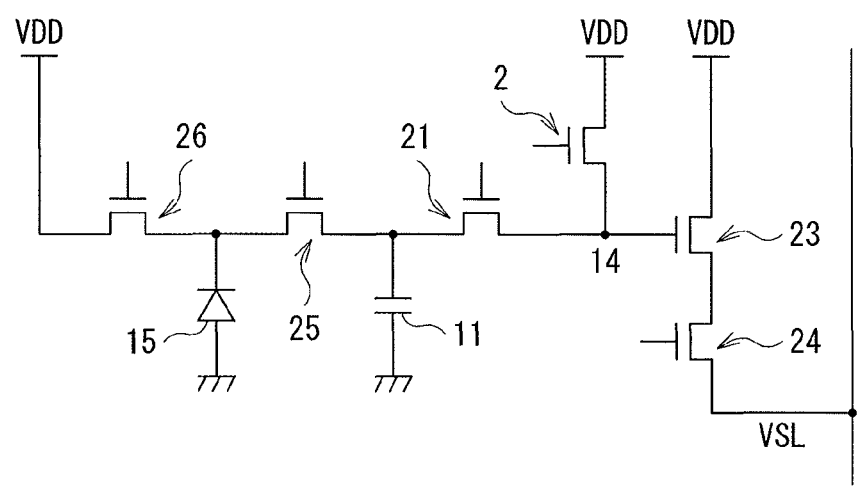
FIG. 9 is a diagram illustrating an example of a pixel circuit of the solid-state imaging device illustrated in FIG. 1.

FIG. 9 illustrates an example of a configuration of a pixel circuit of the solid-state imaging device 1.

The first transfer transistor 25 is turned on in a case where a first transfer signal is inputted to a gate thereof. This causes the signal charge generated by the photoelectric converter 15 to be read, and transferred to the charge accumulation section 11.

The second transfer transistor 21 is turned on in a case where a second transfer signal is inputted to a gale thereof. This causes the signal charge temporarily held in the charge accumulation section 11 to be read, and transferred to the charge-voltage converter 14. The charge-voltage converter 14 holds the signal charge read from the charge accumulation section 11 and converts the signal charge into a voltage (a potential).

The reset transistor 22 is provided between a supply terminal of a constant voltage source VDD and the charge-voltage converter 14. The reset transistor 22 is turned on in a case where a reset signal is inputted to a gate thereof. This causes the charge accumulated in the charge-voltage converter 14 to be discharged to the constant voltage source VDD, thereby resetting a potential of the charge-voltage converter 14.

The amplification transistor 23 has a gate coupled to the charge-voltage converter 14, a drain coupled to the supply terminal of the constant voltage source VDD, and a source coupled to a vertical signal line VSL via the select transistor 24. The amplification transistor 23 amplifies the potential of the charge-voltage converter 14, and outputs a thus-amplified signal as a pixel signal (a light accumulation signal) to the select transistor 24.

The select transistor 24 is provided between the amplification transistor 23 and the vertical signal line VSL. The select transistor 24 is turned on in a case where an address signal is inputted to a gate thereof. This causes the pixel signal (a voltage signal) amplified by the amplification transistor 23 to be controlled, and outputted to the vertical signal line VSL.

The discharging transistor 26 is turned on in a case where a discharge signal is inputted to a gate thereof. This causes an unnecessary charge accumulated in the photoelectric converter 15 to be discharged to the constant voltage source VDD.

[Method of Manufacturing Solid-State Imaging Device 1]

It is possible to manufacture the solid-state imaging device 1 as follows. FIGS. 10A to 11C illustrate an example of a method of manufacturing the solid-state imaging device 1 in process order.

Figure 10A:
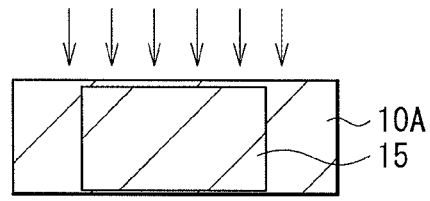
FIG. 10A is a schematic cross-sectional view of a process of a method of manufacturing the solid-state imaging device illustrated in FIG. 2.

First, the photoelectric converter 15 is formed in the first semiconductor layer 10A, as illustrated in FIG. 10A. The photoelectric converter 15 is formed, for example, by ion implantation of a p-type impurity and an n-type impurity.

Figure 10B:
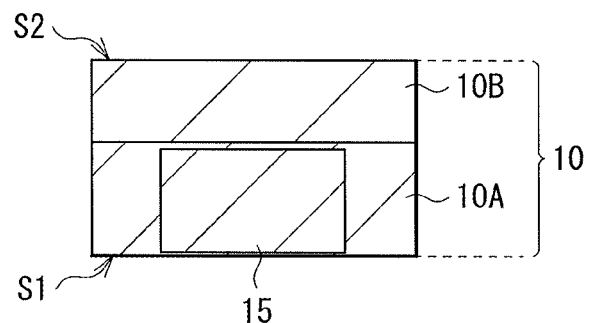
FIG. 10B is a schematic cross-sectional view of a process following FIG. 10A.

Next, for example, silicon is epitaxially grown on the first semiconductor layer 10A to form the second semiconductor layer 10B, as illustrated in FIG. 10B. Thus, the semiconductor substrate 10 is formed.

Figure 10C:
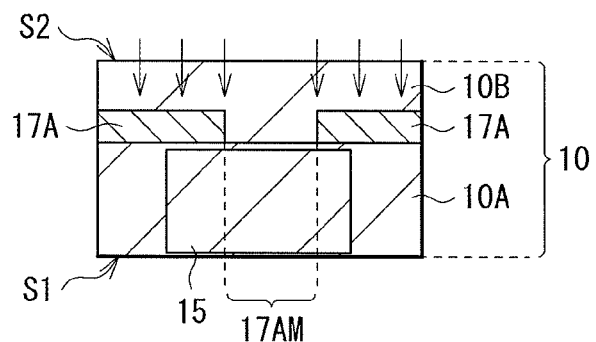
FIG. 10C is a schematic cross-sectional view of a process following FIG. 10B.

Subsequently, an oxygen ion is injected from side of the back surface S2 of the semiconductor substrate 10 by, for example, an SIMOX (Separation by IMplanted OXygen) method. Next, annealing treatment is performed to form an oxidation layer 17A on side closer to the back surface S2 than the photoelectric converter 15 (FIG. 10C). The oxidation layer 17A is used to form the second light-blocking film 17 in a later process. In the oxidation layer 17A, an opening (an opening 17AM) is formed in a region where the gate electrodes VG1 and VG2 are to be formed.

Figure 10D:
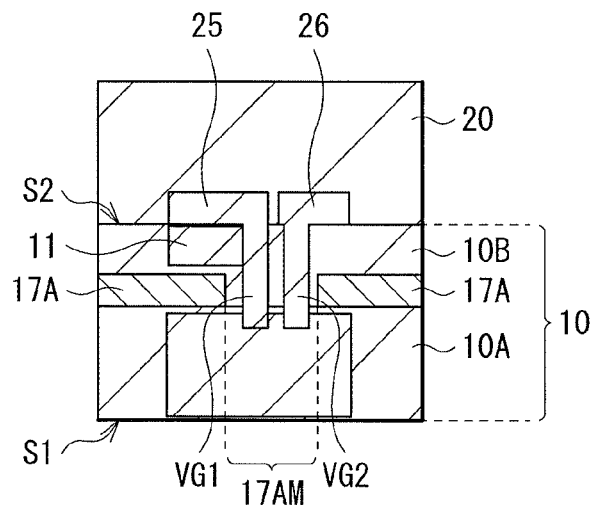
FIG. 10D is a schematic cross-sectional view of a process following FIG. 10C.

After the oxidation layer 17A is formed in the semiconductor substrate 10, the charge accumulation section 11 is formed on side closer to the back surface S2 than the oxidation layer 17A. The charge accumulation section 11 is formed by, for example, ion implantation of an n-type impurity. The overflow drain 13 and the charge-voltage converter 14 are formed, together with the charge accumulation section 11, in the semiconductor substrate 10. Next, the first transfer transistor 25, the discharging transistor 26, and the second transfer transistor 21, and the reset transistor 22, the amplification transistor 23 and the select transistor 24 are formed. In a case where the first transfer transistor 25, and the discharging transistor 26 are formed, the gate electrodes VG1 and VG2 are disposed to pass through the opening 17AM of the oxidation layer 17A. Thereafter, the wiring layer 20 is formed on the back surface S2 of the semiconductor substrate 10 (FIG. 10D).

Figure 11A:
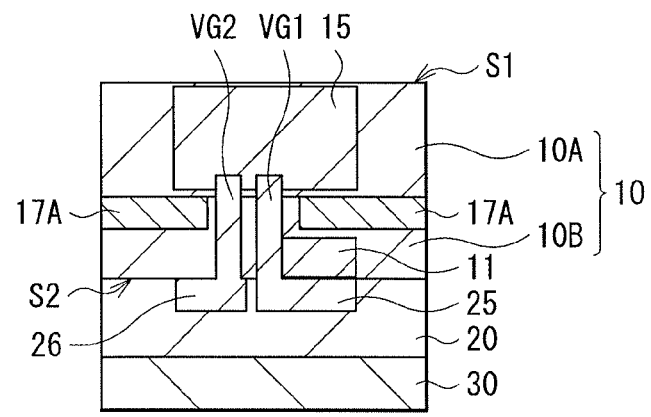
FIG. 11A is a schematic cross-sectional view of a process following FIG. 10D.
Figure 11B:
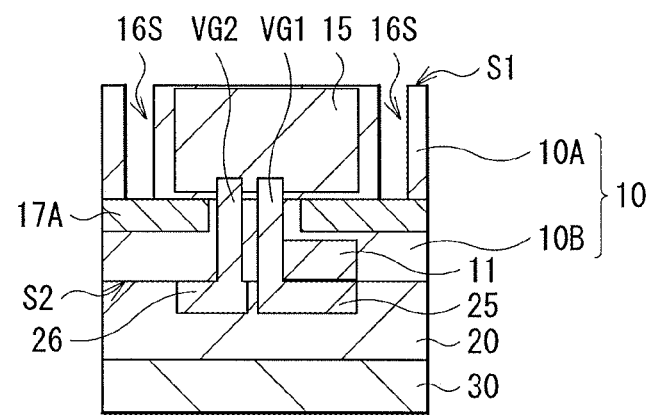
FIG. 11B is a schematic cross-sectional view of a process following FIG. 11A.

Next, as illustrated in FIG. 11A, the supporting substrate 30 is bonded to the back surface S2 of the semiconductor substrate 10 with the wiring layer 20 interposed therebetween, and is flipped from top to bottom. Subsequently, a slit 16S reaching the oxidation layer 17A from the front surface S1 of the semiconductor substrate 10 is formed around the photoelectric converter 15, as illustrated in FIG. 11B. The slit 16S is provided in a region where the first light-blocking film 16 is to be formed. It is possible to form the slit 16S with use of, for example, a photolithography process and an etching process. As the etching process, it is possible to use, for example, a reactive ion etching (RIE) method, a Deep RIE method, etc.

Figure 11C:
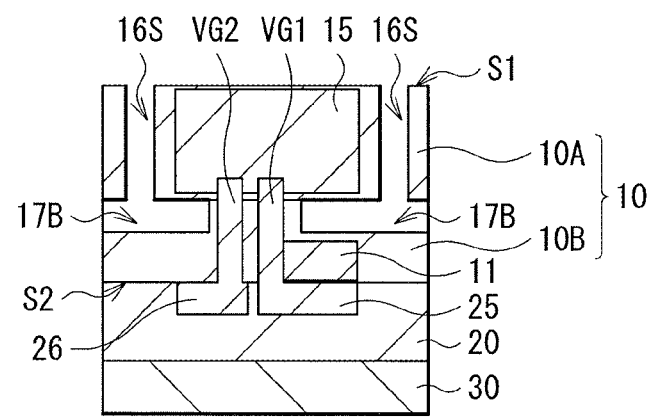
FIG. 11C is a schematic cross-sectional view of a process following FIG. 11B.

After the slit 16S is formed, the oxidation layer 17A is removed through the slit 16S. Thus, a cavity 17B communicated with the slit 16S is formed (FIG. 11C). The oxidation layer 17A is removed by, for example, an etching process such as wet etching or dry etching. As will be described in detail later, in the present embodiment, even after formation of such a cavity 17B, two gate electrodes VG1 and VG2 are adjacently provided, which allows the photoelectric converter 15 to be supported by a wider region.

After the cavity 17B is formed, the slit 16S and the cavity 17B are filled with the light-blocking material. Thus, the first light-blocking film 16 and the second light-blocking film 17 are respectively formed in the slit 16S and the cavity 17B. Lastly, the color filter CF and the on-chip lens are formed on the front surface S1 of the semiconductor substrate 10, thereby completing the solid-state imaging device 1 illustrated in FIGS. 1 and 2.

[Operation of Solid-State Imaging Device 1]

In the solid-state imaging device 1, light (for example, light of a wavelength in a visible region) enters the photoelectric converter 15 through the on-chip lens and the color filter CF. Accordingly, the photoelectric converter 15 generates a pair of a hole and an electron (performs photoelectric conversion). In a case where the first transfer signal is inputted to the gate electrode VG1 of the first transfer transistor 25 to turn on the first transfer transistor 25, a signal charge accumulated in the photoelectric converter 15 is transferred to the charge accumulation section 11. In a case where the second transfer transistor 21 is turned on, the signal charge accumulated in the charge accumulation section 11 is transferred to the charge-voltage converter 14. In the charge-voltage converter 14, the signal charge is converted into a voltage signal, and the voltage signal is read as a pixel signal.

[Workings and Effects of Solid-State Imaging Device 1]

In the solid-state imaging device 1 according to the present embodiment, the distance D between the gate electrode VG1 of the first transfer transistor 25 and the gate electrode VG2 of the discharging transistor 26 is a half or less of the lengths L1 and L2 of the sides of the pixel P, and the gate electrode VG1 and the gate electrode VG2 are adjacently disposed. Even if the cavity 17B is provided before formation of the second light-blocking film 17 (FIG. 11C), the photoelectric converter 15 is supported by a region in proximity to two gate electrodes (the gate electrodes VG1 and VG2). Therefore, as compared with a case where the photoelectric converter 15 is supported by a region in proximity to one gate electrode (for example, a gale electrode VG100 in FIG. 12 to be described later), the photoelectric converter 15 is supported by a wider region. This is described below.

Figure 12:
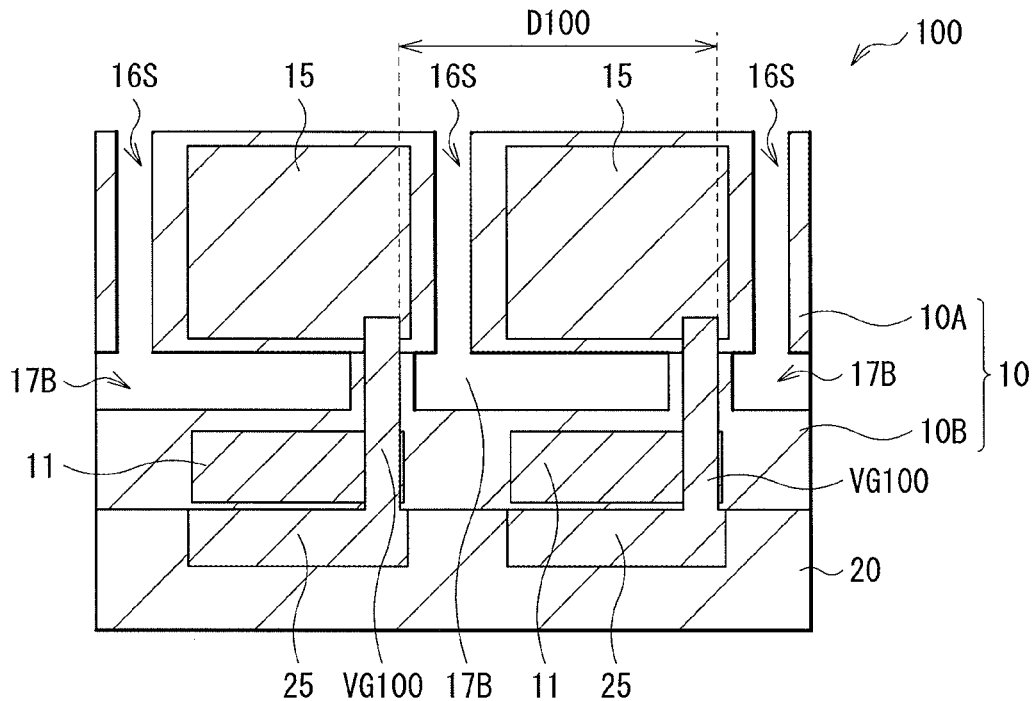
FIG. 12 is a schematic cross-sectional view of a process of a method of manufacturing a solid-state imaging device according to a comparative example.

FIG. 12 illustrates a process of a method of manufacturing a solid-state imaging device (a solid-state imaging device 100) according to a comparative example. The solid-state imaging device 100 includes the gate electrode VG100 for each of the pixels P. The gate electrode VG100 is, for example, a gate electrode of the first transfer transistor 25. In the solid-state imaging device 100, a distance D100 between two adjacent gate electrodes VG100 is substantially equal to the lengths L1 and L2 of the sides of the pixel P.

In such a solid-state imaging device 100, in a case where the cavity 17B is formed, the photoelectric converter 15 is supported only by a region in proximity to one gate electrode VG100. The photoelectric converter 15 is not sufficiently supportable by such a narrow region, which causes a possibility that distortion or peeling of the semiconductor substrate 10 occurs. In contrast, in a case where a region supporting the photoelectric converter 15 is widened, a formation region of the cavity 17B, that is, the second light-blocking film is narrowed, which causes susceptibility to an influence of PLS.

In contrast, in the solid-state imaging device 1, two gate electrodes VG1 and VG2 are adjacently disposed, which allows the photoelectric converter 15 to be supposed by a wider region (a region in proximity to the two gate electrodes VG1 and VG2) even in a case where the cavity 17B is formed. This makes it possible to support the photoelectric converter 15 more firmly without narrowing the formation region of the second fight-blocking film 17 (the cavity 17B).

As described above, in the solid-state imaging device 1 according to the present embodiment, the distance D between the gale electrode VG1 of the first transfer transistor 25 and the gate electrode VG2 of the discharging transistor 26 is a half or less of the lengths L1 and L2 of the pixel P, which makes it possible to support the photoelectric converter 15 by a wider region even before formation of the second light-blocking film 17, that is, in formation of the cavity 17B. Hence, it is possible to maintain mechanical strength while suppressing PLS.

Moreover, the first light-blocking film 16 on the periphery of the photoelectric converter 15 is allowed to function as a pixel separation film. This makes it possible to suppress occurrence of color mixture, blooming, etc. resulting from movement of the signal charge between adjacent pixels P. The first light-blocking film 16 is preferably provided on the entire periphery of the photoelectric converter 15 to surround the photoelectric converter 15.

Next, description is given of modification examples of the foregoing embodiment, other embodiments, etc. In the following description, same components as those in the foregoing embodiment are denoted by same reference numerals, and description thereof is omitted where appropriate.

Modification Example 1

Figure 13:
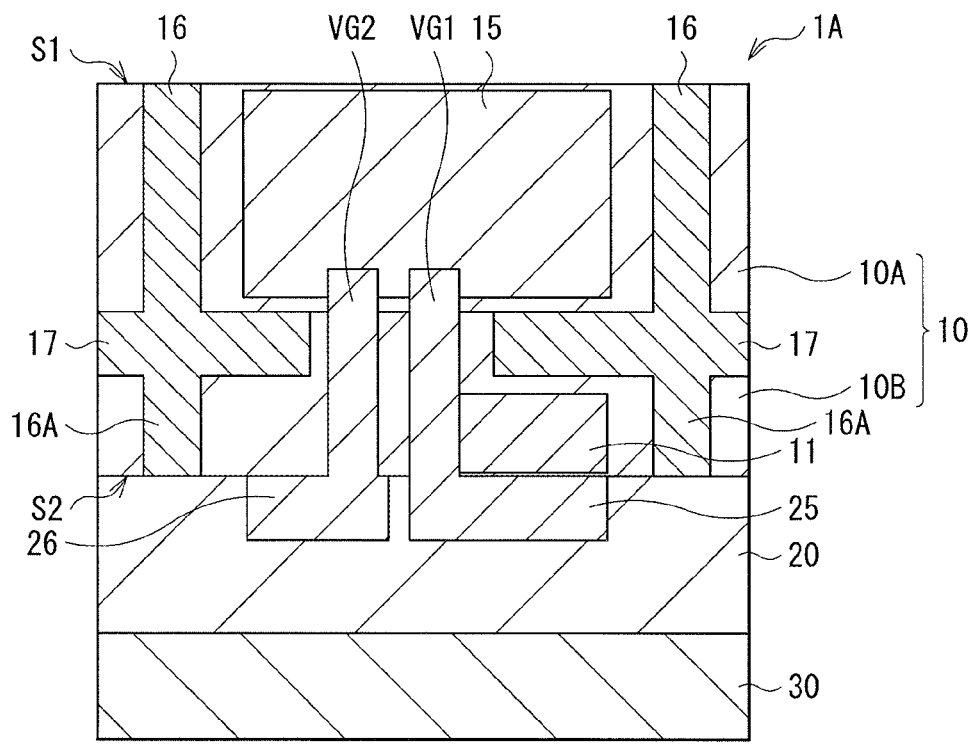
FIG. 13 is a cross-sectional view of a schematic configuration of a solid-state imaging device according to a modification example 1.

FIG. 13 illustrates a schematic cross-sectional configuration of a solid-state imaging device (a solid-state imaging device 1A) according to a modification example 1 of the foregoing first embodiment. The solid-state imaging device 1A includes a first light-blocking film (a first light-blocking film 16A) reaching the second light-blocking film 17 from the back surface S2 of the semiconductor substrate 10. The solid-state imaging device 1A has a configuration and effects similar to those of the solid-state imaging device 1 except for this point.

The solid-state imaging device 1A includes the first light-blocking film 16 in the first semiconductor layer 10A, as with the solid-state imaging device 1. In addition to this, in the solid-state imaging device 1A, the first light-blocking film 16A is provided in the second semiconductor layer 10B. The first light-blocking film 16A prevents entry of unnecessary light to the charge accumulation section 11, and is provided on at least a portion of a periphery of the charge accumulation section 11. The first light-blocking film 16A is provided at the same position as the first light-blocking film 16 on the periphery of the photoelectric converter 15 in plan view. The first light-blocking film 16 and the first light-blocking film 16A may be provided at positions different from each other in plan view.

Even in the present modification example, the gate electrode VG1 and the gate electrode VG2 are adjacently provided, which makes it possible to support the photoelectric converter 15 by a wider region even before formation of the second light-blocking film 17, as with the foregoing first embodiment. Moreover, while leakage of light into the adjacent photoelectric converters 15 is suppressed by the first light-blocking film 16, leakage of light into the adjacent charge accumulation sections 11 is also suppressed by the first light-blocking film 16A.

Modification Example 2

Figure 14:
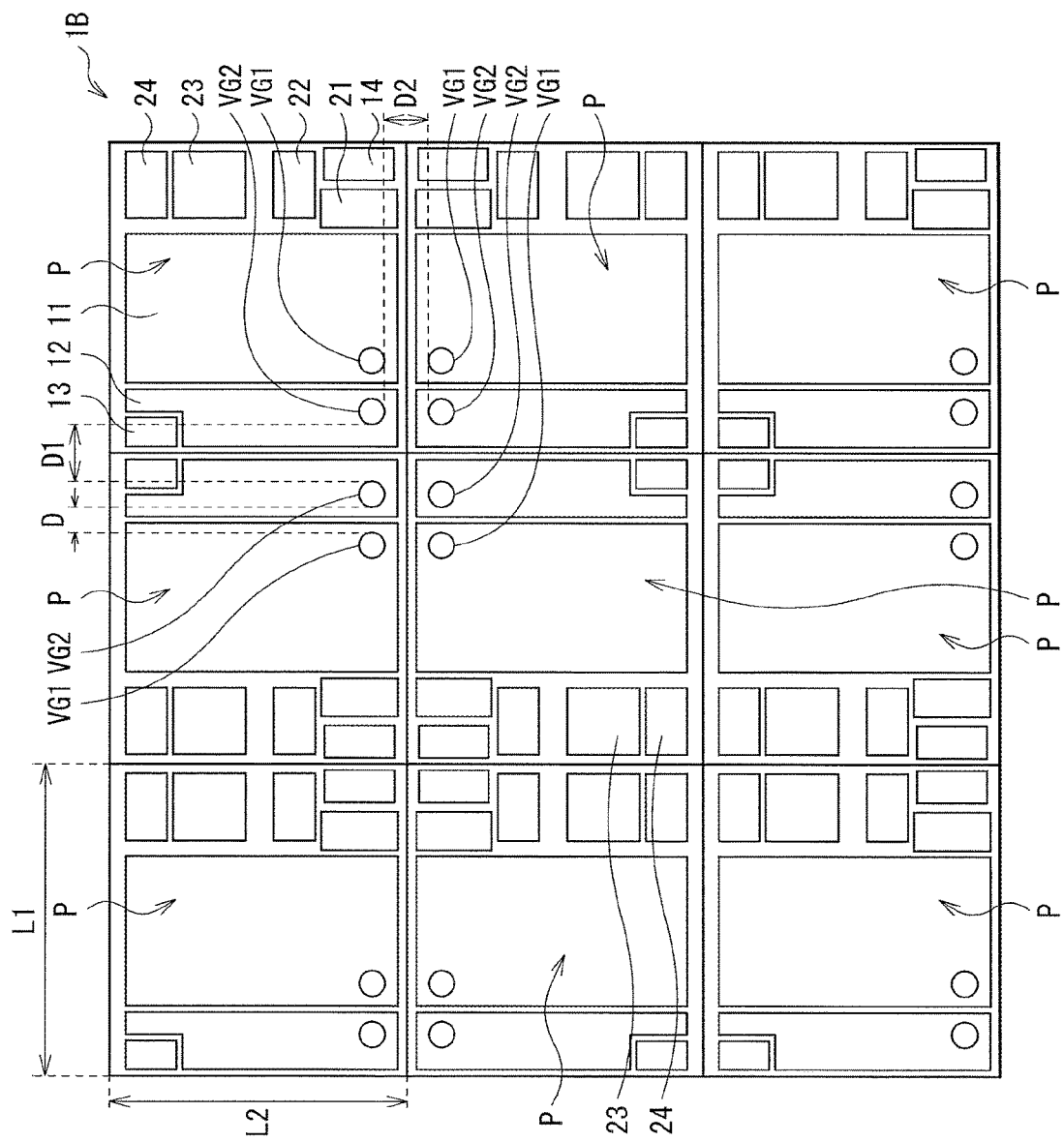
FIG. 14 is a plan view of a schematic configuration of a solid-state imaging device according to a modification example 2.

FIG. 14 illustrates a schematic planar configuration of a solid-state imaging device (a solid-state imaging device 1B) according to a modification example 2 of the foregoing first embodiment. In the solid-state imaging device 1B, two gate electrodes (the gate electrodes VG1, the gate electrodes VG2, or the gate electrode VG1 and the gate electrode VG2) are also adjacently disposed in adjacent pixels P. The solid-state imaging device 1B has a configuration and effects similar to those of the solid-state imaging device 1 except for this point.

In the solid-state imaging device 1B, two horizontally adjacent pixels P are line-symmetrically disposed, and two vertically adjacent pixels P are also line-symmetrically disposed. The gate electrodes VG1 and VG2 of each of the four pixels P are disposed in proximity to a center of the four pixels P (an intersection of symmetry axes). For example, in the horizontally adjacent pixels P, the gate electrodes VG2 are adjacently disposed with the distance D1 therebetween, and in the vertically adjacent pixels P, the gate electrodes VG1 are adjacently disposed with a distance D2 therebetween, and the gate electrodes VG2 are adjacently disposed with the distance D2 therebetween. The distances D1 and D2 are a half or less of the lengths L1 and L2 of the sides of the pixel P. In the horizontally adjacent pixels P, the gate electrodes VG1 may be adjacently disposed and the gate electrodes VG2 may be adjacently disposed, and in the vertically adjacent pixels P, the gate electrodes VG1 or the gate electrodes VG2 may be adjacently disposed. In the adjacent pixels P, the gate electrode VG1 and the gate electrode VG2 may be adjacently disposed. In the solid-state imaging device 1B, disposing the gate electrodes VG1 and VG2 in an edge portion of each of the pixels P makes it easy to adjacently dispose the gate electrodes VG1 and VG2 in the adjacent pixels P.

Even in the present modification example, the gate electrode VG1 and the gate electrode VG2 are adjacently provided in the same pixel P, which makes it possible to support the photoelectric converter 15 by a wider region before formation of the second light-blocking film 17, as with the foregoing first embodiment. In addition, the gate electrodes VG1 and VG2 are adjacently provided in the adjacent pixels P, which further widens the region supporting the photoelectric converter 15. This makes it possible to support the photoelectric converter 15 more firmly.

Modification Example 3

Figure 15:
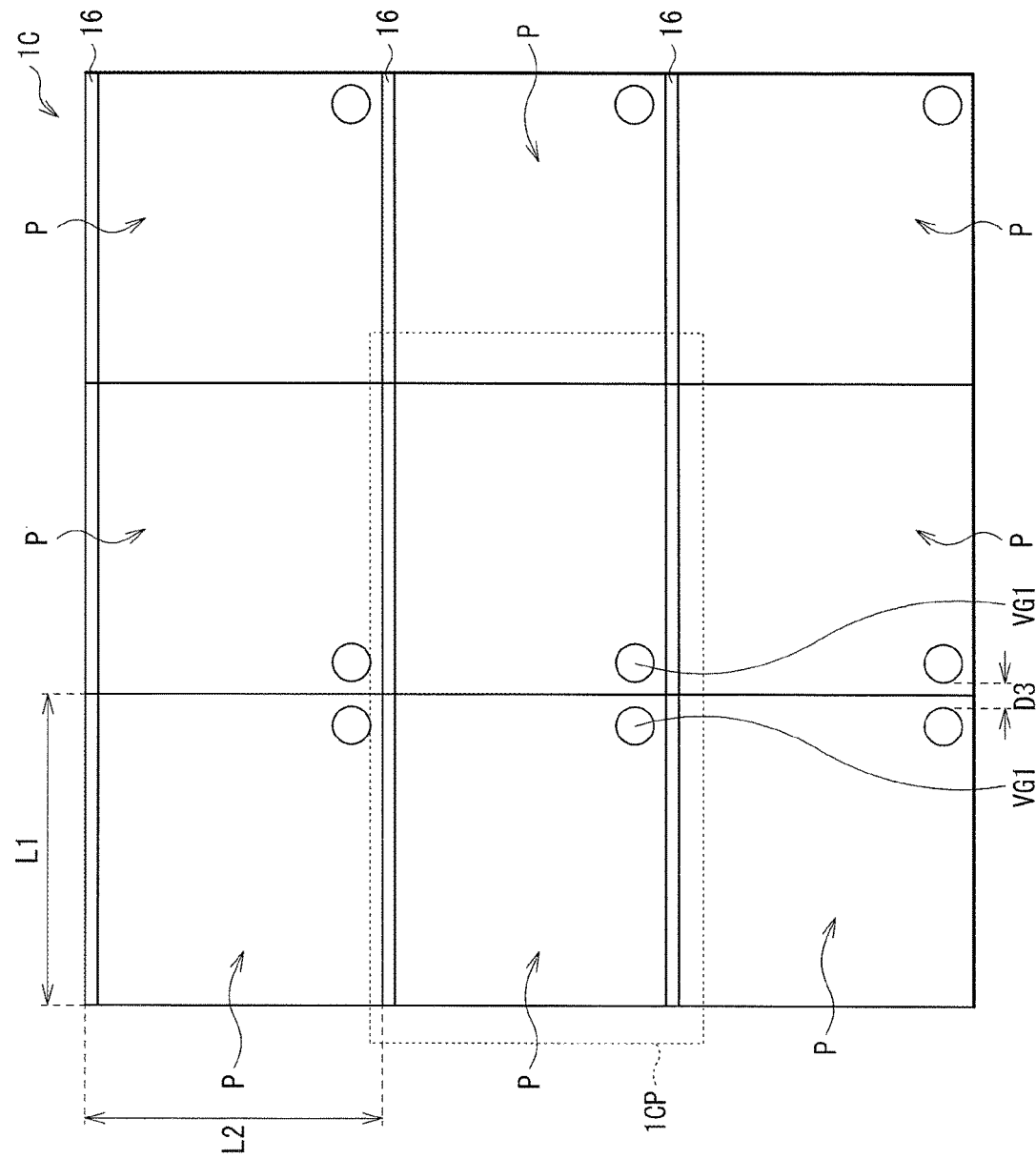
FIG. 15 is a plan view of a schematic configuration of a solid-state imaging device according to a modification example 3.

FIG. 15 illustrates a schematic planar configuration of a solid-state imaging device (a solid-state imaging device 1C) according to a modification example 3 of the foregoing first embodiment. In the solid-state imaging device 1C, two gate electrodes VG1 (a first vertical electrode and a second vertical electrode) are adjacently disposed in adjacent pixels P. In other words, herein, the first vertical electrode and the second vertical electrode are disposed in mutually different pixels P. The solid-state imaging device 1C has a configuration and effects similar to those of the solid-state imaging device 1 except for this point.

Figure 16A:
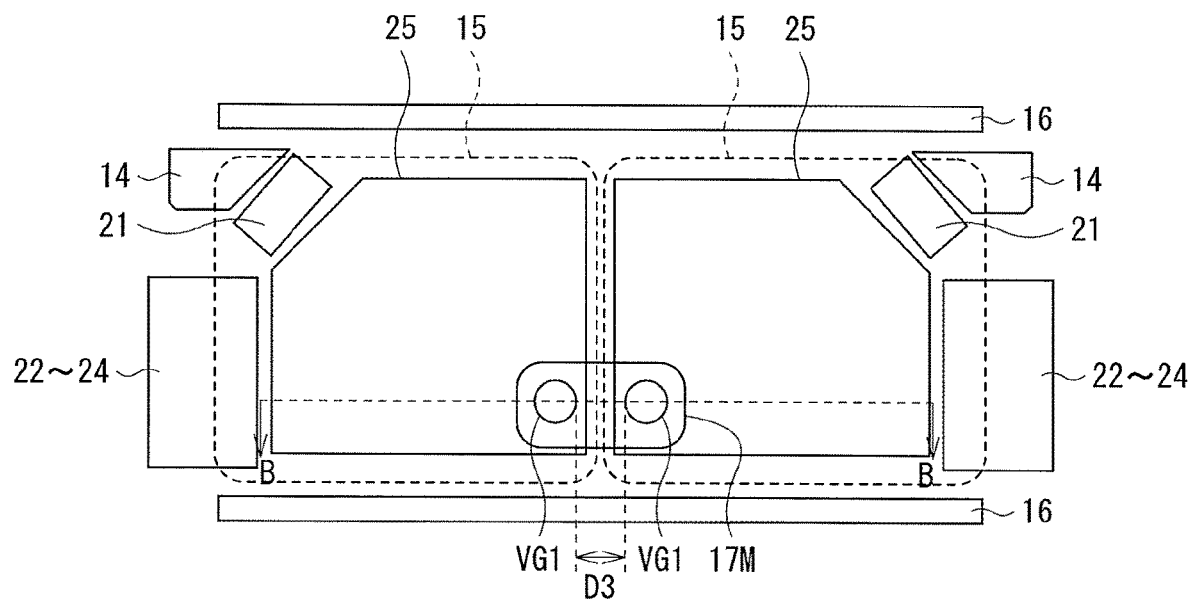
FIG. 16A is a schematic enlarged plan view of a portion of the solid-state imaging device illustrated in FIG. 15.
Figure 16B:
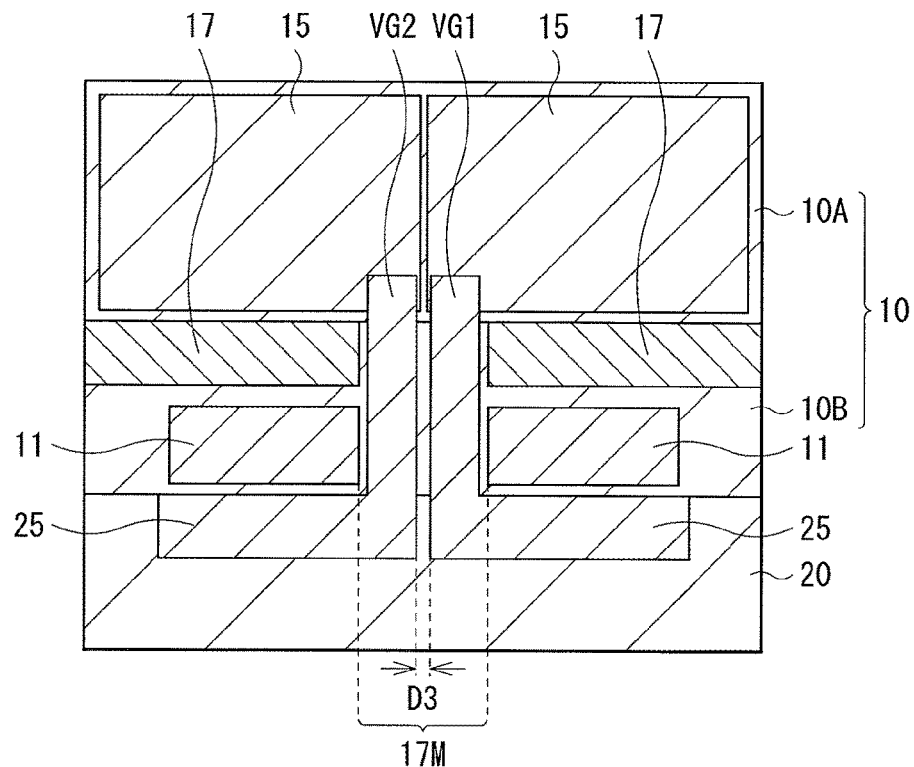
FIG. 16B is a schematic view of a cross-sectional configuration taken along a line B-B illustrated in FIG. 16A.

FIG. 16A illustrates an enlarged portion (a portion 1CP) of the solid-state imaging device 1C illustrated in FIG. 15, and FIG. 16B illustrates a cross-sectional configuration taken along a line B-B in FIG. 16A. In the solid-state imaging device 1C, for example, two horizontally adjacent pixels P are line-symmetrically provided in plan view, and the gate electrode VG1 of the first transfer transistor 25 is disposed in each of the two pixels P in proximity to a boundary (a symmetry axis) between the two pixels P. In other words, the gate electrodes VG1 are adjacently disposed with a distance D3 therebetween. The distance D3 between the horizontally adjacent gate electrodes VG1 is a half or less of the lengths L1 and L2 of the sides of the pixel P. The gate electrodes VG1 may be adjacently disposed in two vertically adjacent pixels P. Alternatively, the gate electrodes VG2 (refer to FIG. 14) of the discharging transistors 26 may be adjacently disposed in two vertically or horizontally adjacent pixels P. The gate electrode VG1 of the first transfer transistor 25 and the gate electrode VG2 of the discharging transistor 26 may be adjacently disposed in two vertically or horizontally adjacent pixels P. In the solid-state imaging device 1C, disposing the gate electrode VG1 in an edge portion of each of the pixels P makes it easy to adjacently dispose the gate electrodes VG1 in the adjacent pixels P.

The charge-voltage converter 14 is disposed at an end diagonal to the gate electrode VG1 in plan view, for example. The charge-voltage converter 14 is preferably disposed at a position away from the gate electrode VG1 in such a manner. Accordingly, a charge transfer gradient is formed in the charge accumulation section 11, and a charge is easily accumulated in the charge-voltage converter 14.

As described in the present modification example, in the smite pixel P, the gate electrodes (for example, two gate electrodes VG1 and VG2) may not be adjacent to each other, and in the adjacent pixels P, the gate electrodes VG1 may be adjacent to each other. Even in such a case, as with the foregoing first embodiment, it is possible to support the photoelectric converter 15 by a wider region.

Modification Example 4

FIG. 17 illustrates a schematic planar configuration of a solid-state imaging device (a solid-state imaging device 1D) according to a modification example 4 of the foregoing first embodiment. In the solid-state imaging device 1D, two gate electrodes VG1 are adjacently disposed in the horizontally adjacent pixels P, and two gate electrodes VG1 are adjacently disposed also in the vertically adjacent pixels P. The solid-state imaging device 1D has a configuration and effects similar to those of the solid-state imaging device 1C except for this point.

Figure 18A:
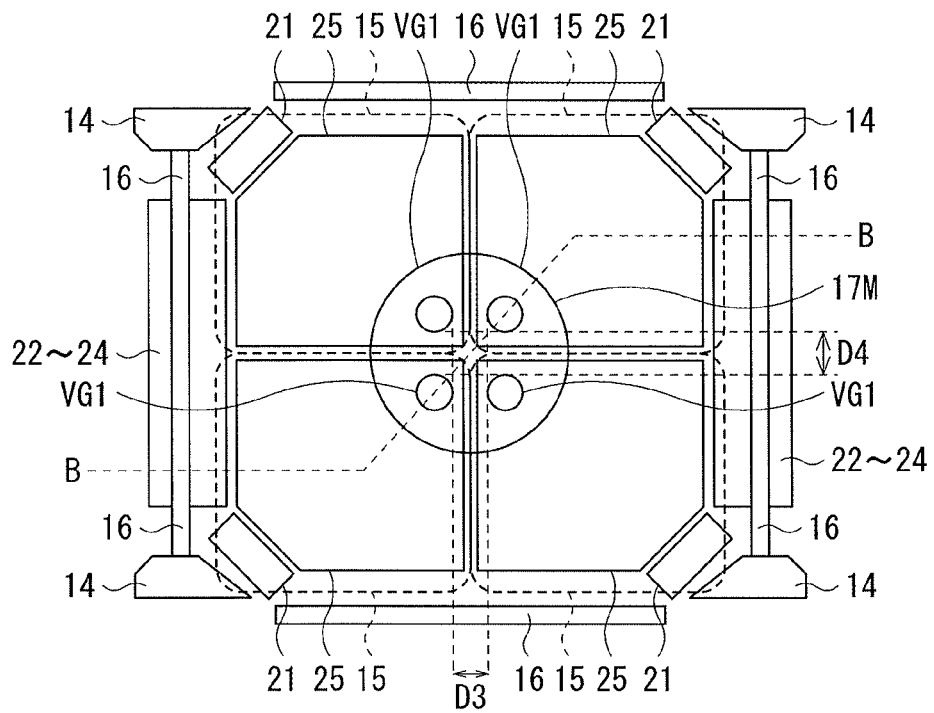
FIG. 18A is a schematic enlarged plan view of a portion of the solid-state imaging device illustrated in FIG. 17.
Figure 18B:
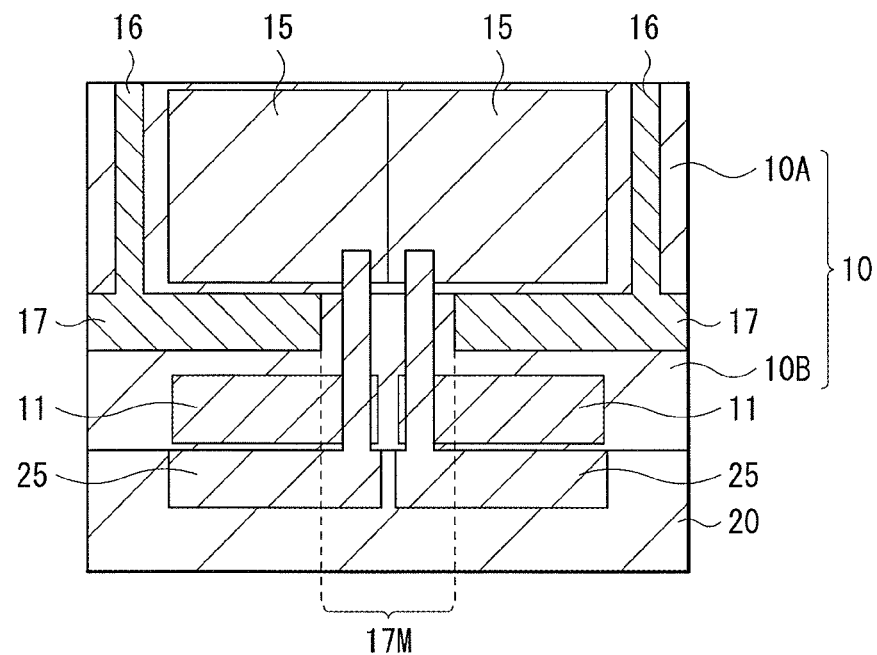
FIG. 18B is a schematic view of a cross-sectional configuration taken along a line B-B illustrated in FIG. 18A.

FIG. 18A illustrates an enlarged portion (a portion 1DP) of the solid-state imaging device 1D illustrated in FIG. 17, and FIG. 18B illustrates a cross-sectional configuration taken along a line B-B in FIG. 18A. In the solid-state imaging device 1D, in plan view, for example, two horizontally adjacent pixels P are line-symmetrically disposed, and two vertically adjacent pixels P are also line-symmetrically disposed. The gate electrode VG1 of each of the four pixels P is disposed at a center of the four pixels P (an intersection of symmetry axes). For example, in the horizontally adjacent pixel P, the gate electrodes VG1 are adjacently disposed with the distance D3 therebetween, and in the vertically adjacent pixels P, the gate electrodes VG1 are adjacently disposed with the distance D4 therebetween. The distances D3 and D4 are a half or less of the lengths L1 and L2 of the sides of the pixel P. In the horizontally adjacent pixels P, the gate electrodes VG2 of the discharging transistors 26 may be adjacently disposed, and also in the vertically adjacent pixels P, the gate electrodes VG2 of the discharging transistors 26 may be adjacently disposed. Alternatively, in the horizontally adjacent pixels P, the gate electrode VG1 and the gate electrode VG2 may be adjacently disposed, and also in the vertically adjacent pixels P, the gate electrode VG1 and the gate electrode VG2 may be adjacently disposed. In the solid-state imaging device 1D, disposing the gate electrode VG1 in an edge portion of each of the pixels P makes it easy to adjacently dispose the gate electrodes VG1 in the adjacent pixels P.

In the present modification example, the gate electrodes VG1 are disposed adjacently in two directions (the vertical direction and the horizontal direction) in adjacent pixels P, which makes it possible to further widen the region supporting the photoelectric converter 15 even before formation of the second light-blocking film 17.

It is possible to manufacture such a solid-state imaging device 1D as follows, for example (FIGS. 19A to 20B).

Figure 19A:
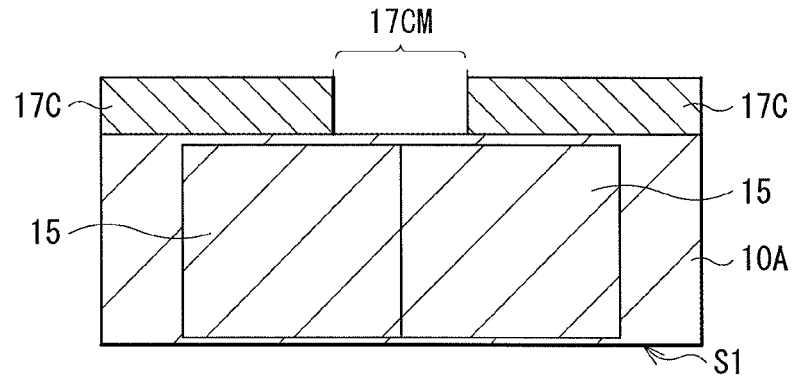
FIG. 19A is a schematic cross-sectional view of a process of a method of manufacturing the solid-state imaging device illustrated in FIG. 19B.

First, the photoelectric converter 15 is formed in the first semiconductor layer 10A in a manner similar to that described in the foregoing first embodiment. Next, as illustrated in FIG. 19A, a sacrificial layer 17C is formed on one surface of the first semiconductor layer 10A, and the sacrificial layer 17C is patterned to form an opening 17CM in the sacrificial layer 17C. The sacrificial layer 17C is used to form the second light-blocking film 17 in a later process. The sacrificial layer 17C is formed through forming a film of silicon germanium (SiGe) with use of, for example, a chemical vapor deposition (CVD) method. The sacrificial layer 17C may be formed with use of any material, other than silicon germanium, that is allowed to be epitaxially grown on the first semiconductor layer 10A.

Figure 19B:
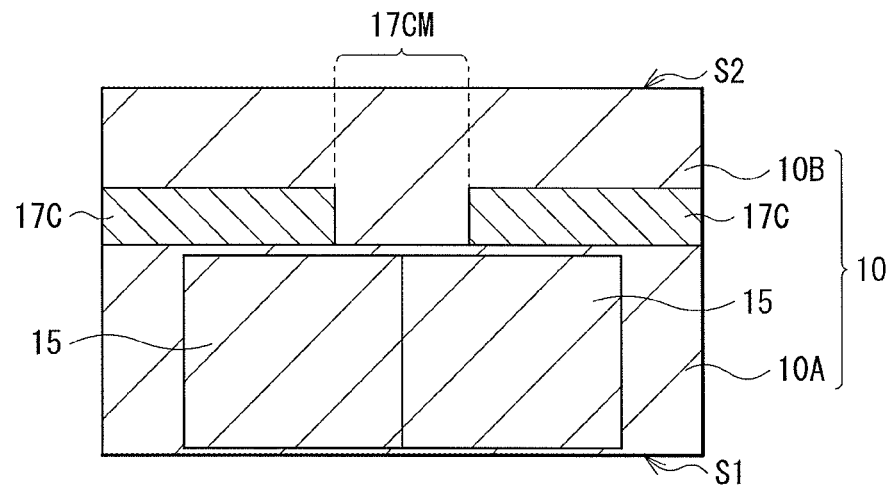
FIG. 19B is a schematic cross-sectional view of a process following FIG. 19A.
Figure 19C:
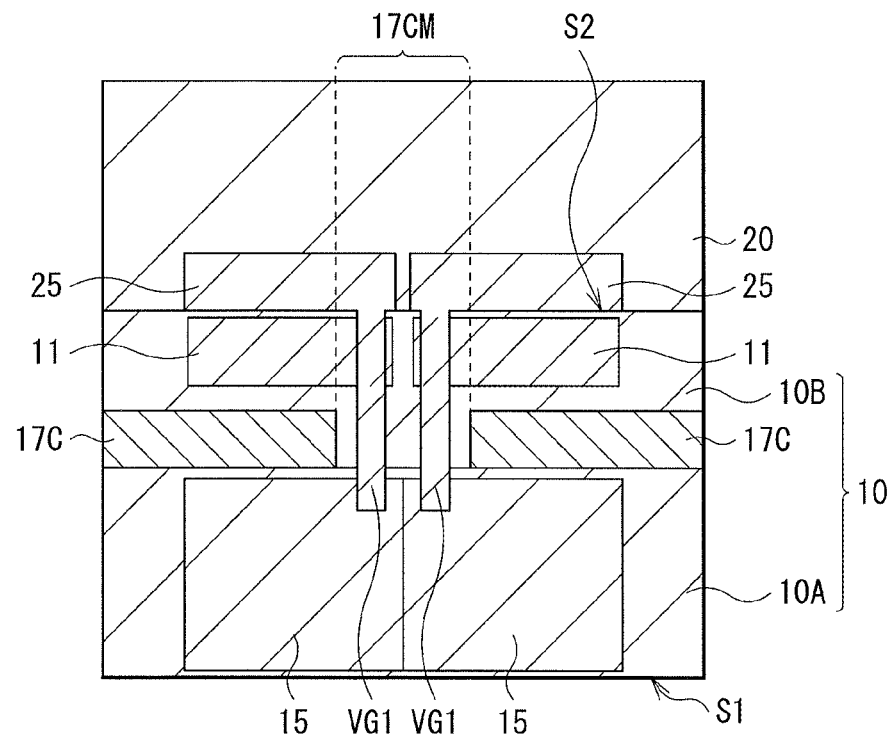
FIG. 19C is a schematic cross-sectional view of a process following FIG. 19B.

After the opening 17CM is formed in the sacrificial layer 17C, the second semiconductor layer 10B is formed on the first semiconductor layer 10A with the sacrificial layer 17C interposed therebetween, as illustrated in FIG. 19B. Thus, the semiconductor substrate 10 is formed. Next, for example, the charge accumulation section 11 is formed in the second semiconductor layer 10B. The overflow drain 13 and the charge-voltage converter 14 are formed in the semiconductor substrate 10 together with the charge accumulation section 11. Subsequently, the first transfer transistor 25, the discharging transistor 26, and the second transfer transistor 21, and the reset transistor 22, and the amplification transistor 23, and the select transistor 24 are formed. At this occasion, the gate electrode VG1 of the first transfer transistor 25 and a gate electrode VGVG2 of the discharging transistor 26 pass through the opening 17CM of the sacrificial layer 17C. Thereafter, the wiring layer 20 is formed on the buck surface S2 of the semiconductor substrate 10 (FIG. 19C).

Figure 20A:
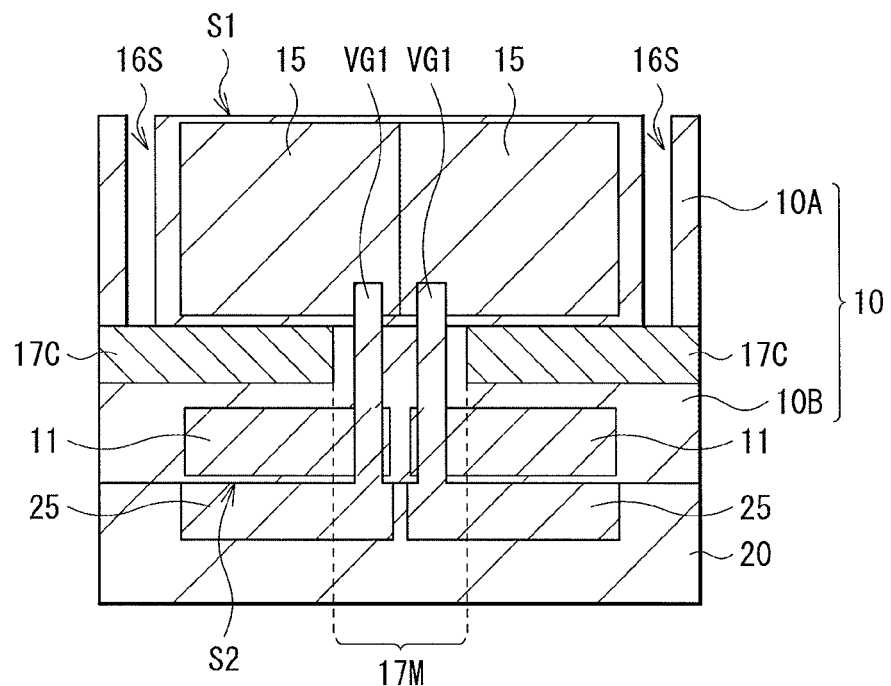
FIG. 20A is a schematic cross-sectional view of a process following FIG. 19C.
Figure 20B:
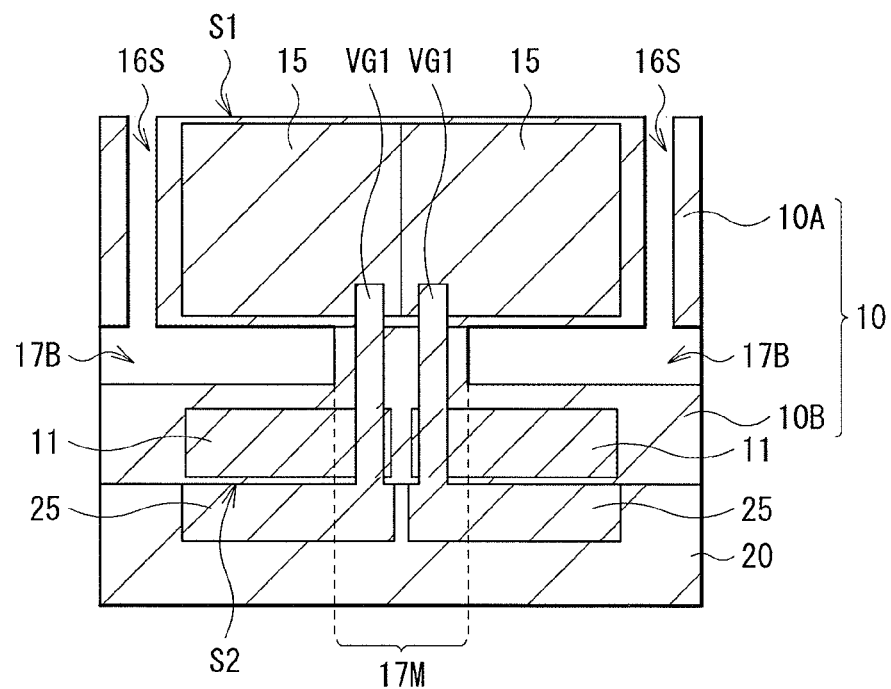
FIG. 20B is a schematic cross-sectional view of a process following FIG. 20A.

Next, as illustrated in FIG. 20A, the semiconductor substrate 10 is flipped from top to bottom, and the slit 16S reaching the sacrificial layer 17C from the front surface S1 of the semiconductor substrate 10 is formed around the photoelectric converter 15. Subsequently, the sacrificial layer 17C is removed through the slit 16S, as illustrated in FIG. 20B. Thus, the cavity 17B communicated with the slit 16S is formed. The sacrificial layer 17C is removed by, for example, an etching process such as wet etching or dry etching. Even in the present modification example, even after formation of such a cavity 17B, the gate electrodes VG1 are adjacently provided in the adjacent pixels P in a manner similar to that described in the foregoing first embodiment, which allows the photoelectric converter 15 to be supported by a wider region.

After the cavity 17B is formed, the slit 16S and the cavity 17B are filled with the light-blocking material. Thus, the first light-blocking film 16 and the second light-blocking film 17 are respectively formed in the slit 16S and the cavity 17B. Lastly, the color filter CF and the on-chip lens are formed on the front surface S1 of the semiconductor substrate 10, thereby completing the solid-state imaging device 1D.

As described above, it is possible to form the second light-blocking film 17 through forming the sacrificial layer 17C in place of the oxidation layer 17A (FIG. 10C). The solid-state imaging device 1D may be formed with use of the oxidation layer 17A, as described in the foregoing first embodiment.

Modification Example 5

Figure 21:
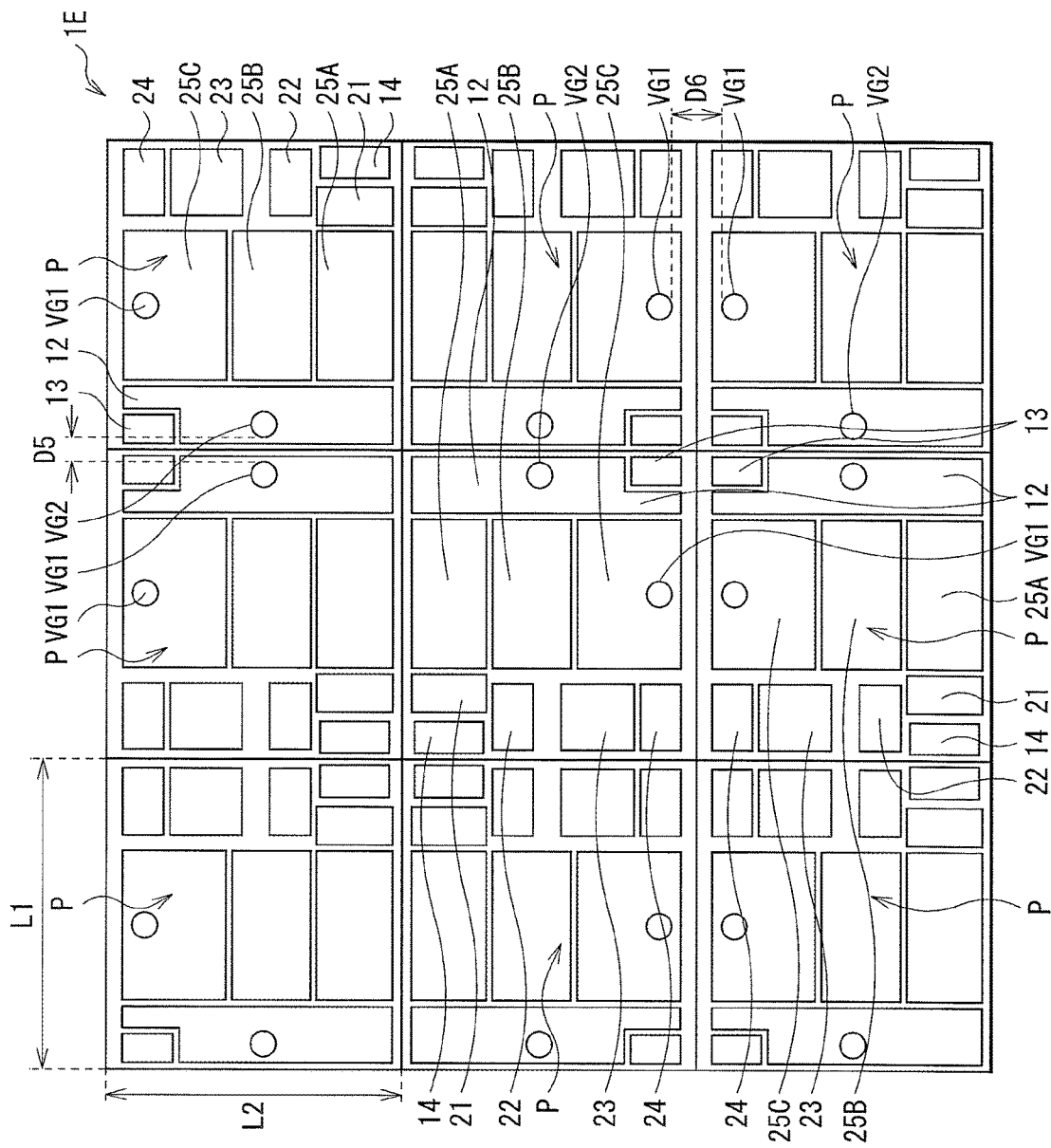
FIG. 21 is a plan view of a schematic configuration of a solid-state imaging device according to a modification example 5.

FIG. 21 illustrates a schematic planar configuration of a solid-state imaging device (a solid-state imaging device 1E) according to a modification example 5 of the foregoing first embodiment. In the solid-state imaging device 1E, the first transfer transistor 25 includes a plurality of gate electrodes (gate electrodes 25A, 25B, and 25C). The solid-state imaging device 1E has a configuration and effects similar to those of the solid-state imaging device 1 except lot this point.

The first transfer transistor 25 includes, for example, three gate electrodes (the gate electrodes 25A, 25B, and 25C). The gate electrodes of the first transfer transistor 25 are separately provided in such a manner, which makes it possible to secure charge transfer capability without sacrificing an amount of held charges (for example, refer to Japanese Unexamined Patent Application Publication No. 2015-23250). For example, the gate electrode VG1 that is a vertical electrode is provided in the gate electrode 25C of the plurality of gate electrodes.

In the solid-state imaging device 1E, in plan view, for example, two horizontally adjacent pixels P are line-symmetrically disposed, and two vertically adjacent pixels P are also line-symmetrically disposed. The tree gate electrodes 25A, 25B, and 25C are provided side by side along the vertical direction, for example. The gate electrode 25A, the gate electrode 25B, and the gate electrode 25C are disposed in this order from a position close to a symmetry axis of the two vertically adjacent pixels P. The gate electrode VG2 of the discharging transistor 26 is provided in an end in the horizontal direction. The gate electrode VG2 is disposed at a position close to a symmetry axis of the two horizontally adjacent pixels P. For example, in the horizontally adjacent pixels P, the gate electrodes VG2 are adjacently disposed with a distance D5 therebetween, and in the vertically adjacent pixels P, the gate electrodes VG1 are adjacently disposed with a distance D6 therebetween. The distances D5 and D6 are a half or less of the lengths L1 and L2 of the sides of the pixel P. In the two horizontally adjacent pixels P, the gate electrodes VG1 of the first transfer transistors 25 may be adjacently disposed, and in the two vertically adjacent pixels P, the gate electrodes VG2 of the discharging transistors 26 may be adjacently disposed. Alternatively, in the two horizontally adjacent pixels P, the gate electrode VG1 and the gate electrode VG2 may be adjacently disposed, and also in the two vertically adjacent pixels P, the gate electrode VG1 and the gate electrode VG2 may be adjacently disposed. In the solid-state imaging device 1E, disposing the gate electrodes VG1 and VG2 in an edge portion of each of the pixels P makes it easy to adjacently dispose the gate electrodes VG1 in the adjacent pixels P.

As described in the present modification example, even in a case where the first transfer transistor 25 includes the plurality of gate electrodes 25A, 25B, and 25C, it is possible to adjacently dispose the gate electrode VG1 and the gate electrode VG2 in the adjacent pixels P. This makes it possible to support the photoelectric converter 15 by a wide region, as with the foregoing first embodiment.

Modification Example 6

Figure 22A:
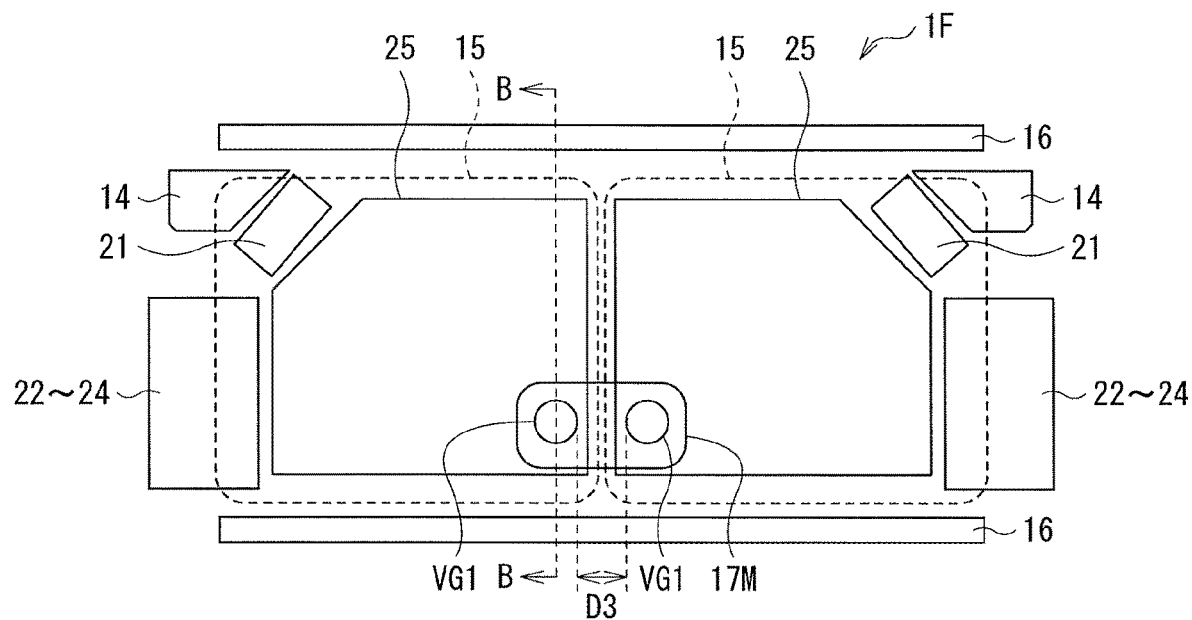
FIG. 22A is a schematic enlarged plan view of a portion of a solid-state imaging device according to a modification example 6.
Figure 22B:
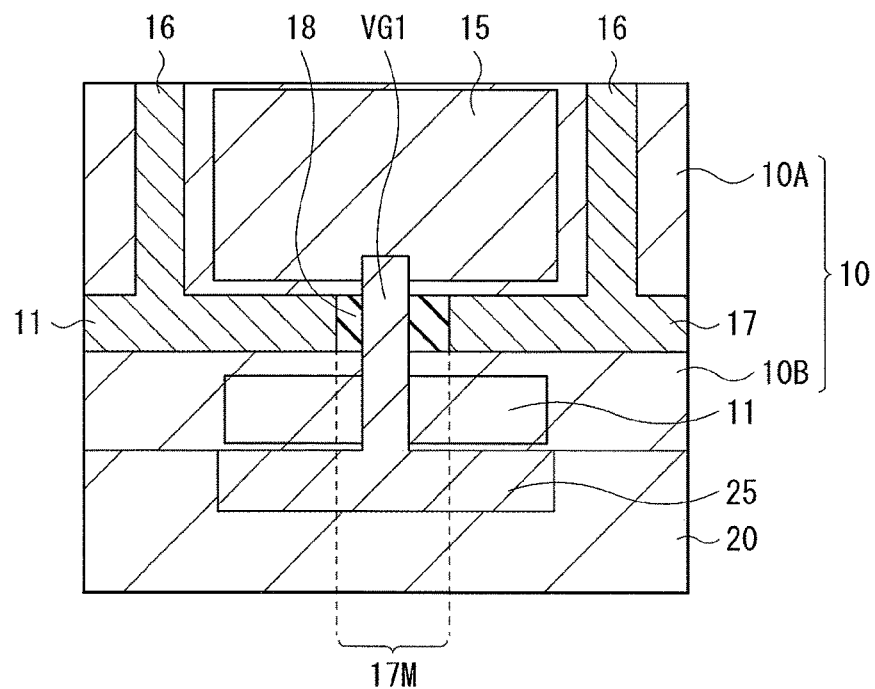
FIG. 22B is a schematic view of a cross-sectional configuration taken along a line B-B illustrated in FIG. 22A.

FIGS. 22A and 22B illustrate a schematic configuration of a solid-state imaging device (a solid-state imaging device 1F) according to a modification example 6 of the foregoing first embodiment. FIG. 22A illustrates schematic planar configurations of two pixels P of the solid-state imaging device 1F, and FIG. 22B illustrates a cross-sectional configuration taken along a line B-B illustrated in FIG. 22A. In the solid-state imaging device 1F, an embedded material (an embedded material 18) is provided in the opening 17M of the second light-blocking film 17, and the embedded material 18 is interposed between the gate electrode VG1 and the second light-blocking film 17. The solid-state imaging device 1F has a configuration and effects similar to those of the solid-state imaging device 1 except for this point.

The embedded material 18 has a refractive index different from a refractive index of a constituent material of the semiconductor substrate 10. The embedded material 18 may have a refractive index higher than the refractive index of live constituent material of the semiconductor substrate 10, or may have a refractive index lower than the refractive index of the constituent material of the semiconductor substrate 10. In a case where the semiconductor substrate 10 includes, for example, silicon (Si), it is possible to use, for example, silicon doped with an impurity, silicon having density different from density of another portion, etc. for the embedded material 18. A region having a refractive index different from the refractive index of the semiconductor substrate 10 is formed between the photoelectric converter 15 and the charge accumulation section 11 through providing such an embedded material 18. This makes it easy to reflect light incident from adjacent pixels P.

In the present modification example, the gate electrodes VG1 are adjacently provided in the adjacent pixels P in a manner similar to that described in the foregoing modification example 3, which makes it possible to support the photoelectric converter 15 by a wider region. Moreover, the embedded material 18 is provided in the opening 17M of the second light-blocking film 17, which makes it easy to reflect light incident from the adjacent pixels P, thereby making it possible to suppress PLS more effectively.

Modification Example 7

Figure 23:
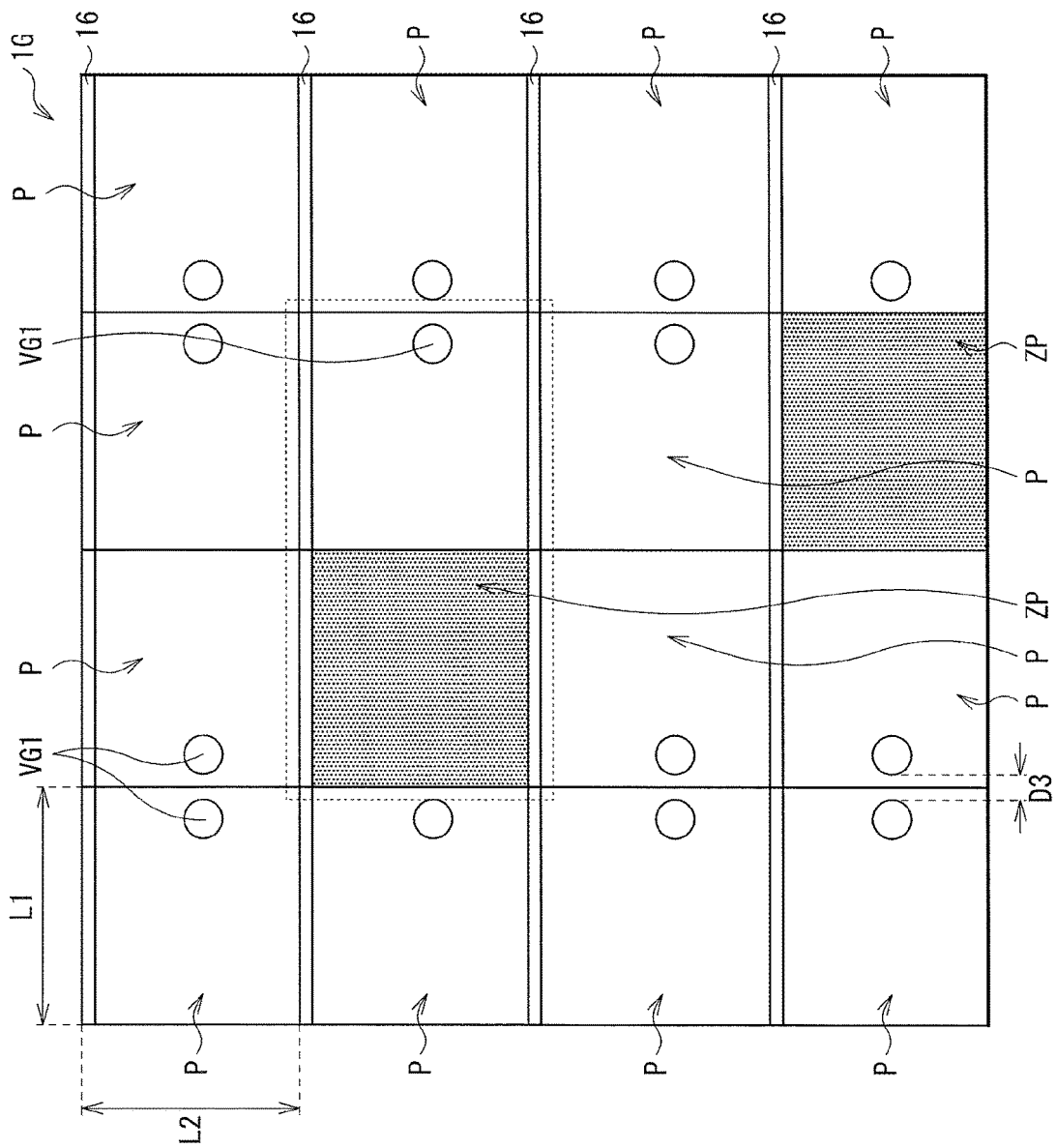
FIG. 23 is a plan view of a schematic configuration of a solid-state imaging device according to a modification example 7.

FIG. 23 illustrates a schematic planar configuration of a solid-state imaging device (a solid-state imaging device 1G) according to a modification example 7 of the foregoing first embodiment. In the solid-state imaging device 1G, an image plane phase detection pixel (an image plane phase detection pixel ZP) is provided. In other words, the solid-state imaging device 1G is an image plane phase detection autofocus system imaging device. The solid-state imaging device 1G has a configuration and effects similar to those of the solid-state imaging device 1 except for this point.

Figure 24A:
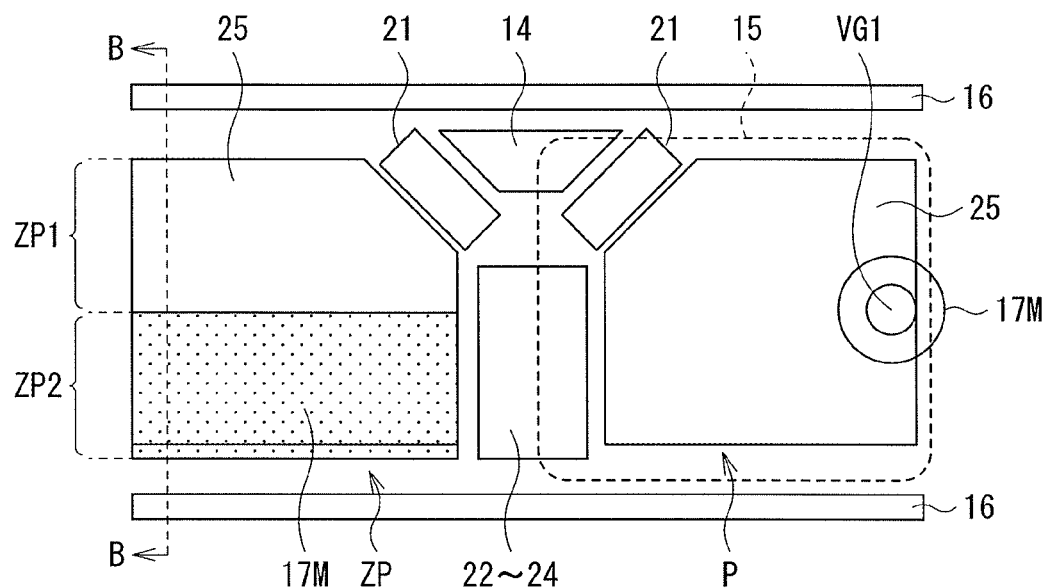
FIG. 24A is a schematic enlarged plan view of a portion of the solid-state imaging device illustrated in FIG. 23.
Figure 24B:
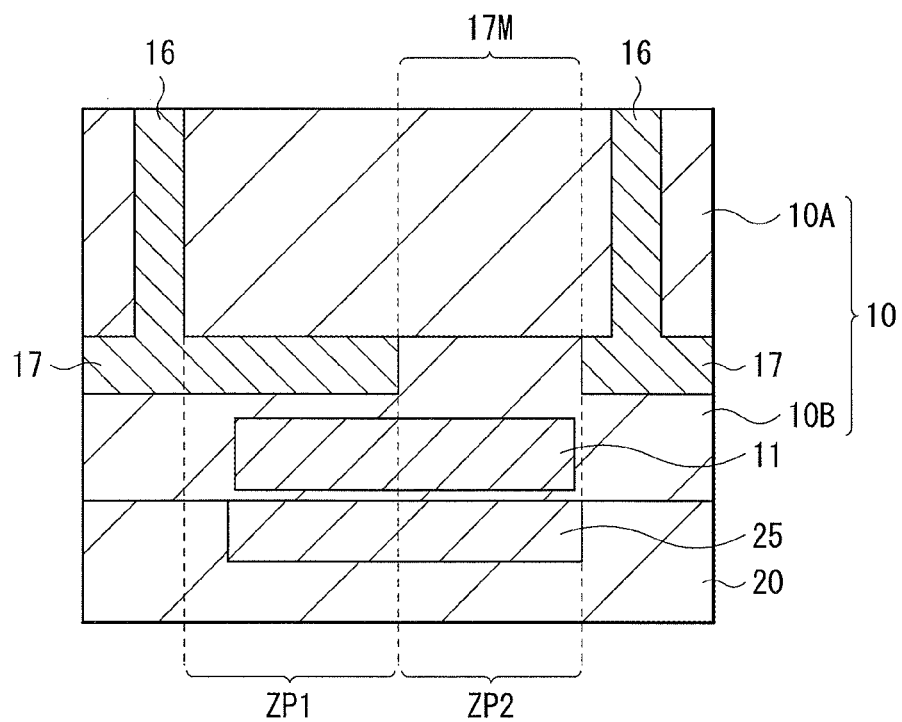
FIG. 24B is a schematic view of a cross-sectional configuration taken along a line B-B illustrated in FIG. 24A.

FIG. 24A illustrates an enlarged portion (a portion 1GP) of the solid-state imaging device 1G illustrated in FIG. 23, and FIG. 24B illustrates a cross-sectional configuration taken along a line B-B in FIG. 24A. The image plane phase detection pixel ZP has a light-blocking region ZP1 and a non-light-blocking region ZP2. The light-blocking region ZP1 is provided with the second light-blocking film 17, and the non-light-blocking region ZP2 is provided with the opening 17M of the second light-blocking film 17. In other words, the light-blocking region ZP1 is formed by the second light-blocking film 17 provided in the semiconductor substrate 10.

In the image plane phase detection pixel ZP, a photoelectric converter is not provided. In the image plane phase detection pixel ZP, for example, a waveguide may be provided in the first semiconductor layer 10A. Alternatively, an inner lens (INL) may be provided between the first semiconductor layer 10A and the on-chip lens or a microlens. Providing the inner lens makes it possible to improve light-condensing characteristics.

In the present modification example, the gate electrodes VG1 are adjacently provided in the adjacent pixels P1 in a manner similar to that described in the foregoing modification example 3, which makes it possible to support the photoelectric converter 15 by a wider region. Moreover, the light-blocking region ZP1 of the image plane phase detection pixel ZP is formed by the second light-blocking film 17 in the semiconductor substrate 10, which makes it possible to prevent color mixture resulting from movement of a charge from the image plane phase detection pixel ZP to adjacent pixels P and a reduction in oblique incidence sensitivity resulting from a height of the on-chip lens or the like. This is described below.

For example, in a front side illumination type solid-state imaging device, the light-blocking film is provided above the photoelectric converter to form a light-blocking region in the image plane phase detection pixel. Hence, a charge easily moves from the image plane phase detection pixel to an adjacent normal pixel, which causes a possibility that color mixture resulting from this occurs. In contrast, even in a back side illumination type solid-state imaging device, in a case where the light-blocking film is provided above the semiconductor substrate, a light-condensing point is adjusted to a position of the light-blocking film; therefore, it is necessary to increase (heighten) the height of the on-chip leans or the like. This easily causes a reduction in oblique incidence sensitivity.

In contrast, in the solid-state imaging device 1G, the light-blocking region ZP1 is formed by the second light-blocking film 17 in the semiconductor substrate 10, which makes it possible to reduce the height of the on-chip lens or the like. Accordingly, it is possible to prevent a reduction in oblique incidence sensitivity. Moreover, the second light-blocking film 17 is provided on side closer to the back surface S2 than the photoelectric converter 15; therefore, movement of the charge from the image plane phase detection pixel ZP to adjacent pixels P is also suppressed. The image plane phase detection pixel ZP is formed with use of the second light-blocking film 17 in such a manner, which makes it possible to suppress occurrence of color mixture and a reduction in oblique incidence sensitivity.

Second Embodiments

[Configuration of Solid-State Imaging Device 2]

Figure 25A:
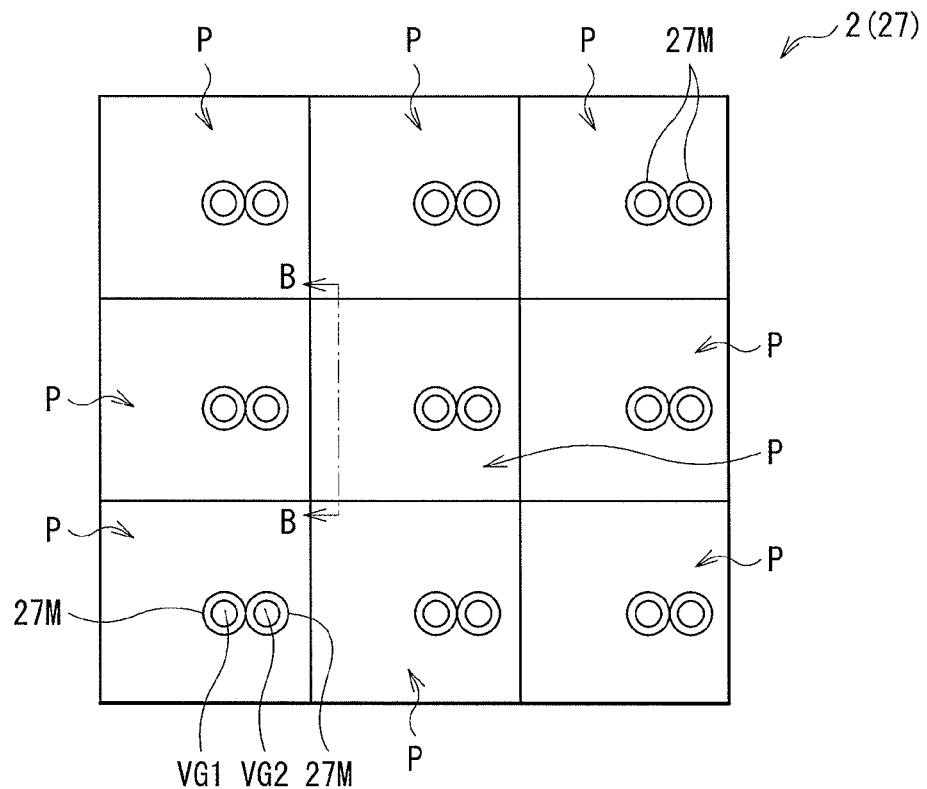
FIG. 25A is a schematic plan view of a planar configuration of a second light-blocking film of a solid-state imaging device according to a second embodiment of the present technology together with gate electrodes.
Figure 25B:
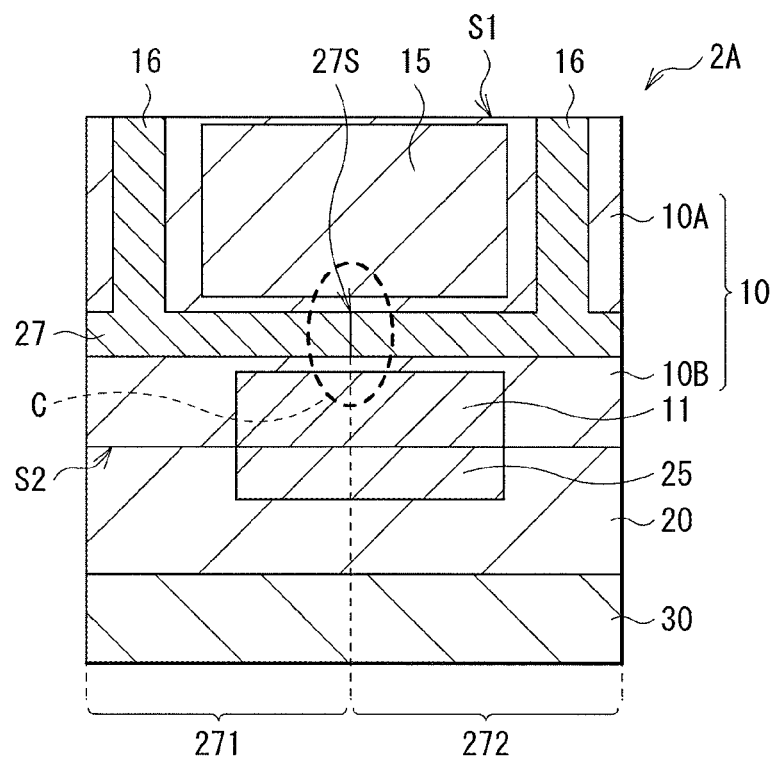
FIG. 25B is a schematic view of a cross-sectional configuration of the second light-blocking film taken along a line B-B illustrated in FIG. 25A together with other respective components.

FIGS. 25A and 25B illustrate a schematic configuration of a solid-state imaging device (a solid-state imaging device 2) according to a second embodiment of the present technology. FIG. 25A illustrates a schematic planar configuration of a second light-blocking film (a second light-blocking film 27) of the solid-state imaging device 2 together with the gate electrodes VG1 and VG2. FIG. 25B illustrates a cross-sectional configuration of the second light-blocking film 27 taken along a line B-B illustrated in FIG. 25A together with the charge accumulation section 11, the photoelectric converter 15, etc. The second light-blocking film 27 of the solid-state imaging device 2 has a first portion 271 and a second portion 272, and a level difference (a level difference 27S) is generated between the first portion 271 and the second portion 272. The solid-state imaging device 2 has a configuration and effects similar to those of the solid-state imaging device 1 except for this point.

Figure 26:
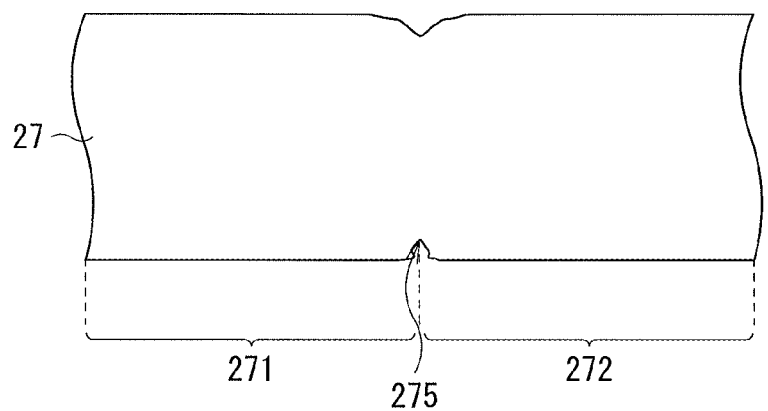
FIG. 26 is a schematic enlarged cross-sectional view of a level difference portion of the second light-blocking film illustrated in FIG. 25B.

FIG. 26 is an enlarged view of a portion C in FIG. 25B. The level difference 27S between the first portion 271 and the second portion 272 is a coupling portion generated through forming the first portion 271 and the second portion 272 in a stepwise manner (as will be described later). In such a level difference 27S, for example, a thickness of the second light-blocking film 27 is smaller than a thickness of the first portion 271 and a thickness of a second portion 272. As will be described in detail later, in the solid-state imaging device 2 according to the second embodiment, the second light-blocking film 27 is formed in a stepwise manner; therefore, a region supporting the photoelectric converter 15 is further widened before formation of the second light-blocking film 27. The second light-blocking film 27 may have three or more portions including the first portion 271 and the second portion 272, and a plurality of level differences 27S may be provided.

In the pixel P, for example, the gate electrode VG1 and the gate electrode VG2 are preferably disposed adjacently with, for example, the distance D therebetween (FIG. 2). The gate electrode VG1 and the gate electrode VG2 are adjacently provided in such a manner, which makes it possible to support the photoelectric converter 15 by a wider region even before formation of the second light-blocking film 27, as with the solid-state imaging device 1 according to the foregoing first embodiment. The gate electrodes VG1 and VG2 may be adjacent to each other in the adjacent pixels P, as illustrated in FIGS. 14 and 17.

[Method of Manufacturing Solid-State Imaging Device 2]

It is possible to manufacture the solid-state imaging device 2 as follows, for example (FIGS. 27A to 30B).

First, formation of components is performed up to formation of the wiring layer 20 in a manner similar to that described in the foregoing first embodiment. An oxidation layer 27A for formation of the second light-blocking film 27 is formed on side closer to the back surface S2 than the photoelectric converter 15 in the semiconductor substrate 10. After formation of the wiring layer 20, the supporting substrate 30 is bonded to the back surface S2 of the semiconductor substrate 10 with the wiring layer 20 interposed therebetween.

Figure 27A:
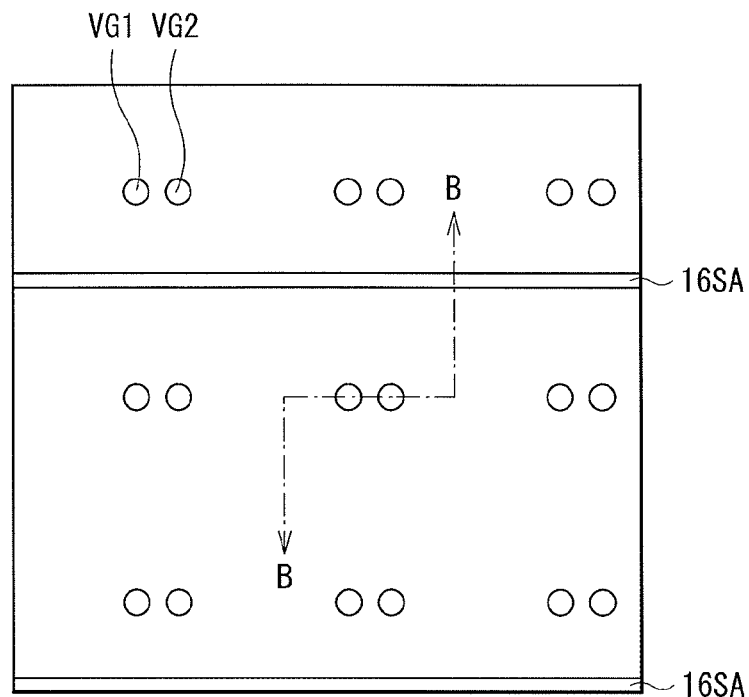
FIG. 27A is a schematic plan view of a process of a method of manufacturing the solid-state imaging device illustrated in FIG. 25A.
Figure 27B:
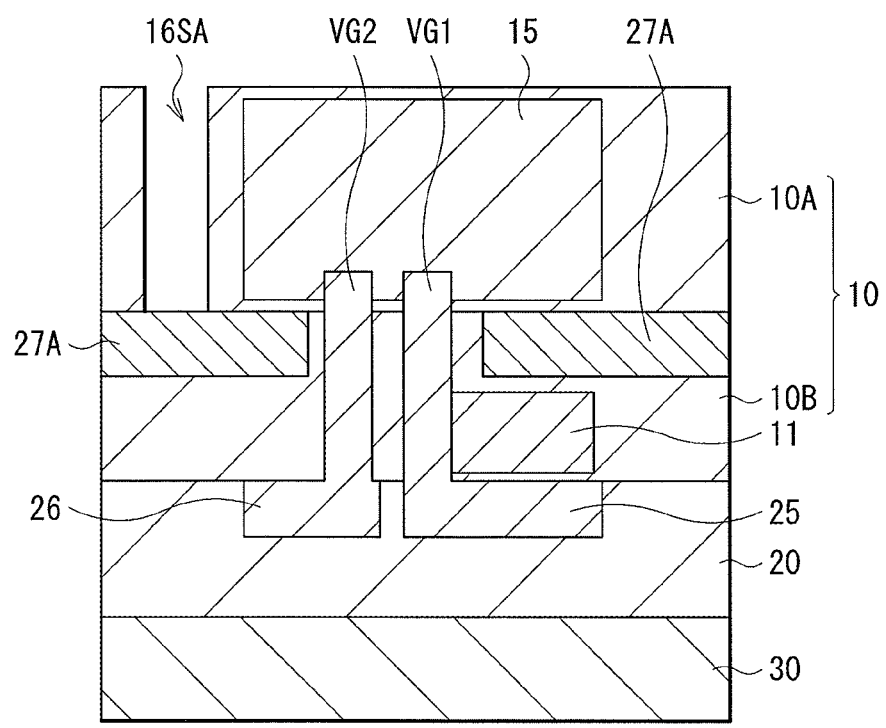
FIG. 27B is a schematic view of a cross-sectional configuration taken along a line B-B illustrated in FIG. 27A.

Next, a first slit 16SA reaching the oxidation layer 27A from the front surface S1 of the semiconductor substrate 10 is formed as illustrated in FIGS. 27A and 27B. The first slit 16SA is formed in a partial region of a region where the first light-blocking film 16 is to be formed. For example, in a case where the first light-blocking film 16 is formed in all spaces between pixels P adjacent to each other in the vertical (column) direction, the first slit 16SA is formed in each of a space between an nth pixel row and an n+1th pixel row, a space between an n+2th pixel row and an n+3th pixel row, and so on (where n is an integer), that is, in every other space. FIG. 27A illustrates a planar configuration of the first slit 16SA, and FIG. 27B illustrates a cross-sectional configuration taken along a line B-B in FIG. 27A.

Figure 28A:
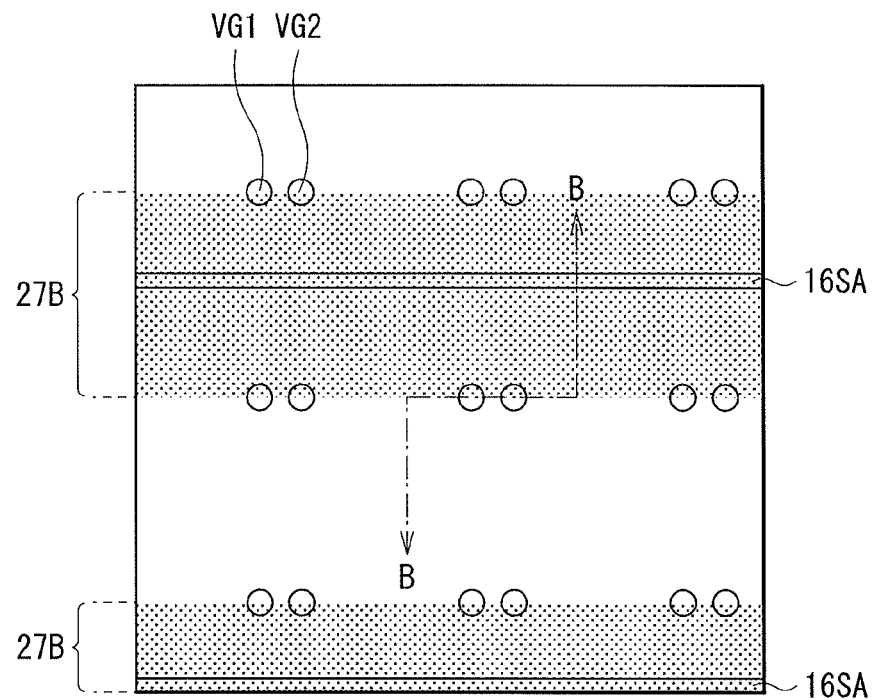
Figure 28B:
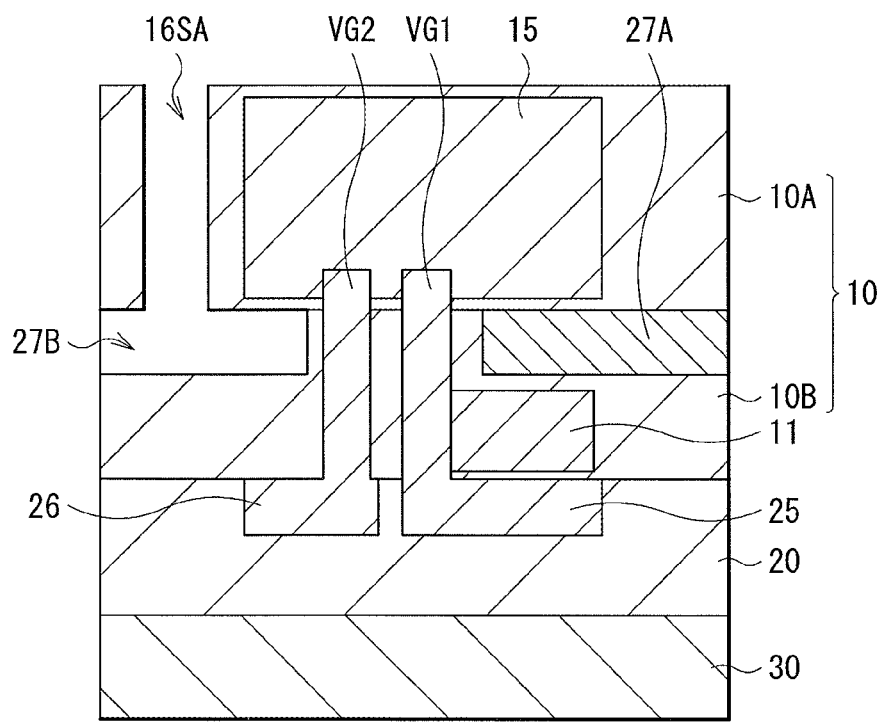

After the first slit 16SA is formed, as illustrated in FIGS. 28A and 28B, a portion of the oxidation layer 27A is removed through the first slit 16SA. Thus, a cavity 27B (a first cavity) communicated with the first slit 16SA is formed in proximity to the first slit 16SA. FIG. 28A illustrates a planar configuration of the cavity 27B, and FIG. 28B illustrates a cross-sectional configuration taken along a line B-B in FIG. 28A. The oxidation layer 27A is removed by, for example, an etching process such as wet etching or dry etching, and a size of the cavity 27B is adjustable through controlling time of the etching. In the present embodiment, even after formation of such a cavity 27B, a portion of the oxidation layer 27A remains without being removed; therefore, the photoelectric converter 15 is supported also by a region in proximity to the oxidation layer 27A in addition to a region in proximity to the gate electrodes VG1 and VG2. In other words, as compared with a case where the oxidation layer 17A is removed at a time (FIG. 11C) to form the second light-blocking film 17, the photoelectric converter 15 is supported by a wider region. This makes it possible to maintain mechanical strength more effectively.

Figure 29:
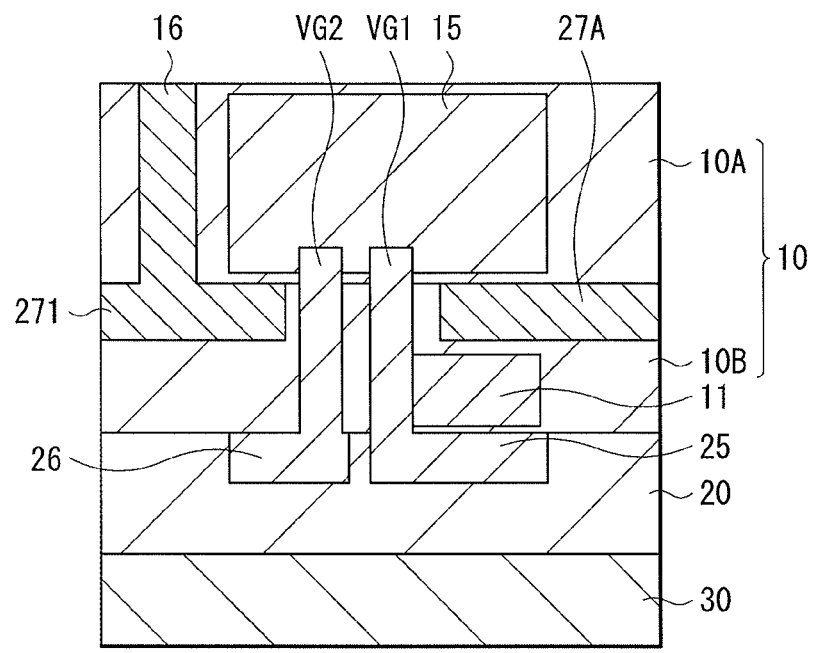
FIG. 29 is a schematic cross-sectional view of a process following FIG. 28B.

After the cavity 27B is formed, the first slit 16SA and the cavity 27B are filled with the light-blocking material, as illustrated in FIG. 29. Thus, the first light-blocking film 16 and the first portion 271 of the second light-blocking film 27 are respectively formed in the first slit 16SA and the cavity 27B.

Figure 30A:
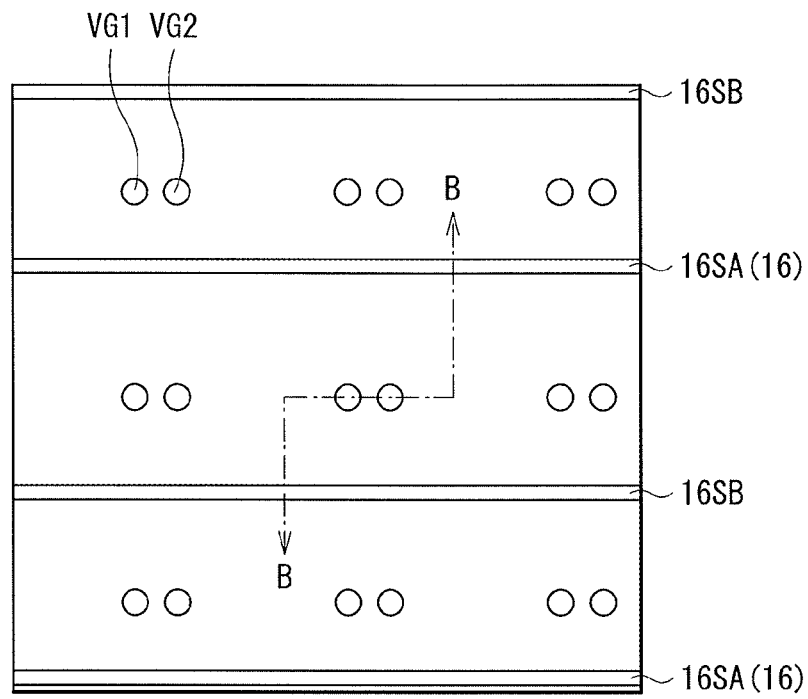
FIG. 30A is a schematic plan view of a process following FIG. 29.
Figure 30B:
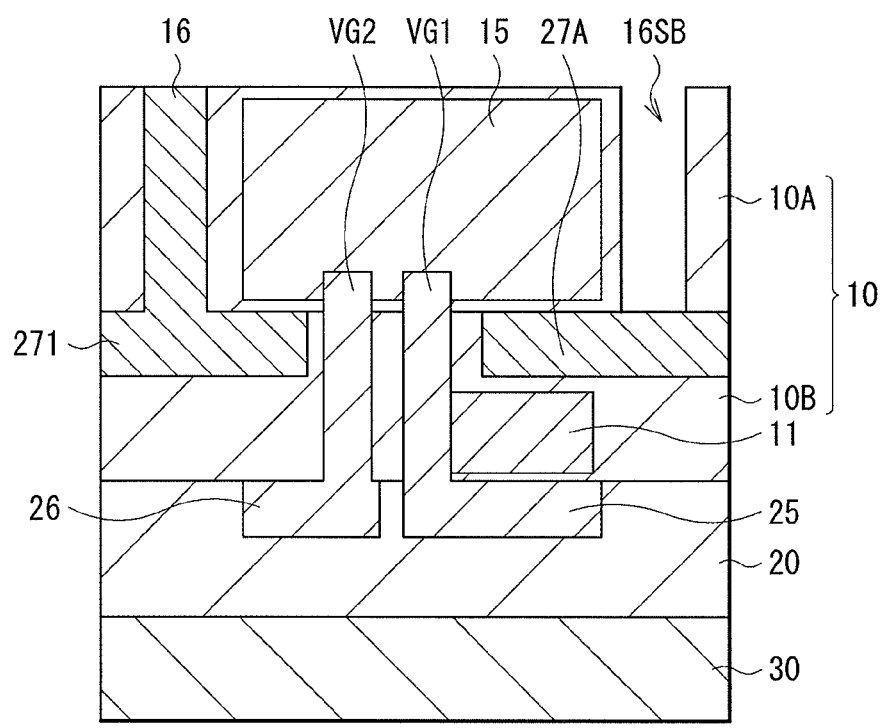
FIG. 30B is a schematic view of a cross-sectional configuration taken along a line B-B illustrated in FIG. 30A.

Subsequently, a second slit 16SB is formed in an entire remaining region where the first slit 16SA is not formed of the region where the first light-blocking film 16 is to be formed, as illustrated in FIGS. 30A and 30B. The second slit 16SB reaches the oxidation layer 27A from the front surface S1 of the semiconductor substrate 10. FIG. 30A illustrates a planar configuration of the second slit 16SB, and FIG. 30B illustrates a cross-sectional configuration taken along a line B-B in FIG. 30A.

Figure 31A:
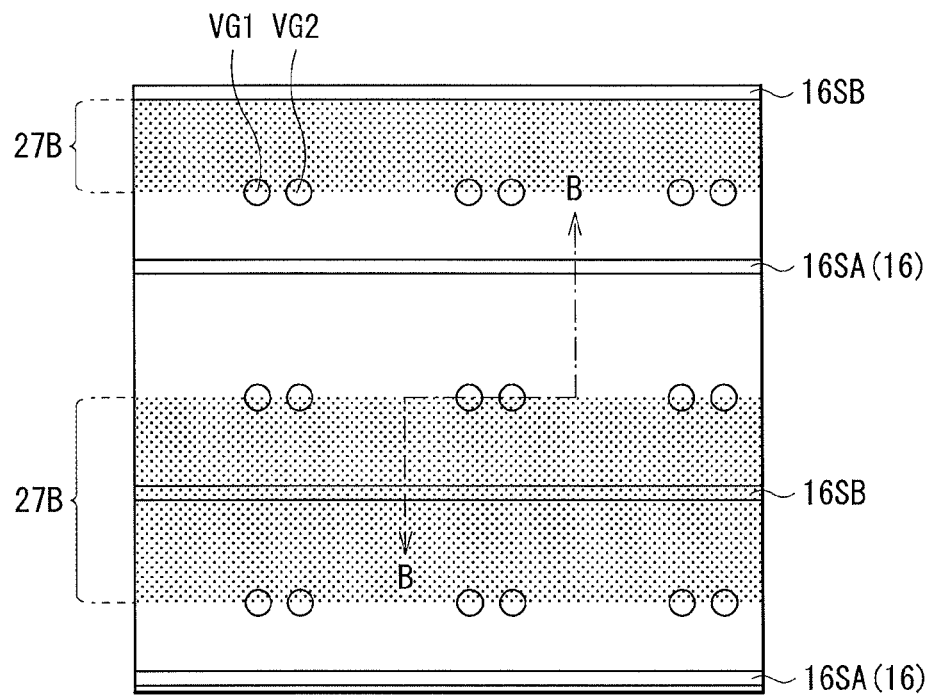
FIG. 31A is a schematic plan view of a process following FIG. 30A.
Figure 31B:
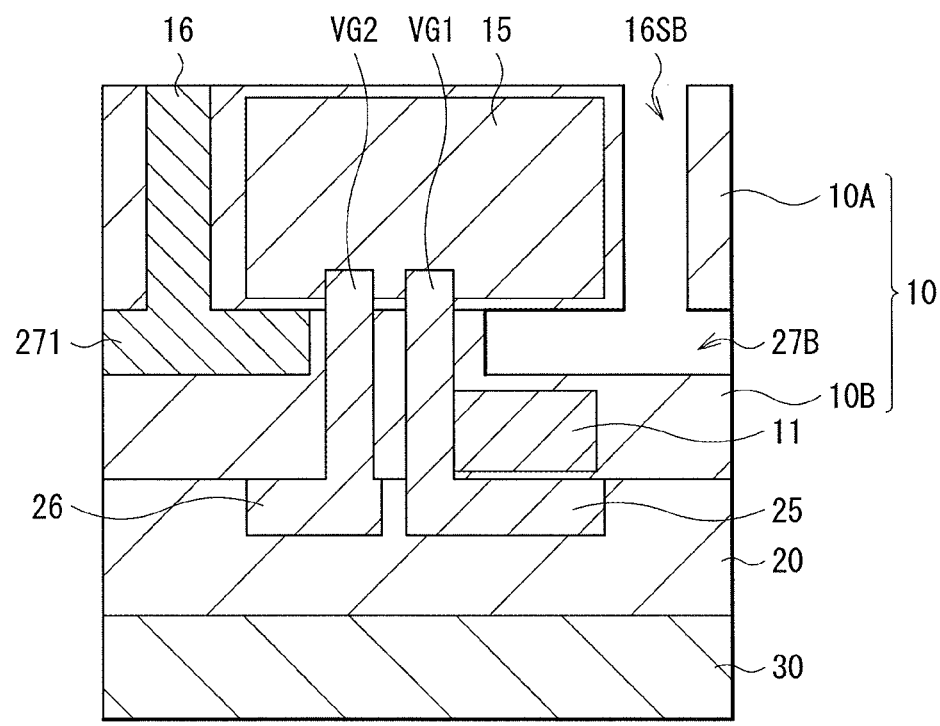
FIG. 31B is a schematic view of a cross-sectional configuration taken along a line B-B illustrated in FIG. 31A.

After the second slit 16SB is formed, the remaining oxidation layer 27A is removed through the second slit 16SB, as illustrated in FIGS. 31A and 31B. Thus, the cavity 27B (a second cavity) communicated with the second slit 16SB is formed in proximity to the second slit 16SB. FIG. 31A illustrates a planar configuration of the cavity 27B, and FIG. 31B illustrates a cross-sectional configuration taken along a line B-B in FIG. 31A. In the present embodiment, even after formation of such a cavity 27B, the first portion 271 of the second light-blocking film 27 has been already formed; therefore, the photoelectric converter 15 is supported also by a region in proximity to the first portion 271 in addition to the region in proximity to the gate electrodes VG1 and VG2. In other words, as compared with a case where the oxidation layer 17A is removed at a time to form the second light-blocking film 17 (FIG. 11C), the photoelectric converter 15 is supported by a wider region. This makes it possible to maintain mechanical strength more effectively.

After the cavity 27B is formed, the second slit 16SB and the cavity 27B are filled with the light-blocking material. Thus, the first light-blocking film 16 and the second portion 272 of the second light-blocking film 27 are respectively formed in the second slit 16SB and the cavity 27B. The second portion 272 of the second light-blocking film 27 is provided continuously with the first portion 271, and the level difference 27S (FIG. 26) is generated between the first portion 271 and the second portion 272.

After the first light-blocking film 16 and the second light-blocking film 27 are formed, the color filler CF and the on-chip lens are formed on the front surface S1 of the semiconductor substrate 10, thereby completing the solid-state imaging device 2.

[Workings and Effects of Solid-State Imaging Device 2]

As described above, in the solid-state imaging device 2 according to the present embodiment, the first portion 271 and the second portion 272 of the second light-blocking film 27 are formed in a stepwise manner, which makes it possible to support the photoelectric converter 15 by a wider region.

For example, in a case where the second light-blocking film 27 is formed at a time, an entire region where the second light-blocking film 27 is to be formed becomes the cavity 27B; therefore, in this process, the photoelectric converter 15 is supported only by the region in proximity to the gate electrodes VG1 and VG2 (refer to FIG. 11C).

In contrast, in the solid-state imaging device 2, the first portion 271 and the second portion 272 are separately formed in a stepwise manner to form the second light-blocking film 27. Accordingly, the photoelectric converter is supported by together with the region proximity to the gate electrodes VG1 and VG2, a portion of the oxidation layer 27A (a portion where the second portion 272 is to be formed) in a case where the first portion 271 is formed and the first portion 271 in a case where the second portion 272 is formed. In other words, even before formation of the second light-blocking film 27, the photoelectric converter 15 is supported by a wider region.

As described above, in the solid-state imaging device 2, it is possible to maintain mechanical strength by stepwise formation of the second light-blocking film 27 while suppressing PLS by the second light-blocking film 27 formed over a wide region. In addition, providing two gate electrodes VG1 and VG2 adjacently in the pixel P makes it possible to further widen a region supporting the photoelectric converter 15.

Modification Example 8

In the solid-state imaging device 2 described in the foregoing second embodiment, the first light-blocking film 16A (FIG. 13) may be further formed around the charge accumulation section 11 (a modification example 8).

For example, it is possible to manufacture the solid-state imaging device 2 including the first light-blocking film 16A by the following method (FIGS. 32A to 34C).

Figure 32A:
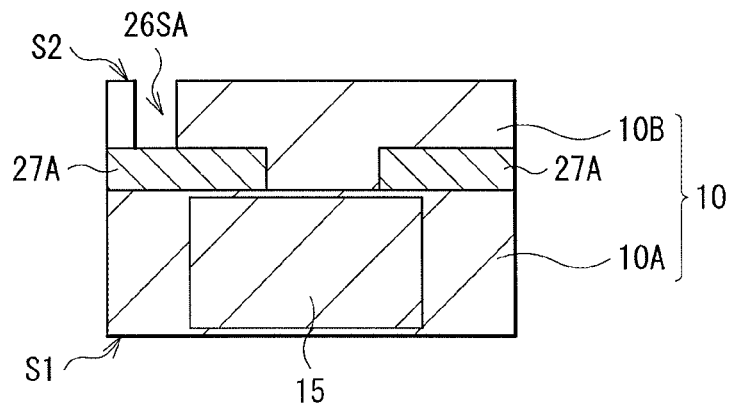
FIG. 32A is a schematic cross-sectional view of a process of a method of manufacturing a solid-state imaging device according to a modification example 8.

First, in a manner similar to that described in the foregoing second embodiment, the photoelectric converter 15 and the oxidation layer 27A are formed in this order in the semiconductor layer substrate 10. Next, a first slit 26SA reaching the oxidation layer 27A from the back surface S2 of the semiconductor substrate 10 is formed, as illustrated in FIG. 32A. The first slit 26SA is formed in a partial region of a region where the first light-blocking film 16A is to be formed. For example, in a case where the first light-blocking film 16A is formed in all spaces between the pixels P adjacent to each other in the vertical (column) direction, the first slit 26SA is formed in each of a space between the nth pixel row and the n+1th pixel row, a space between the n+2th pixel row and the n+3th pixel row, and so on (where n is an integer), that is, in every other space.

Figure 32B:
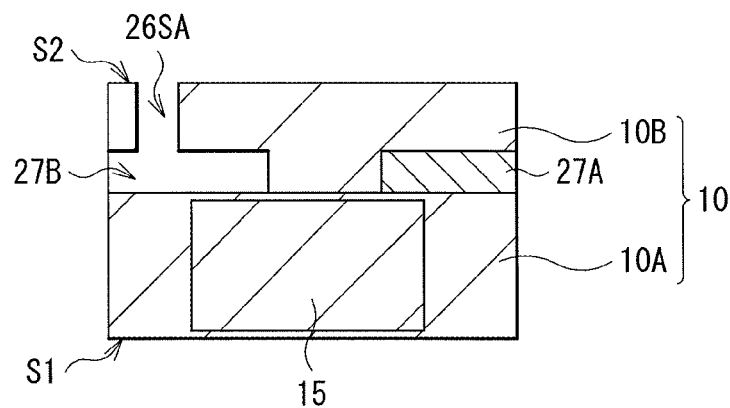
FIG. 32B is a schematic cross-sectional view of a process following FIG. 32A.

After the first slit 26SA is formed, a portion of the oxidation layer 27A is removed through the first slit 26SA, as illustrated in FIG. 32B. Thus, the cavity 27B communicated with the first slit 26SA is formed in proximity to the first slit 26SA.

Figure 32C:
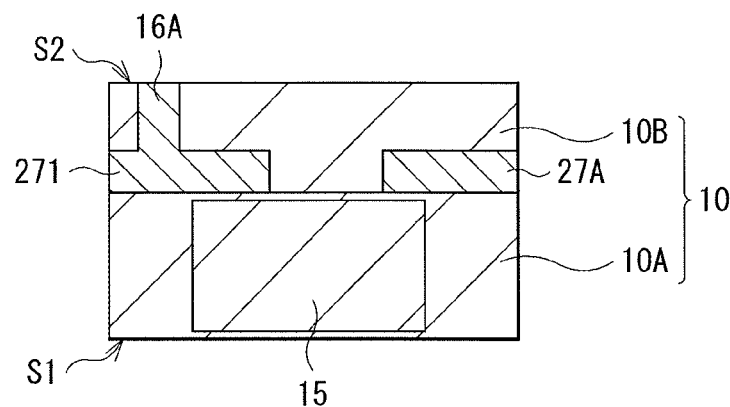
FIG. 32C is a schematic cross-sectional view of a process following FIG. 32B.

After the cavity 27B is formed, the first slit 26SA and the cavity 27B are filled with the light-blocking material, as illustrated in FIG. 32C. Thus, the first light-blocking film 16A and the first portion 271 of the second light-blocking film 27 are respectively formed in the first slit 26SA and the cavity 27B.

Figure 33A:
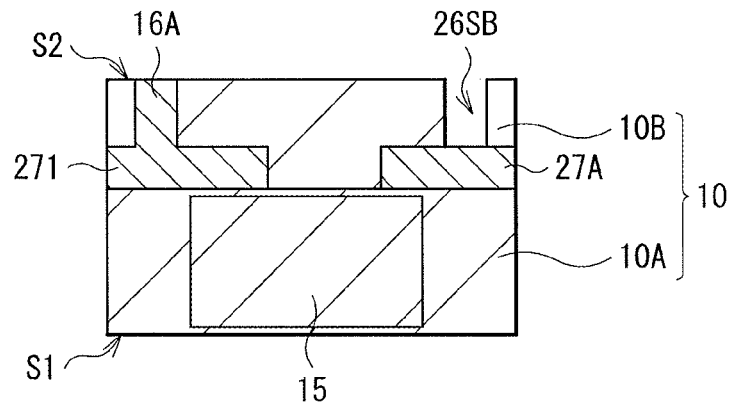
FIG. 33A is a schematic cross-sectional view of a process following FIG. 32C.

Next, as illustrated in FIG. 33A, a second slit 26SB is formed in an entire remaining region where the first slit 26SA is not formed of the region where the first light-blocking film 16A is to be formed. The second slit 26SB reaches the oxidation layer 27A from the back surface S2 of the semiconductor substrate 10.

Figure 33B:
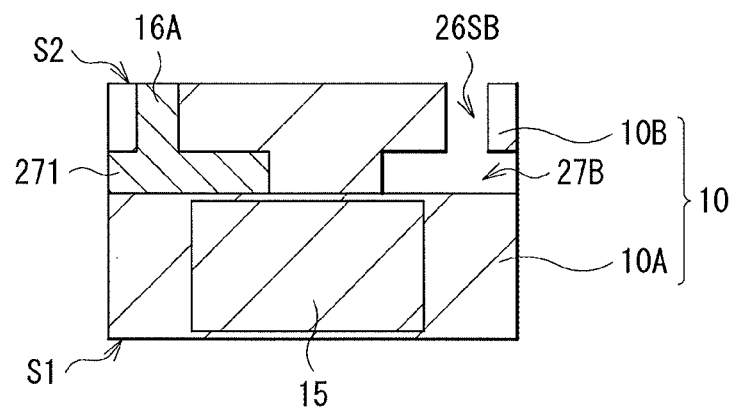
FIG. 33B is a schematic cross-sectional view of a process following FIG. 33A.

After the second slit 26SB is formed, the remaining oxidation layer 27A is removed through the second slit 26SB, as illustrated in FIG. 33B. Thus, the cavity 27B communicated with the second slit 26SB is formed in proximity to the second slit 26SB.

Figure 33C:
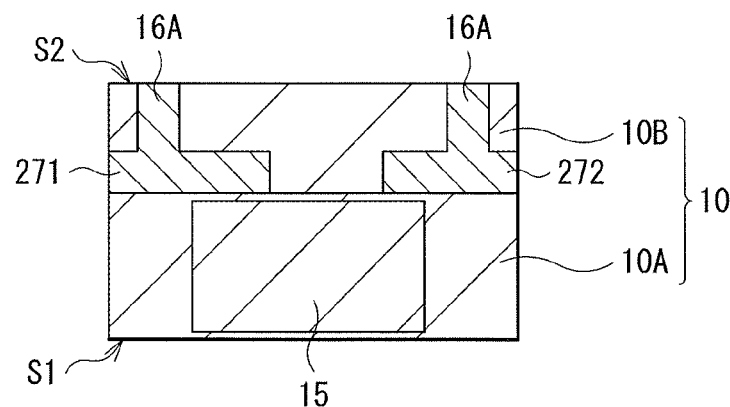
FIG. 33C is a schematic cross-sectional view of a process following FIG. 33B.

After the cavity 27B is formed, the second slit 26SB and the cavity 27B are filled with the light-blocking material, as illustrated in FIG. 33C. Thus, the first light-blocking film 16A and the second portion 272 of the second light-blocking film 27 are respectively formed in the second slit 26SB and the cavity 27B. The second portion 272 of the second light-blocking film 27 is provided continuously with the first portion 271, and the level difference 27S (FIG. 26) is generated between the first portion 271 and the second portion 272.

Figure 34A:
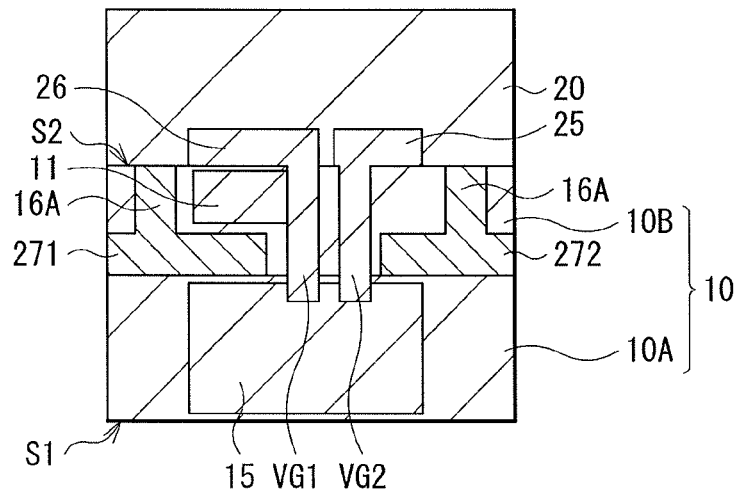
FIG. 34A is a schematic cross-sectional view of a process following FIG. 33C.

After the first light-blocking film 16A and the second light-blocking film 17 are formed, the charge accumulation section 11 is formed on side closer to the back surface S2 than the second light-blocking film 17. The overflow drain 13 and the charge-voltage converter 14 are formed together with the charge accumulation section 11 in the semiconductor substrate 10. Next, the first transfer transistor 25, the discharging transistor 26, and the second transfer transistor 21, and the reset transistor 22, the amplification transistor 23, and the select transistor 24 are formed. Thereafter, the wiring layer 20 is formed on the back surface S2 of the semiconductor substrate 10 (FIG. 34A).

Figure 34B:
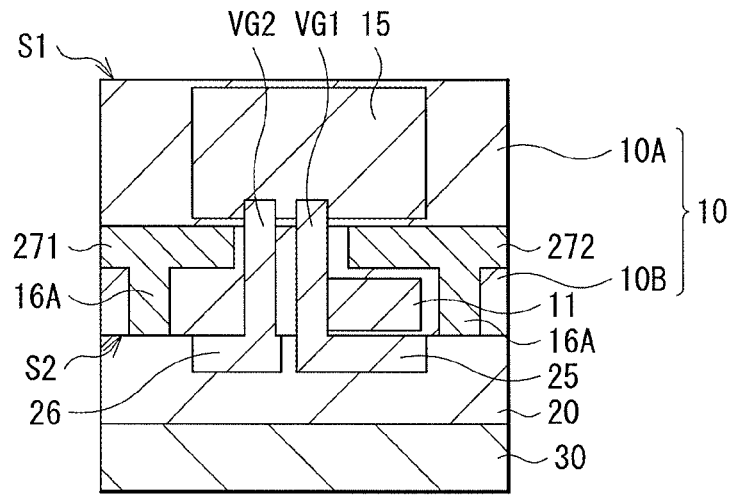
FIG. 34B is a schematic cross-sectional view of a process following FIG. 34A.
Figure 34C:
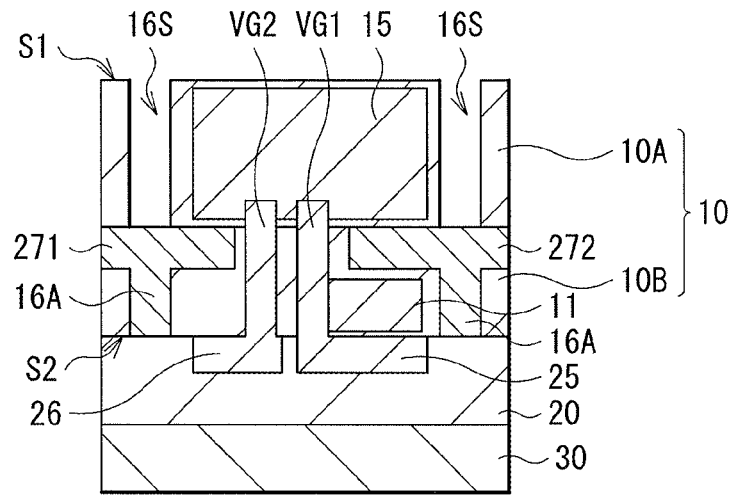
FIG. 34C is a schematic cross-sectional view of a process following FIG. 34B.

Next, as illustrated in FIG. 34B, the supporting substrate 30 is bonded to the back surface S2 of the semiconductor substrate 10 with the wiring layer 20 interposed therebetween, and is flipped from top to bottom. Subsequently, the slit 16S reaching the second light-blocking film 27 from the front surface S1 of the semiconductor substrate 10 is formed around the photoelectric converter 15, as illustrated in FIG. 34C. The slit 16S is used to form the first light-blocking film 16, and is disposed at a position superimposed on the first light-blocking film 16A in plan view, for example. The slit 16S is provided in the entire region where the first light-blocking film 16 is to be formed by one process, for example.

After the slit 16S is formed, the slit 16S is filled with the light-blocking material. Thus, the first light-blocking film 16 is formed. Thereafter, the color filter CF and the on-chip lens are formed on the front surface S1 of the semiconductor substrate 10. Thus, the solid-state imaging device 2 including the first light-blocking film 16A around the charge accumulation section 11 is completed.

As described above, the first portion 271 and the second portion 272 of the second light-blocking film 27 may be formed in a stepwise manner through forming the first slit 26SA and the second slit 26SB for formation of the first light-blocking film 16A.

Modification Example 9

The solid-state imaging device 2 described in the foregoing second embodiment may be manufactured with use of a sacrificial layer (a sacrificial layer 27C) (a modification example 9). It is possible to form the second light-blocking film 27 with use of the sacrificial layer 27C in place of the oxidation layer 27A in a manner similar to that described in the modification example 4 (refer to FIG. 19A, etc.) of the foregoing first embodiment.

FIGS. 35A to 36B illustrate a method of manufacturing the solid-state imaging device 2 with use of the sacrificial layer 270 in process order.

First, after the photoelectric converter 15 is formed in the first semiconductor layer 10A, the sacrificial layer 270 is formed on one surface of the first semiconductor layer 10A in a manner similar to that described in the foregoing modification example 4. The sacrificial layer 27C is used to form the second light-blocking film 27 in a later process. The sacrificial layer 27C is formed through forming a film of silicon germanium (SiGe) with use of, for example, a chemical vapor deposition method.

After the sacrificial layer 27C is formed, the second semiconductor layer 10B is formed on the first semiconductor layer 10A with the sacrificial layer 27C interposed therebetween. Thus, the semiconductor substrate 10 is formed. Next, for example, the charge accumulation section 11 is formed in the second semiconductor layer 10B. The overflow dram 13 and the charge-voltage converter 14 are formed in the semiconductor substrate 10 together with the charge accumulation section 11. Next, the first transfer transistor 25, the discharging transistor 26, and the second transfer transistor 21, and the reset transistor 22, the amplification transistor 23, and the select transistor 24 are formed. Thereafter, the wiring layer 20 is formed on the back surface S2 of the semiconductor substrate 10.

Figure 35A:
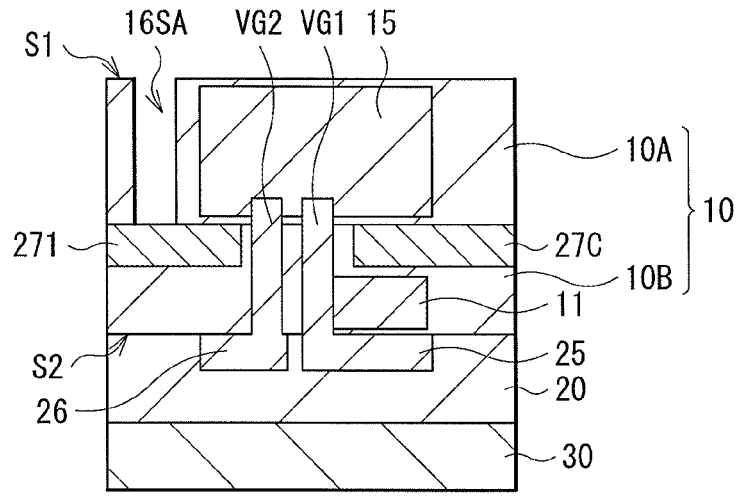
FIG. 35A is a schematic cross-sectional view of a process of a method of manufacturing a solid-state imaging device according to a modification example 9.
Figure 35B:
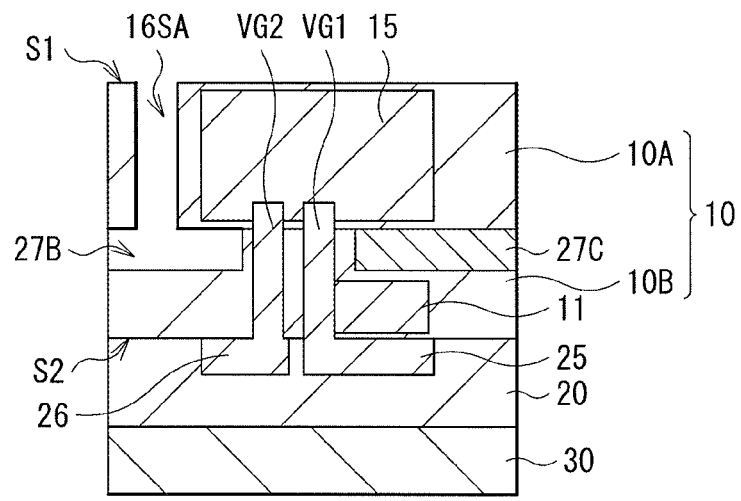
FIG. 35B is a schematic cross-sectional view of a process following FIG. 35A.

Next, as illustrated in FIG. 35A, the semiconductor substrate 10 is flipped from top to bottom, and the first slit 16SA reaching the sacrificial layer 27C from the front surface S1 of the semiconductor substrate 10 is formed around the photoelectric converter 15. Subsequently, a portion of the sacrificial layer 27C is removed through the first slit 16SA, as illustrated in FIG. 35B. Thus, the cavity 27B communicated with the first slit 16SA is formed in proximity to the first slit 16SA.

Figure 35C:
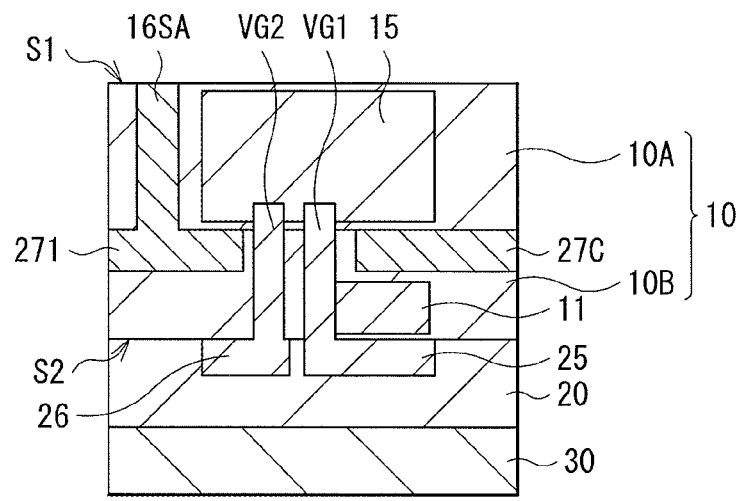
FIG. 35C is a schematic cross-sectional view of a process following FIG. 35B.

After the cavity 27B is formed, the first slit 16SA and the cavity 27B are filled with the light-blocking material, as illustrated in FIG. 35C. Thus, the first light-blocking film 16 and the first portion 271 of the second light-blocking film 27 are respectively formed in the first slit 16SA and the cavity 27B.

Figure 36A:
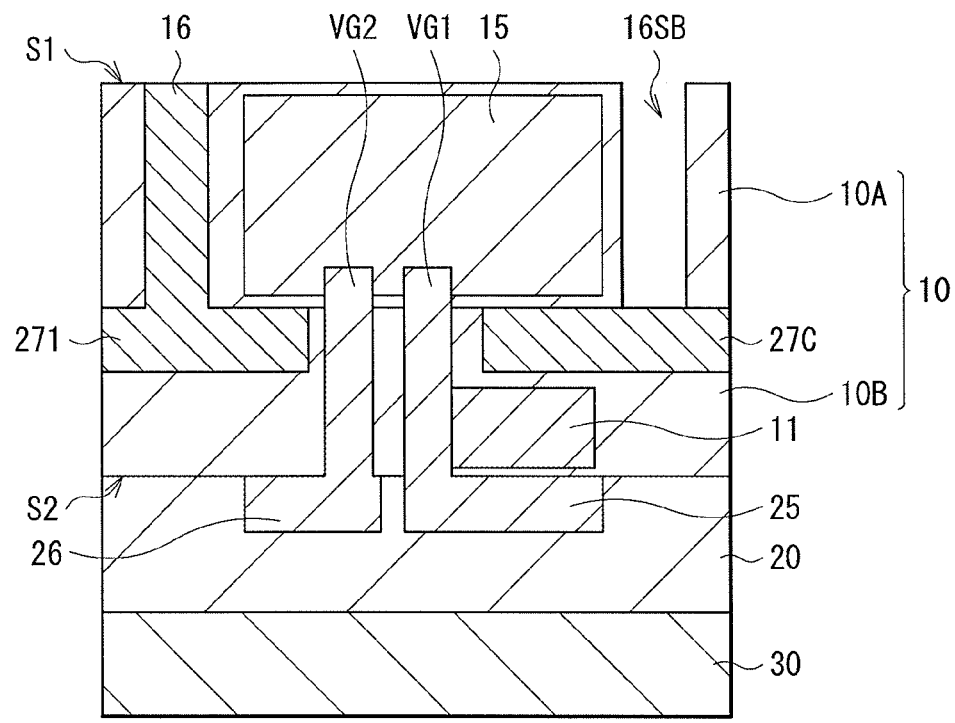
FIG. 36A is a schematic cross-sectional view of a process following FIG. 35C.
Figure 36B:
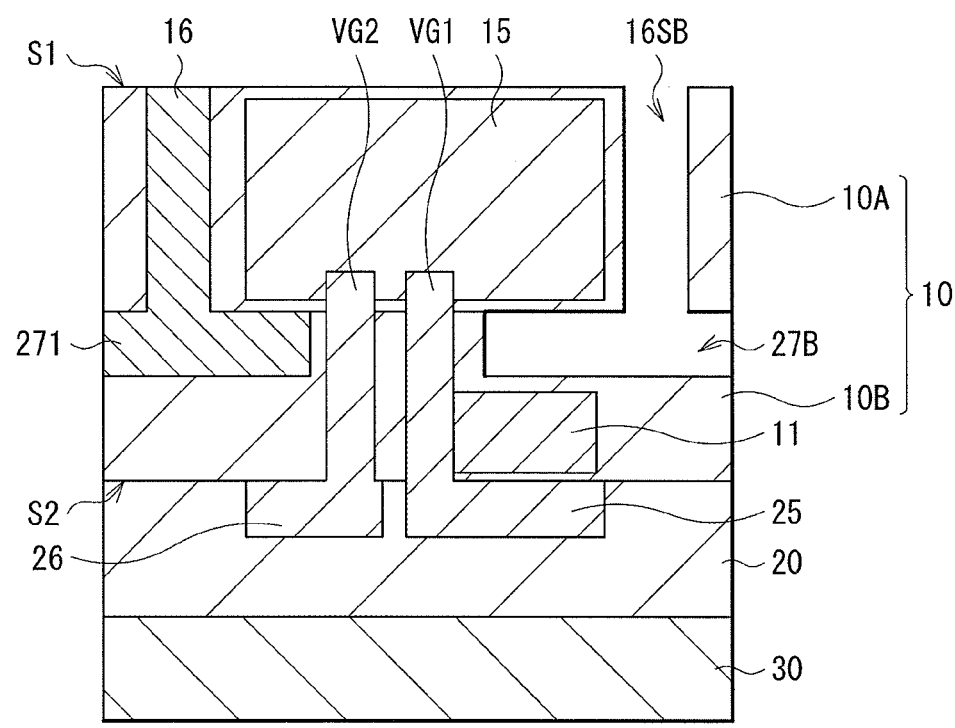
FIG. 36B is a schematic cross-sectional view of a process following FIG. 36A.

Next, the second slit 26SB reaching the oxidation layer 27A from the back surface S2 of the semiconductor substrate 10 is formed, as illustrated in FIG. 36A. Thereafter, the remaining sacrificial layer 27C is removed through the second slit 26SB, as illustrated in FIG. 36B. Thus, the cavity 27B communicated with the second slit 26SB is formed in proximity to the second slit 26SB.

Next, the second slit 26SB and the cavity 27B are filled with the light-blocking material. Thus, the first light-blocking film 16A and the second portion 272 of the second light-blocking film 17 are respectively formed in the second slit 16SB and the cavity 27B. The second portion 272 of the second light-blocking film 27 is formed continuously with the first portion 271, and the level difference 27S (FIG. 26) is generated between the first portion 271 and the second portion 272. Lastly, the color filter CF and the on-chip lens are formed on the front surface S1 of the semiconductor substrate 10, thereby completing the solid-state imaging device 2.

As described above, it is possible to form the second light-blocking film 27 through forming the sacrificial layer 27C in place of the oxidation layer 27A (FIG. 27B).

Modification Example 10

As described in the foregoing first embodiment (refer to FIG. 3), the first light-blocking film 16 may be provided on the entire periphery of the photoelectric converter 15 to surround the photoelectric converter 15 (a modification example 10).

Figure 37A:
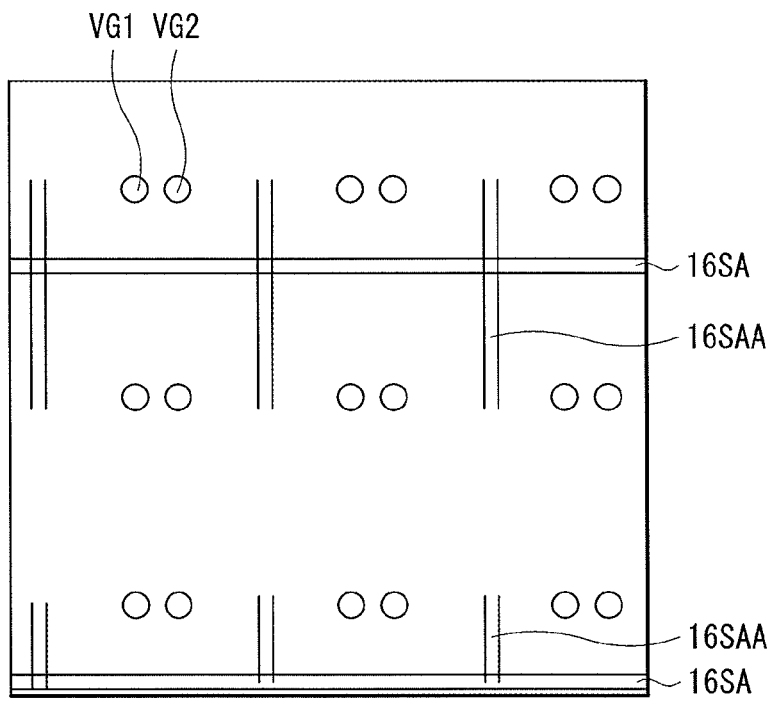
FIG. 37A is a schematic plan view of a process of a method of manufacturing a solid-state imaging device according to a modification example 10.
Figure 37B:
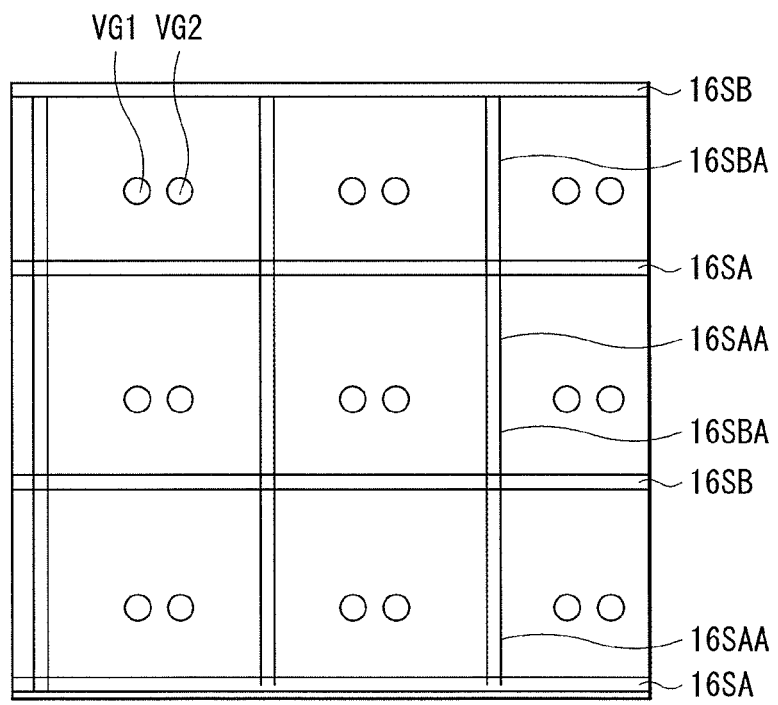
FIG. 37B is a schematic plan view of a process following FIG. 37A.

FIGS. 37A and 37B illustrate an example of planar configurations of the first slit 16SA and the second slit 16SB in a case where the first light-blocking film 16 is formed on the entire periphery of the photoelectric converter 15. The solid-state imaging device 2 may be formed through forming the first slit 16SA and the second slit 16SB in a grid pattern alternately in the vertical direction, for example. Alternatively, the first slit 16SA and the second slit 16SB in a grid pattern may be formed alternately in the horizontal direction.

Modification Example 11

Figure 38A:
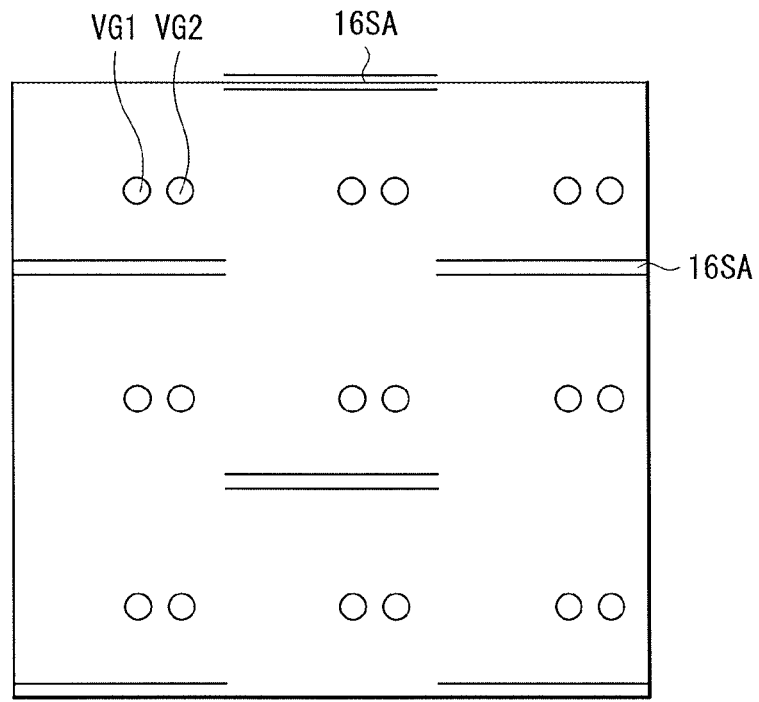
FIG. 38A is a schematic plan view of a process of a method of manufacturing a solid-state imaging device according to a modification example 11.
Figure 38B:
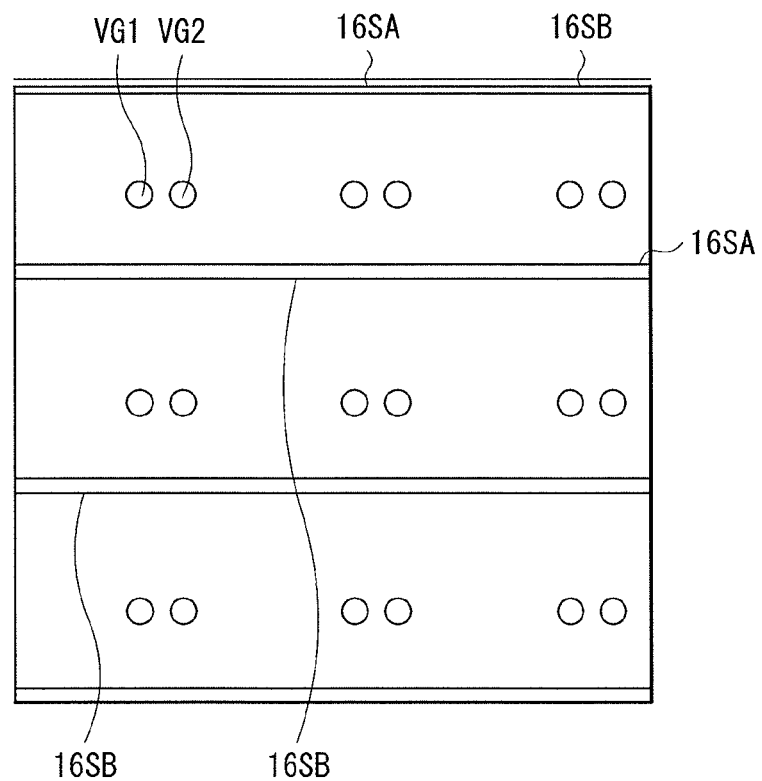
FIG. 38B is a schematic plan view of a process following FIG. 38A.

As illustrated in FIGS. 38A and 38B, the first light-blocking film 16 on a same straight line may be formed with use of the first slits 16SA and the second slits 16SB alternately disposed (a modification example 11).

The first slit 16SA between the nth pixel row and the n+1th pixel row is formed for every other pixel P, and the first slit 16SA between the n+1th pixel row and the n+2th pixel row is formed alternately with the first slit 16SA between the nth pixel row and the n+1th pixel row. The first slit 16SA between the n+2th pixel row and the n+3th pixel row is formed at a position opposed to the first slit 16SA between the nth pixel row and the n+1th pixel row, and the first slit 16SA between the n+3th pixel row and the n+4th pixel row is formed at a position opposed to the first slit 16SA between the n+1th pixel row and the n+2th pixel row (FIG. 38A).

After the first slits 16SA are formed, the second slits 16SB are formed between the nth pixel row and the n+1th pixel row, between the n+1th pixel row and the n+2th pixel row, between the n+2th pixel row and the n+3th pixel row, between the n+3th pixel row and the n+4th pixel row, and so on to fill gaps between the first slits 16SA (FIG. 38B).

Thus, in a case where the first slits 16SA and the second slits on the same straight line extending in the horizontal direction are thinned out and formed, a region where the cavity 27B is to be formed is evenly dispersed in a surface of the semiconductor substrate 10, which makes it possible to maintain mechanical strength more effectively.

Modification Example 12

Figure 39:
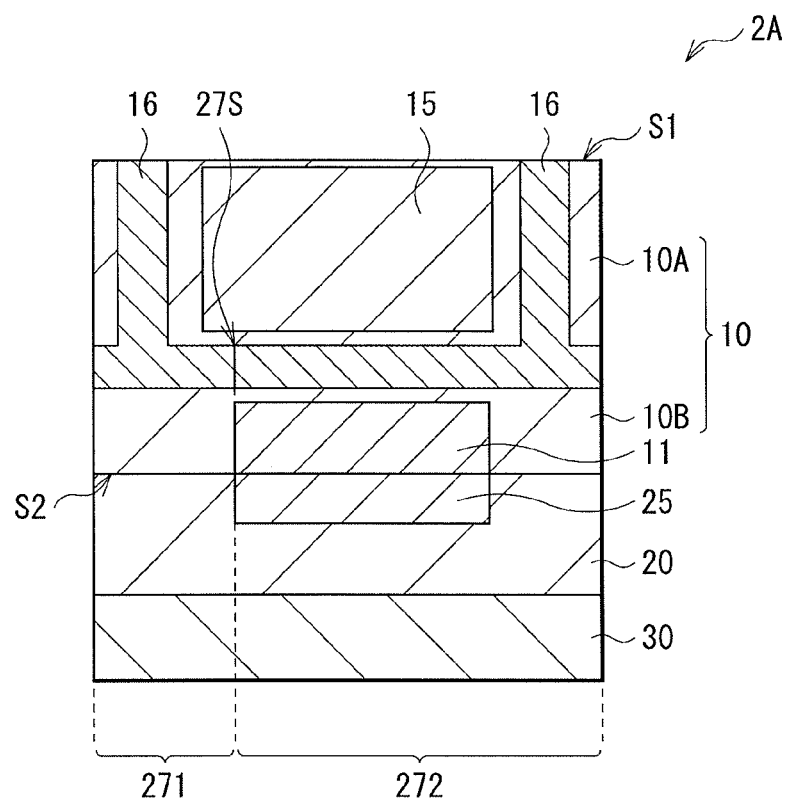
FIG. 39 is a schematic cross-sectional view of a configuration of a main portion of a solid-state imaging device according to a modification example 12.

FIG. 39 schematically illustrates a cross-sectional configuration of a portion of a solid-state imaging device (a solid-state imaging device 2A) according to a modification example 12 of the foregoing second embodiment. As with the solid-state imaging device 2A, the level difference 27S between the first portion 271 and the second portion 272 may be shifted from a center of the photoelectric converter 15 (the pixel P). The solid-state imaging device 2A has a configuration and effects similar to those of the solid-state imaging device 2 except for this point.

For example, sizes of the first portion 271 and the second portion 272 of the second light-blocking film 27 are different from each other, and the first portion 271 is smaller, and the second portion 272 is larger. For example, the level difference 27S is provided between the smaller first portion 271 and the larger second portion 272. The level difference 27S is disposed at a position superimposed on an end portion of the photoelectric converter 15, that is, at a position shifted from directly below the photoelectric converter 15 in plan view. The first portion 271 may be larger, and the second portion 272 may be smaller.

In the level difference 27S that is a coupling portion between the first portion 271 and the second portion 272, a filling failure, etc. easily occurs, and the level difference 27S is a portion having a thin thickness, which causes a possibility that a light-blocking function is deteriorated. Such a level difference 27S is disposed at a position away from a light-condensing center, that is, a position shifted from directly below a central portion of the photoelectric converter 15, as illustrated in FIG. 39, which makes it possible to suppress PLS resulting from the level difference 27S.

It is possible to form such a level difference 27S as follows (FIGS. 40A to 41B).

Figure 40A:
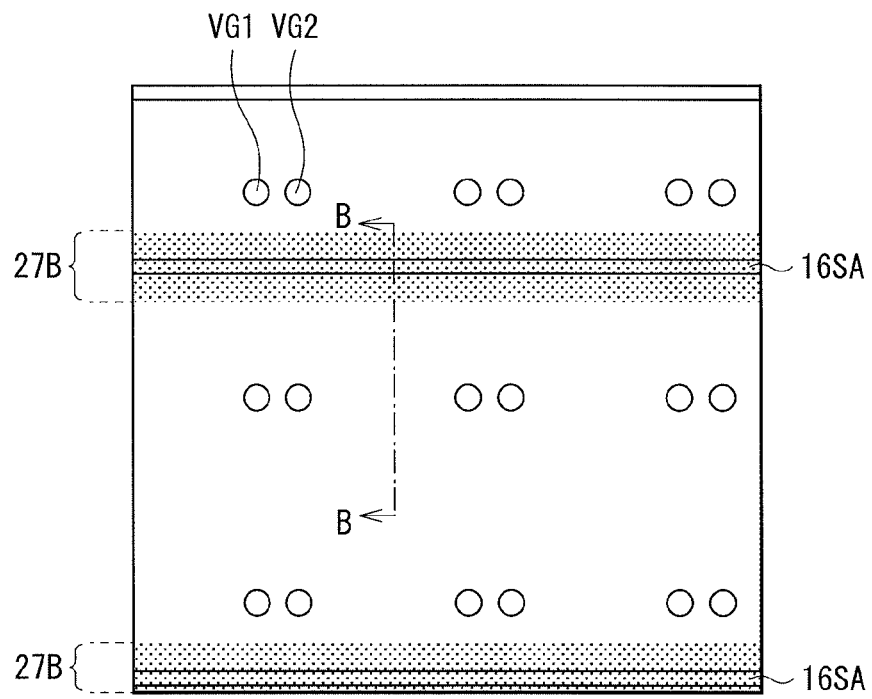
FIG. 40A is a schematic plan view of a process of a method of manufacturing the solid-state imaging device illustrated in FIG. 39.
Figure 40B:
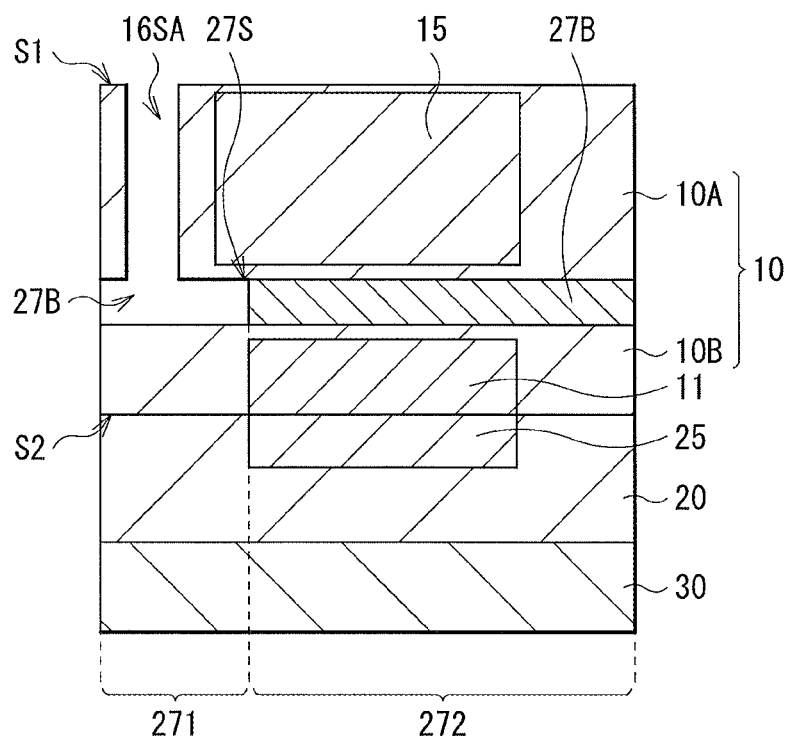
FIG. 40B is a schematic view of a cross-sectional configuration taken along a line B-B illustrated in FIG. 40A.

First, the first slit 16SA reaching the sacrificial layer 27C from the from surface S1 of the semiconductor substrate 10 is formed in a manner similar to that described in the foregoing modification example 9. After the first slit 16SA is formed, as illustrated in FIGS. 40A and 40B, a portion of the sacrificial layer 27C is removed through the first slit 16SA. Thus, the cavity 27B communicated with the first slit 16SA is formed in proximity to the first slit 16SA. The sacrificial layer 27C is removed by, for example, an etching process such as wet etching or dry etching, and the size of the cavity 27B is adjustable through controlling time of the etching. For example, a smaller cavity 27B is formed in proximity to the first slit 16SA through setting the time of the etching shorter. FIG. 40A illustrates a planar configuration of the first slit 16SA, and FIG. 40B illustrates a cross-sectional configuration taken along a line B-B in FIG. 40A.

After the cavity 27B is formed, the first slit 16SA and the cavity 27B are filled with the light-blocking material. Thus, the first light-blocking film 16 and the first portion 271 of the second light-blocking film 27 are respectively formed in the first slit 16SA and the cavity 27B.

Figure 41A:
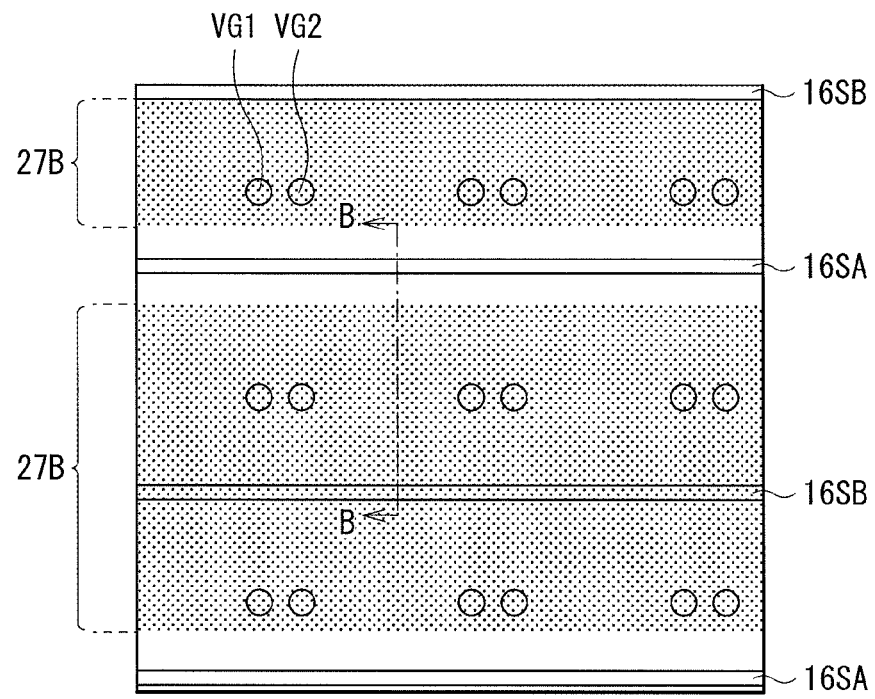
FIG. 41A is a schematic plan view of a process following FIG. 40A.
Figure 41B:
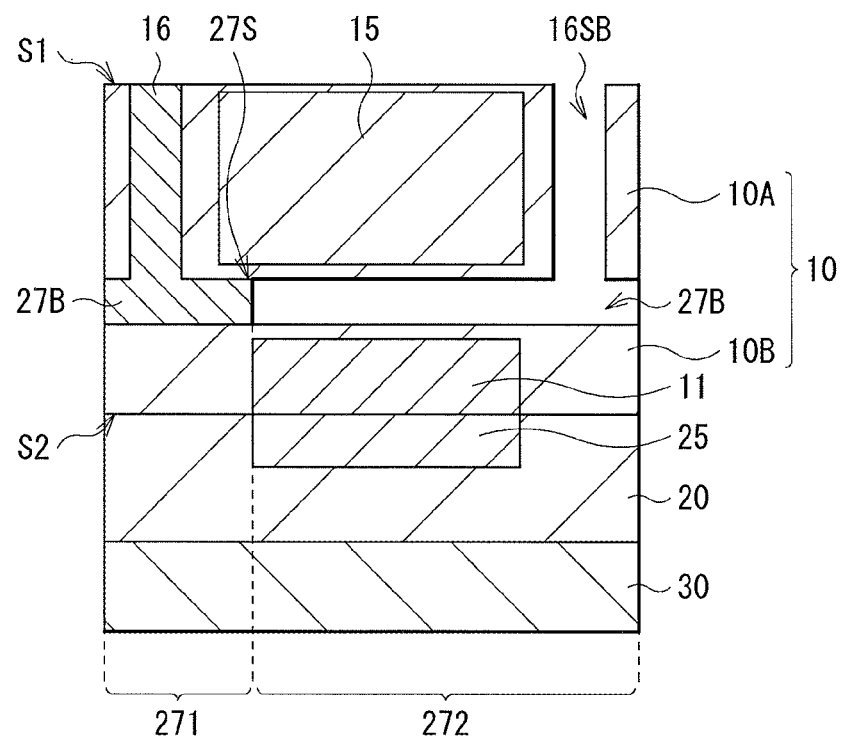
FIG. 41B is a schematic view of a cross-sectional configuration taken along a line B-B illustrated in FIG. 41A.

Subsequently, the second slit 16SB reaching the sacrificial layer 27C from the front surface S1 of the semiconductor substrate 10 is formed. After the second slit 16SB is formed, the remaining sacrificial layer 27C is removed through the second slit 16SB, as illustrated in FIGS. 41A and 41B. The retraining sacrificial layer 27C is removed through setting the time of the etching at this time longer. Thus, the larger cavity 27B is formed in proximity to the second slit 16SB. FIG. 41A illustrates a planar configuration of the cavity 27B, and FIG. 41B illustrates a cross-sectional configuration taken along a line B-B in FIG. 41A.

After the cavity 27B is formed, the second slit 16SB and the cavity 27B are filled with the light-blocking material. Thus, the first light-blocking film 16 and the second portion 272 of the second light-blocking film 27 are respectively formed in the second slit 16SB and the cavity 27B. The second portion 272 of the second light-blocking film 27 is provided continuously with the first portion 271, and the level difference (FIG. 26) between the smaller first portion 271 and the larger second portion 272 is formed. For example, it is possible to form the level difference 27S illustrated in FIG. 39 through such a process.

In the present modification example, in a manner similar to that described in the foregoing second embodiment, the first portion 271 and the second portion 272 of the second light-blocking film 27 are formed in s stepwise manner, which makes it possible to support the photoelectric converter 15 over a wider region and maintain mechanical strength. Moreover, the level difference 27S between the first portion 271 and the second portion 272 is disposed at a position shifted from directly below the center of the photoelectric converter 15, which makes it possible to suppress PLS resulting from the level difference 27S.

Application Examples

Figure 42:
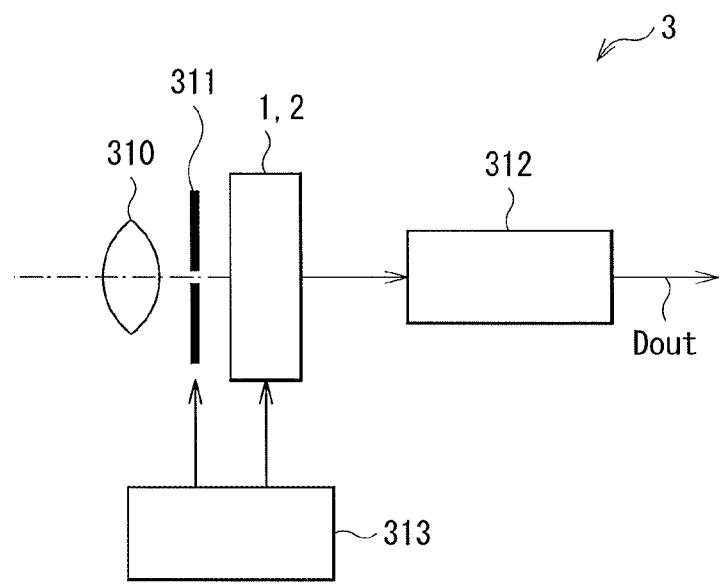
FIG. 42 is a functional block diagram illustrating an example of an electronic apparatus (a camera) using the solid-state imaging device illustrated in FIG. 1, etc.

The above-described solid-state imaging devices 1 and 2 are applicable to various types of electronic apparatuses such as a camera. FIG. 42 illustrates a schematic configuration of an electronic apparatus 3 (a camera), as an example. Examples of the electronic apparatus 3 include a camera that enables shooting of a still image or a moving image, and the electronic apparatus 3 includes the solid-state imaging device 1 or 2, an optical system (an optical lens) 310, a shutter device 311, a driver 313 that drives the solid-state imaging device 1 or 2 and the shutter device 311, and a signal processor 312.

The optical system 310 guides image light (incident light) from a subject to the solid-state imaging device 1 or 2. This optical system 310 may include a plurality of optical lenses. The shutter device 311 controls a period in which the solid-state imaging device 1 or 2 is irradiated with the light and a period in which the light is blocked. The driver 313 controls a transfer operation of the solid-state imaging device 1 or 2 and a shutter operation of the shutter device 311. The signal processor 312 performs various kinds of signal processing on a signal outputted from the solid-state imaging device 1 or 2. An image signal Dout having been subjected to the signal processing is stored in a storage medium such as a memory or outputted to a monitor, etc.

Further, the solid-state imaging devices 1 and 2 described in the foregoing embodiments, etc. are also applicable to the following electronic apparatuses (a capsule endoscope and a mobile body such as a vehicle).

Further Application Example 1: Endoscopic Surgery System

The technology according to the present disclosure is applicable to various products. For example, the technology according to the present disclosure may be applied to an endoscopic surgery system.

Figure 43:
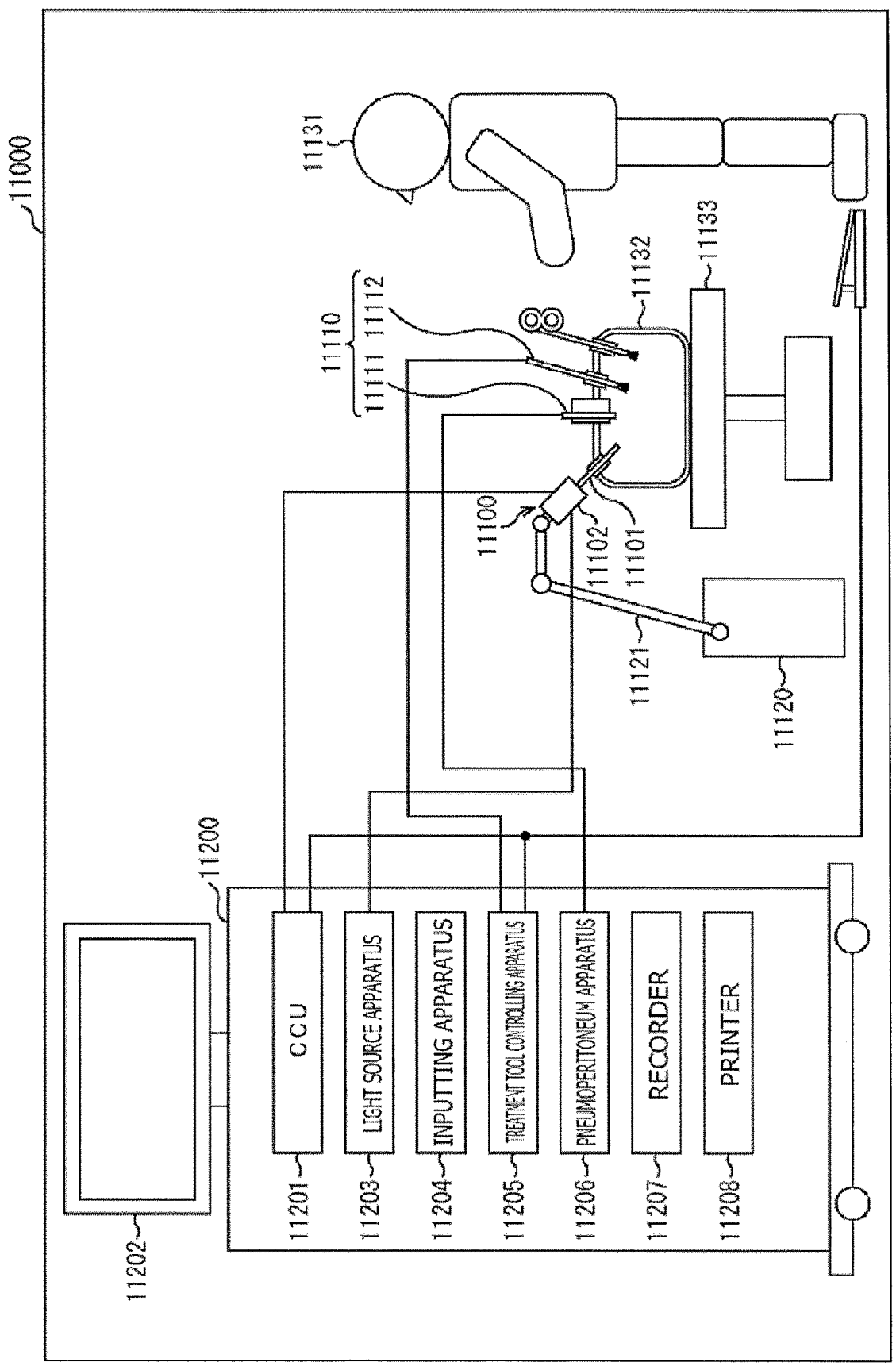
FIG. 43 is a view depicting an example of a schematic configuration of an endoscopic surgery system.

FIG. 43 is a view depicting an example of a schematic configuration of an endoscopic surgery system to which the technology according to an embodiment of the present disclosure (present technology) can be applied.

In FIG. 43, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the Held of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 44:
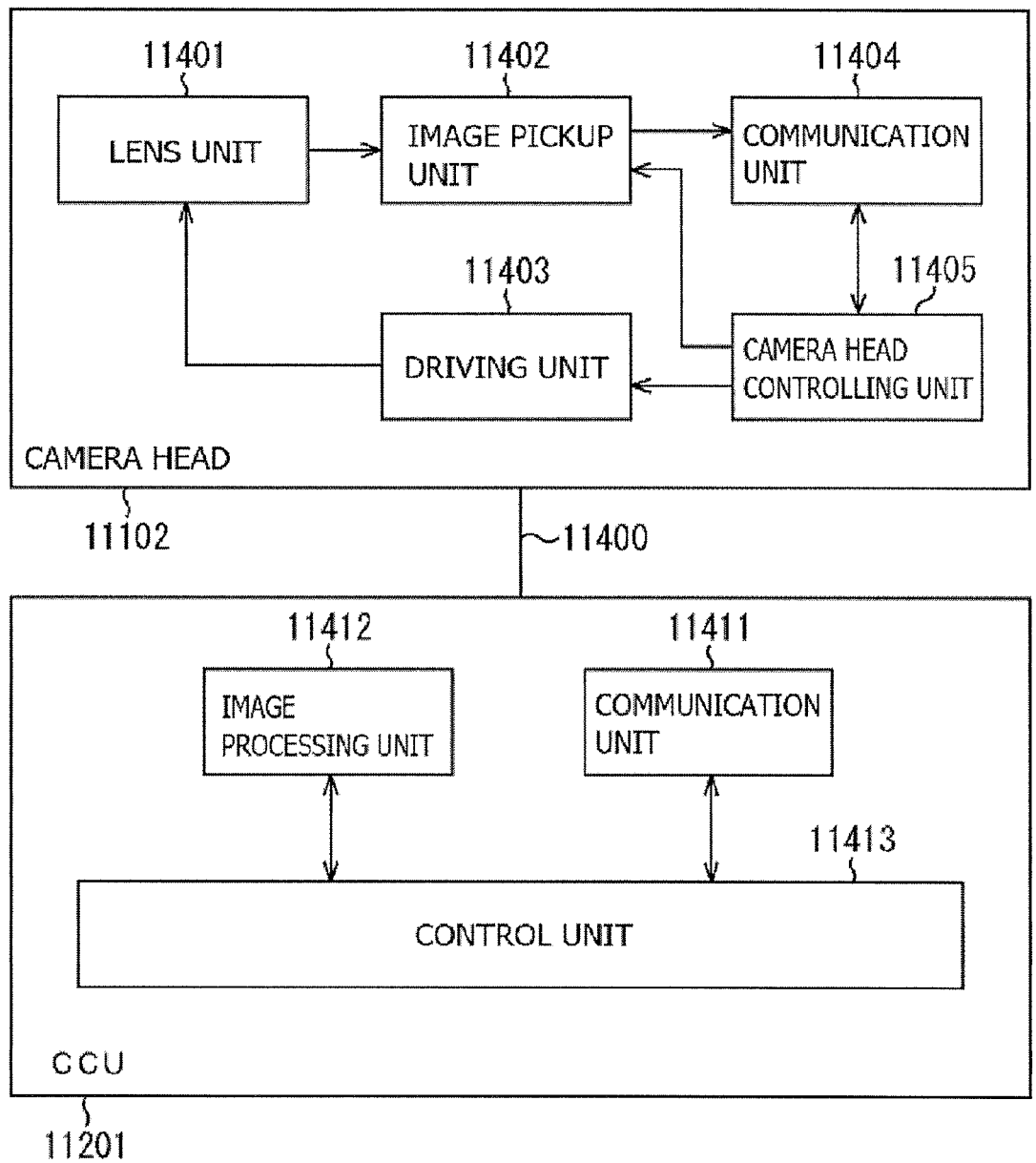
FIG. 44 is a block diagram depicting an example of a functional configuration of a camera head and a camera control unit (CCU).

FIG. 44 is a block diagram depicting an example of a functional configuration of the camera head 11102 and the CCU 11201 depicted in FIG. 43.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup trait 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera bead 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and live control signal can be transmuted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

In the foregoing, the description has been given of one example of the endoscopic surgery system to which the technology according to the present disclosure is applicable. The technology according to the present disclosure may be applied to the image pickup unit 11402 among the components of the configuration described above. Applying the technology according to the present disclosure to the image pickup unit 11402 makes it possible to obtain a clearer image of the surgical region. Hence, it is possible for the surgeon to confirm the surgical region with certainty.

Note that the description has been given above of the endoscopic surgery system as one example. Tire technology according to the present disclosure may be applied to any medical system besides the endoscopic surgery system, such as a micrographic surgery system.

Further Application Example 2: Mobile Body

The technology according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

Figure 45:
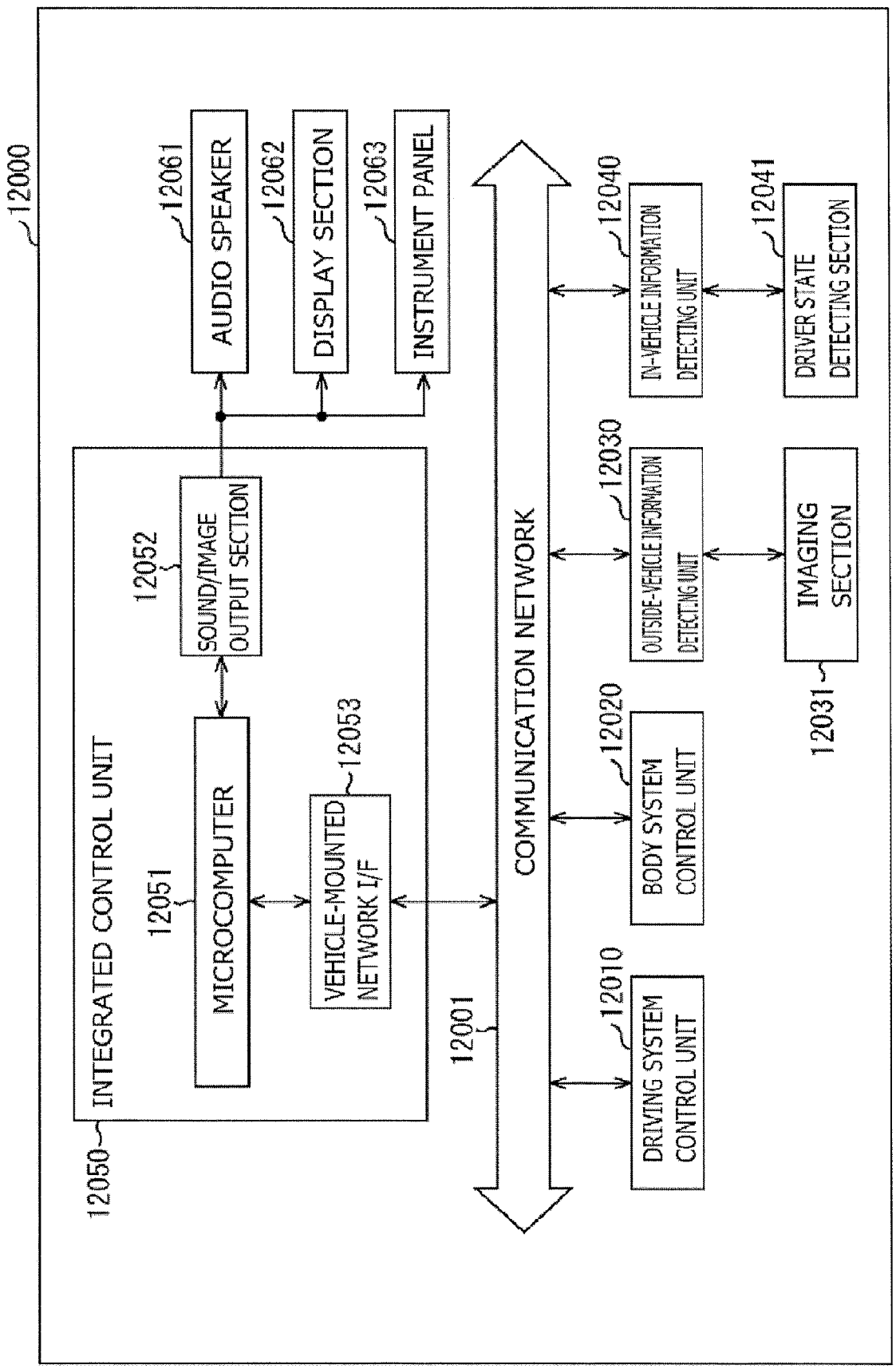
FIG. 45 is a block diagram depicting an example of schematic configuration of a vehicle control system.

FIG. 45 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 45, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 45, an audio speaker 12061, a display section 12062, and an instrument panel 12063 are illustrated as the output device. The display section 12062 may, for example, include at least one of an on-board display and a head-up display.

Figure 46:
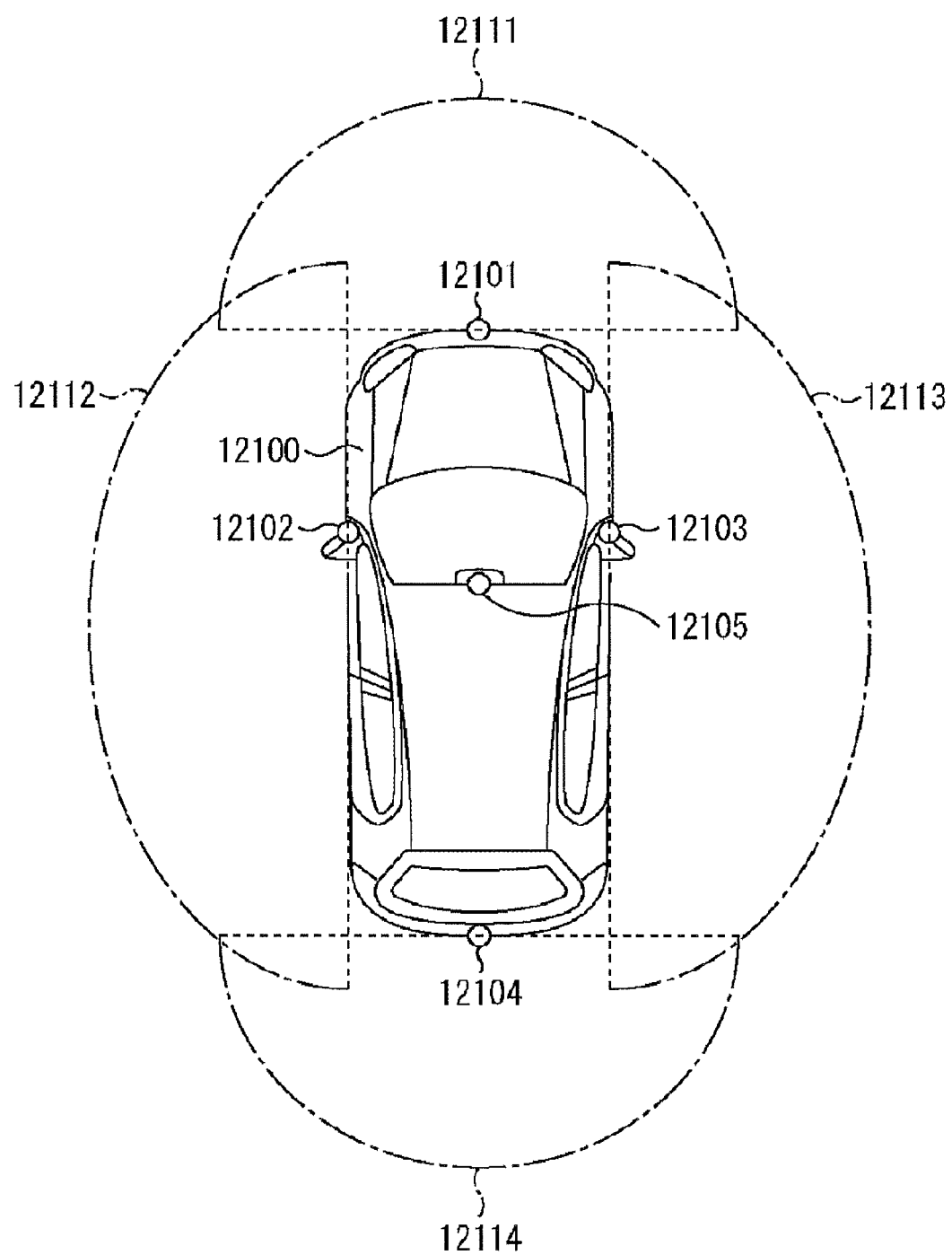
FIG. 46 is a diagram of assistance in explaining an example of installation positions of an outside-vehicle information detecting section and an imaging section.

FIG. 46 is a diagram depicting an example of the installation position of the imaging section 12031.

In FIG. 46, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 46 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imagine ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system, to which the technology according to the present disclosure is applicable. The technology according to the present disclosure may be applied to, for example, the imaging section 12031 among components of the configuration described above. Applying the technology according to the present disclosure to the imaging section 12031 makes it possible to obtain a captured image that is easier to see. Hence, it is possible to reduce fatigue of the driver.

The embodiments and the modification examples has been described above, but the present disclosure contents are not limited to the foregoing embodiments, etc., and may be modified in a variety of ways. For example, the configurations of the solid-state imaging devices described in the foregoing embodiments are merely exemplified, and any other layer may be further provided. In addition, the material and the thickness of each layer are also merely exemplified, and are not limited to the foregoing.

For example, in the foregoing first embodiment, a case where the first transfer transistor 25 and the discharging transistor 26 are vertical transistors (a case where the gate electrodes VG1 and VG2 are included) has been described; however, any other transistor may be a vertical transistor.

Moreover, in the foregoing second embodiment, a case where the gate electrodes VG1 and VG2 are adjacently provided has been described; however, the second light-blocking film 27 may be formed in a stepwise manner without adjacently providing the gate electrodes VG1 and VG2.

It is to be noted that the effects described to the foregoing embodiments, etc. are merely exemplified, and may be any other effects or may further include any other effects.

It is to be noted that the present disclosure may have the following configurations.

(1)
A solid-state imaging device including:
a semiconductor substrate having a light incident surface:
a photoelectric converter provided for each of pixels on side of the light incident surface in the semiconductor substrate;
a charge accumulation section provided for each of the pixels on side closer to opposite side of the light incident surface than the photoelectric converter in the semiconductor substrate;
a first transfer transistor that transfers a signal charge accumulated in the photoelectric converter to the charge accumulation section;
a wiring layer provided on side of a surface opposite to the light incident surface of the semiconductor substrate;
a first vertical electrode and a second vertical electrode extending from the surface opposite to the light incident surface of the semiconductor substrate to the photoelectric converter;
a first light-blocking film provided in a thickness direction of the semiconductor substrate on at least a portion of a periphery of the photoelectric converter; and
a second light-blocking film provided in a surface direction of the semiconductor substrate between the photoelectric converter and the charge accumulation section,
the first vertical electrode and the second vertical electrode being disposed adjacently with a distance therebetween, the distance being a half or less of a length of one side of the pixel.

(2)
The solid-state imaging device according to (1), in which the first vertical electrode and the second vertical electrode are provided in a same pixel.

(3)
The solid-state imaging device according to (2), in which
the first vertical electrode serves as a gate electrode of the first transfer transistor,
the second vertical electrode serves as a gate electrode of a discharging transistor that discharges an unnecessary charge accumulated in the photoelectric converter.

(4)
The solid-state imaging device according to (1), in which the first vertical electrode and the second vertical electrode are provided in mutually different pixels.

(5)
The solid-state imaging device according to (4), in which both the first vertical electrode and the second vertical electrode serve as gate electrodes of the first transfer transistor.

(6)
The solid-state imaging device according to any one of (1) to (5), further including:
a second transfer transistor; and
a charge-voltage converter to which the signal charge is transferred from the charge accumulation section by the second transfer transistor.

(7)
The solid-state imaging device according to (6), further including a reset transistor that resets a potential of the charge-voltage converter.

(8)
The solid-state imaging device according to (6) or (7), further including an amplification transistor that outputs a signal corresponding to magnitude of a potential of the charge-voltage converter.

(9)
The solid-state imaging device according to (8), further including a select transistor that controls an output of the amplification transistor.

(10)
The solid-state imaging device according to any one of (1) to (9), in which the first light-blocking film surrounds the photoelectric converter.

(11)
The solid-state imaging device according to any one of (1) to (10), in which the first light-blocking film is provided also on a periphery of the charge accumulation section.

(12)
The solid-state imaging device according to any one of (1) to (11), in which the first vertical electrode and the second vertical electrode are provided in an opening of the second light-blocking film.

(13)
The solid-state imaging device according to (12), further including, in the opening of the second light-blocking film, an embedded material having a refractive index different from a refractive index of a constituent material of the second light-blocking film.

(14)
The solid-state imaging device according to any one of (1) to (13), further including an image plane phase detection pixel using the second light-blocking film.

(15)
The solid-state imaging device according to any one of (1) to (14), further including a color filter on side of an incident surface of the semiconductor substrate.

(16)
A method of manufacturing a solid-state imaging device, the method including:
forming a photoelectric converter for each of pixels on side of a light incident surface in a semiconductor substrate;
forming a charge accumulation section for each of the pixels on side closer to opposite side of the light incident surface than the photoelectric converter in the semiconductor substrate;
forming a wiring layer on side of a surface opposite to the light incident surface of the semiconductor substrate, and forming a vertical electrode extending from the surface opposite to the fight incident surface of the semiconductor substrate to the photoelectric converter;

forming a first light-blocking film in a thickness direction of the semiconductor substrate on at least a portion of a periphery of the photoelectric converter; and forming a second light-blocking film along a surface direction of the semiconductor substrate between the photoelectric converter and the charge accumulation section, the second light-blocking film being formed through forming a first portion and a second portion of the second light-blocking film in a stepwise manner.

(17)

The method of manufacturing the solid-state imaging device according to (16), in which the second light-blocking film is formed through forming a first cavity for formation of the first portion on a periphery of the vertical electrode and filling the first cavity with a light-blocking material, and thereafter forming a second cavity for formation of the second portion and filling the second cavity with the light-blocking material.

(18)

The method of manufacturing the solid-state imaging device according to (17), in which the first light-blocking film is provided in a first slit coupled to the first portion and a second slit coupled to the second portion.

(19)

The method of manufacturing the solid-state imaging device according to (18), in which the first light-blocking film and the second light-blocking film ore formed through forming the first slit and the first cavity and filling the first slit and the first cavity with the light-blocking material, and thereafter forming the second slit and the second cavity and filling the second slit and the second cavity with the light-blocking material.

(20)

A solid-state imaging device including:

a semiconductor substrate having a light incident surface;

a photoelectric converter provided for each of pixels on side of the light incident surface in the semiconductor substrate;

a charge accumulation section provided for each of the pixels on side closer to opposite side of the light incident surface than the photoelectric converter in the semiconductor substrate;

a wiring layer provided on side of a surface opposite to the light incident surface of the semiconductor substrate;

a vertical electrode extending from the surface opposite to the light incident surface of the semiconductor substrate to the photoelectric converter;

a first light-blocking film provided in a thickness direction of the semiconductor substrate on at least a portion of a periphery of the photoelectric converter; and a second light-blocking film provided in a surface direction of the semiconductor substrate between the photoelectric converter and the charge accumulation section and including a first portion and a second portion that are continuously provided, a level difference being provided between the first portion and the second portion.

This application claims the benefit of Japanese Priority Patent Application JP2017-41964 filed with the Japan Patent Office on Mar. 6, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device comprising:

a semiconductor substrate having a light incident surface;

a photoelectric converter provided for each of a plurality of pixels on a side of the light incident surface in the semiconductor substrate;

a charge accumulation section provided for each of the pixels on a side closer to a side opposite to the light incident surface than the photoelectric converter in the semiconductor substrate;

a first transfer transistor that transfers a signal charge accumulated in the photoelectric converter to the charge accumulation section;

a wiring layer provided on a surface on the side opposite to the light incident surface of the semiconductor substrate;

a first vertical electrode and a second vertical electrode extending from the surface on the side opposite to the light incident surface of the semiconductor substrate to the photoelectric converter;

a first light-blocking film provided in a thickness direction of the semiconductor substrate on at least a portion of a periphery of the photoelectric converter; and a second light-blocking film provided in a surface direction of the semiconductor substrate between the photoelectric converter and the charge accumulation section, the first vertical electrode and the second vertical electrode being disposed adjacently with a distance therebetween, the distance being a half or less of a length of one side of any of the pixels.

2. The solid-state imaging device according to claim 1, wherein the first vertical electrode and the second vertical electrode are provided in a same pixel.

3. The solid-state imaging device according to claim 1, wherein the first vertical electrode and the second vertical electrode are provided in mutually different pixels.

4. The solid-state imaging device according to claim 1, further comprising:

a second transfer transistor; and a charge-voltage converter to which the signal charge is transferred from the charge accumulation section by the second transfer transistor.

5. The solid-state imaging device according to claim 1, wherein the first light-blocking film surrounds the photoelectric converter.

6. The solid-state imaging device according to claim 1, wherein the first light-blocking film is provided also on a periphery of the charge accumulation section.

7. The solid-state imaging device according to claim 1, wherein the first vertical electrode and the second vertical electrode are provided in an opening of the second light-blocking film.

8. The solid-state imaging device according to claim 1, further comprising an image plane phase detection pixel using the second light-blocking film.

9. The solid-state imaging device according to claim 1, further comprising a color filter on side of an incident surface of the semiconductor substrate.

10. The solid-state imaging device according to claim 2, wherein the first vertical electrode serves as a gate electrode of the first transfer transistor, the second vertical electrode serves as a gate electrode of a discharging transistor that discharges an unnecessary charge accumulated in the photoelectric converter.

11. The solid-state imaging device according to claim 3, wherein both the first vertical electrode and the second vertical electrode serve as gate electrodes of the first transfer transistor.

12. The solid-state imaging device according to claim 4, further comprising a reset transistor that resets a potential of the charge-voltage converter.

13. The solid-state imaging device according to claim 4, further comprising an amplification transistor that outputs a signal corresponding to magnitude of a potential of the charge-voltage converter.

14. The solid-state imaging device according to claim 13, further comprising a select transistor that controls an output of the amplification transistor.

15. The solid-state imaging device according to claim 7, further comprising, in the opening of the second light-blocking film, an embedded material having a refractive index different from a refractive index of a constituent material of the second light-blocking film.

16. A method of manufacturing a solid-state imaging device, the method comprising:
forming a photoelectric converter for each of a plurality of pixels on a side of a light incident surface in a semiconductor substrate;
forming a charge accumulation section for each of the pixels on a side closer to a side opposite to the light incident surface than the photoelectric converter in the semiconductor substrate;
forming a wiring layer on a surface on the side opposite to the light incident surface of the semiconductor substrate, and forming a vertical electrode extending from the surface on the side opposite to the light incident surface of the semiconductor substrate to the photoelectric converter;
forming a first light-blocking film in a thickness direction of the semiconductor substrate on at least a portion of a periphery of the photoelectric converter; and
forming a second light-blocking film along a surface direction of the semiconductor substrate between the photoelectric converter and the charge accumulation section,
the second light-blocking film being formed through forming a first portion and a second portion of the second light-blocking film in a stepwise manner.

17. The method of manufacturing the solid-state imaging device according to claim 16, wherein the second light-blocking film is formed through forming a first cavity for formation of the first portion on a periphery of the vertical electrode and filling the first cavity with a light-blocking material, and thereafter forming a second cavity for formation of the second portion and filling the second cavity with the light-blocking material.

18. The method of manufacturing the solid-state imaging device according to claim 17, wherein the first light-blocking film is provided in a first slit coupled to the first portion and a second slit coupled to the second portion.

19. The method of manufacturing the solid-state imaging device according to claim 18, wherein the first light-blocking film and the second light-blocking film are formed through forming the first slit and the first cavity and filling the first slit and the first cavity with the light-blocking material, and thereafter forming the second slit and the second cavity and filling the second slit and the second cavity with the light-blocking material.

20. A solid-state imaging device comprising:
a semiconductor substrate having a light incident surface;
a photoelectric converter provided for each of a plurality of pixels on a side of the light incident surface in the semiconductor substrate;
a charge accumulation section provided for each of the pixels on a side closer to a side opposite to the light incident surface than the photoelectric converter in the semiconductor substrate;
a wiring layer provided on a surface on the side opposite to the light incident surface of the semiconductor substrate;
a vertical electrode extending from the surface on the side opposite to the light incident surface of the semiconductor substrate to the photoelectric converter;
a first light-blocking film provided in a thickness direction of the semiconductor substrate on at least a portion of a periphery of the photoelectric converter; and
a second light-blocking film provided in a surface direction of the semiconductor substrate between the photoelectric converter and the charge accumulation section and including a first portion and a second portion that are continuously provided,
a level difference being provided between the first portion and the second portion.

* * * * *